(12) United States Patent
Potega

(10) Patent No.: US 7,059,769 B1
(45) Date of Patent: Jun. 13, 2006

(54) APPARATUS FOR ENABLING MULTIPLE MODES OF OPERATION AMONG A PLURALITY OF DEVICES

(76) Inventor: Patrick Henry Potega, 7021 Vicky Ave., West Hills, CA (US) 91307-2314

( * ) Notice: Subject to any disclaimer, the term of this patent is extended or adjusted under 35 U.S.C. 154(b) by 395 days.

(21) Appl. No.: 09/699,216

(22) Filed: Oct. 27, 2000

Related U.S. Application Data

(63) Continuation-in-part of application No. 09/105,489, filed on Jun. 26, 1998, now Pat. No. 6,152,597.

(60) Provisional application No. 60/051,035, filed on Jun. 27, 1997, provisional application No. 60/055,883, filed on Aug. 15, 1997.

(51) Int. Cl.
*G01K 7/16* (2006.01)
*G01K 1/14* (2006.01)
*H01C 7/02* (2006.01)
*H01C 7/04* (2006.01)

(52) U.S. Cl. .................. 374/185; 338/22 R; 374/163; 374/208; 374/141; 429/90

(58) Field of Classification Search ................ 374/185, 374/208, 45, 57, 104, 4, 183, 163, 166, 141; 338/22 R; 429/90, 92, 93; 428/40.1, 42.3
See application file for complete search history.

(56) References Cited

U.S. PATENT DOCUMENTS

| | | | | |
|---|---|---|---|---|
| 3,315,200 A | * | 4/1967 | Hannay | 338/2 |
| 3,537,053 A | * | 10/1970 | Snoberger et al. | 338/25 |
| 3,852,570 A | * | 12/1974 | Tyler | 219/523 |
| 4,737,020 A | * | 4/1988 | Parker | 349/199 |
| 4,882,466 A | * | 11/1989 | Friel | 219/219 |
| 4,971,867 A | * | 11/1990 | Watabane et al. | 429/61 |
| 5,059,895 A | * | 10/1991 | Cataldi et al. | 324/104 |
| 5,223,003 A | * | 6/1993 | Tucholski et al. | 29/623.4 |
| 5,231,356 A | * | 7/1993 | Parker | 324/435 |
| 5,482,793 A | * | 1/1996 | Burns et al. | 429/62 |
| 5,610,571 A | * | 3/1997 | Kuzuoka | 338/22 R |
| 5,626,978 A | * | 5/1997 | Weiss | 429/43 |
| 5,925,480 A | * | 7/1999 | Shacklett et al. | 429/93 |
| 6,054,234 A | * | 4/2000 | Weiss et al. | 429/90 |
| 6,294,111 B1 | * | 9/2001 | Shacklett et al. | 252/518.1 |
| 6,294,284 B1 | * | 9/2001 | Lynch et al. | 429/90 |
| 6,307,605 B1 | * | 10/2001 | Bailey | 349/84 |
| 2001/0044013 A1 | * | 11/2001 | McDonough et al. | 428/202 |
| 2002/0003423 A1 | * | 1/2002 | Bertness et al. | 324/426 |
| 2004/0157027 A1 | * | 8/2004 | Doomernik | 428/40.1 |

FOREIGN PATENT DOCUMENTS

SU 0593085 * 2/1978 ............... 374/185

* cited by examiner

*Primary Examiner*—Gail Verbitsky

(57) ABSTRACT

Apparatuses for enabling multiple modes of operation are disclosed that include power and data interfaces for interconnecting multiple devices. The apparatuses, in various configurations, connect primarily powered devices, batteries, and a plurality of external peripheral devices, among which are monitoring devices, power supplies, and battery chargers. In connecting a combination of devices, for example a battery, its host device, and a peripheral third device comprised of a battery charger and power supply, said apparatus allows simultaneous and concurrent data or power to flow between at least two of said devices.

34 Claims, 32 Drawing Sheets

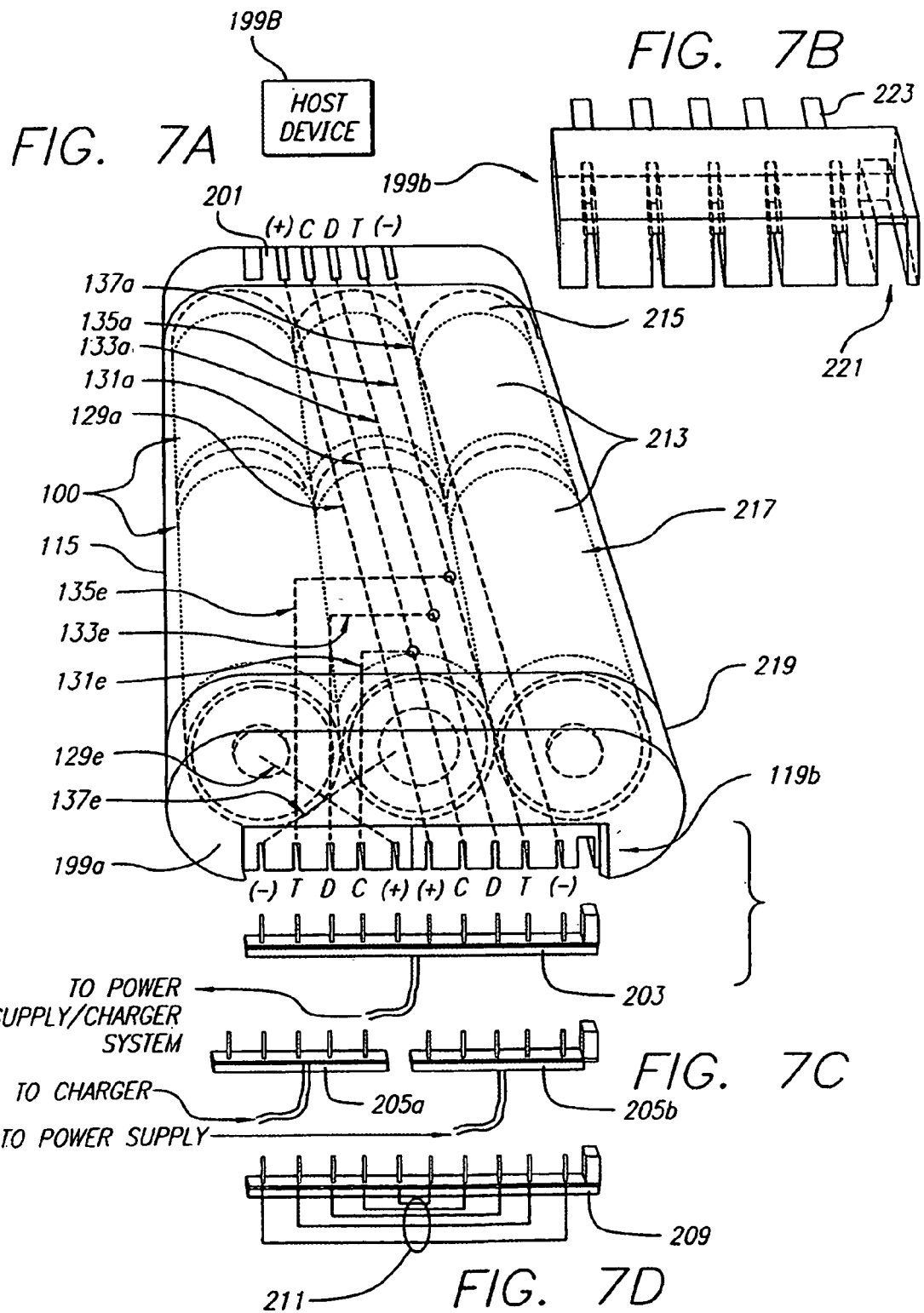

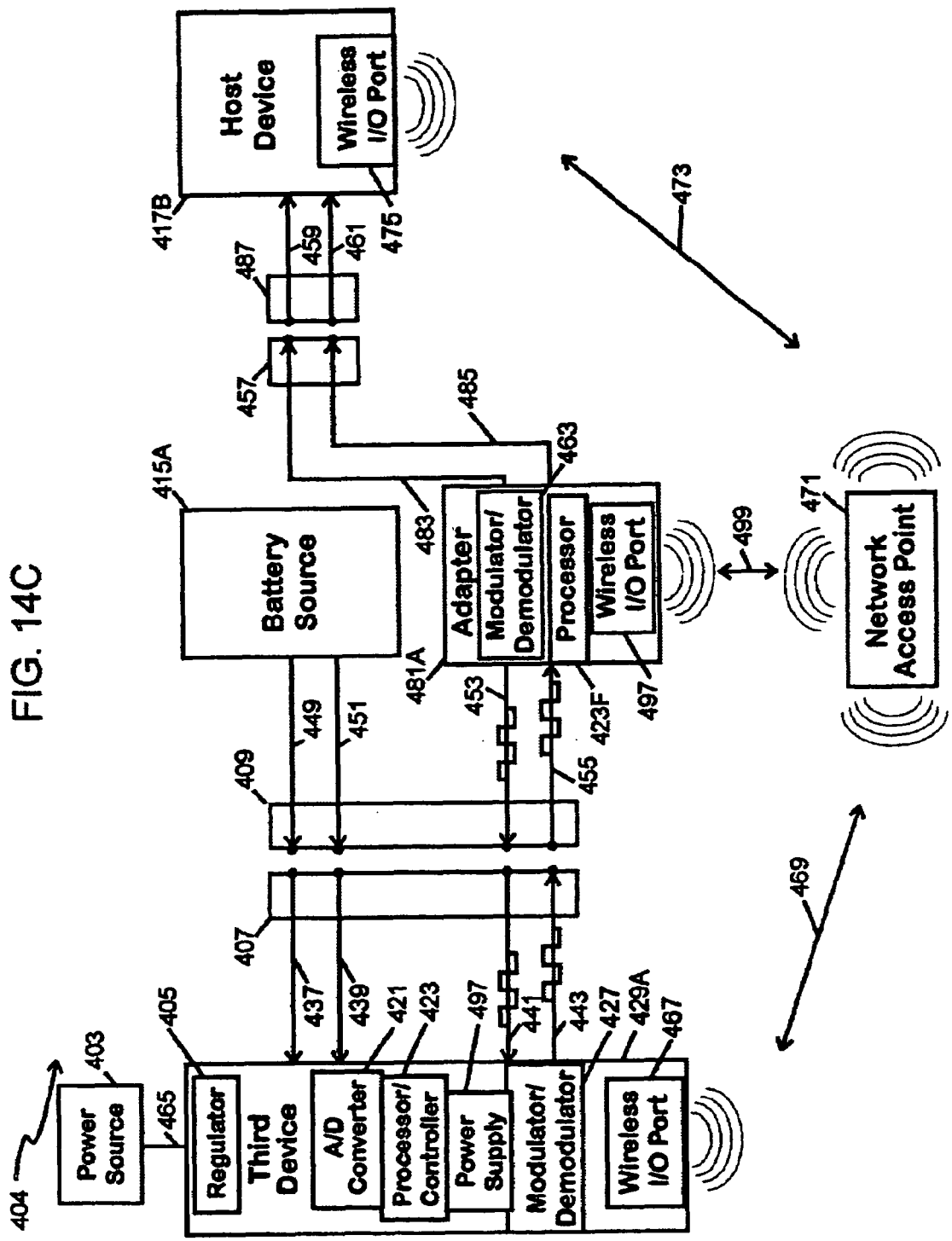

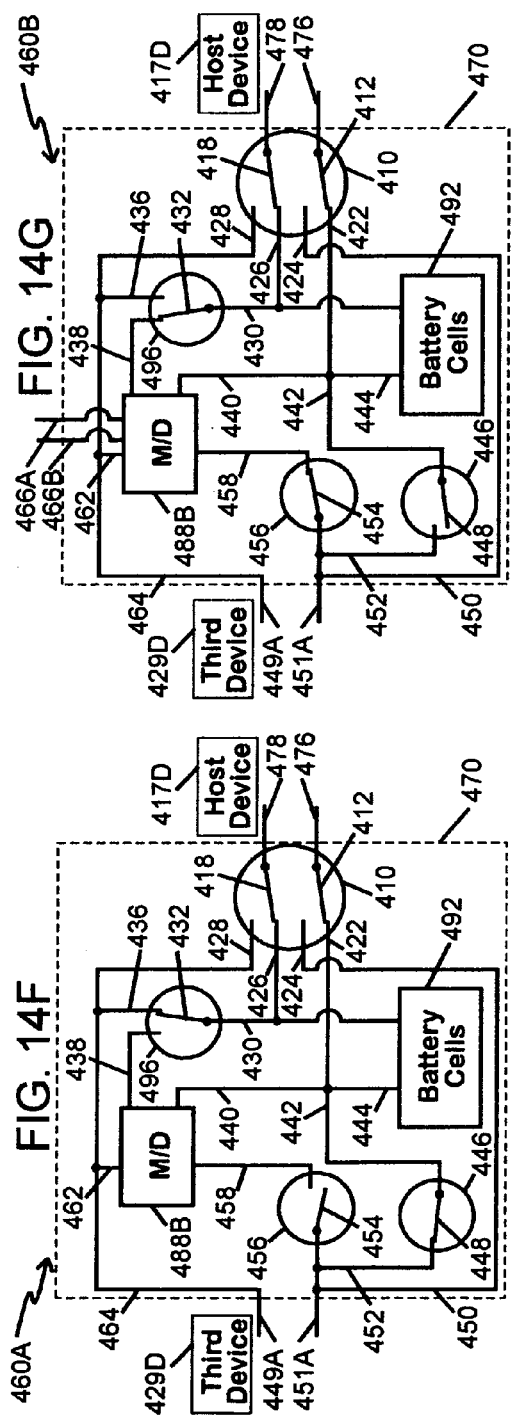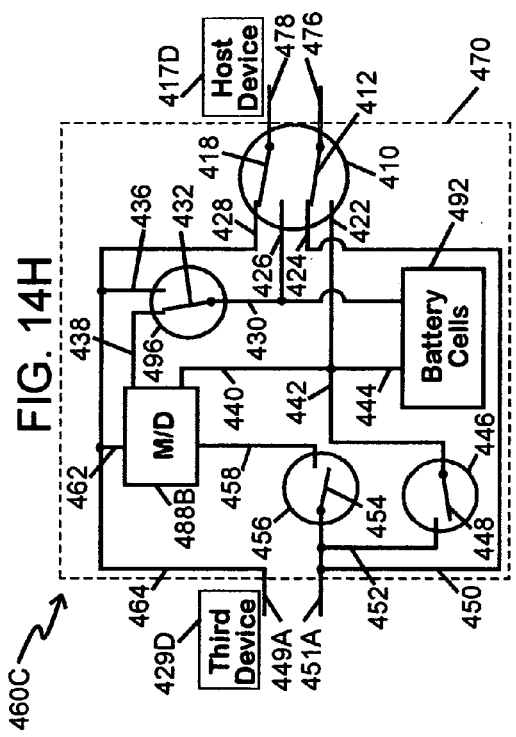

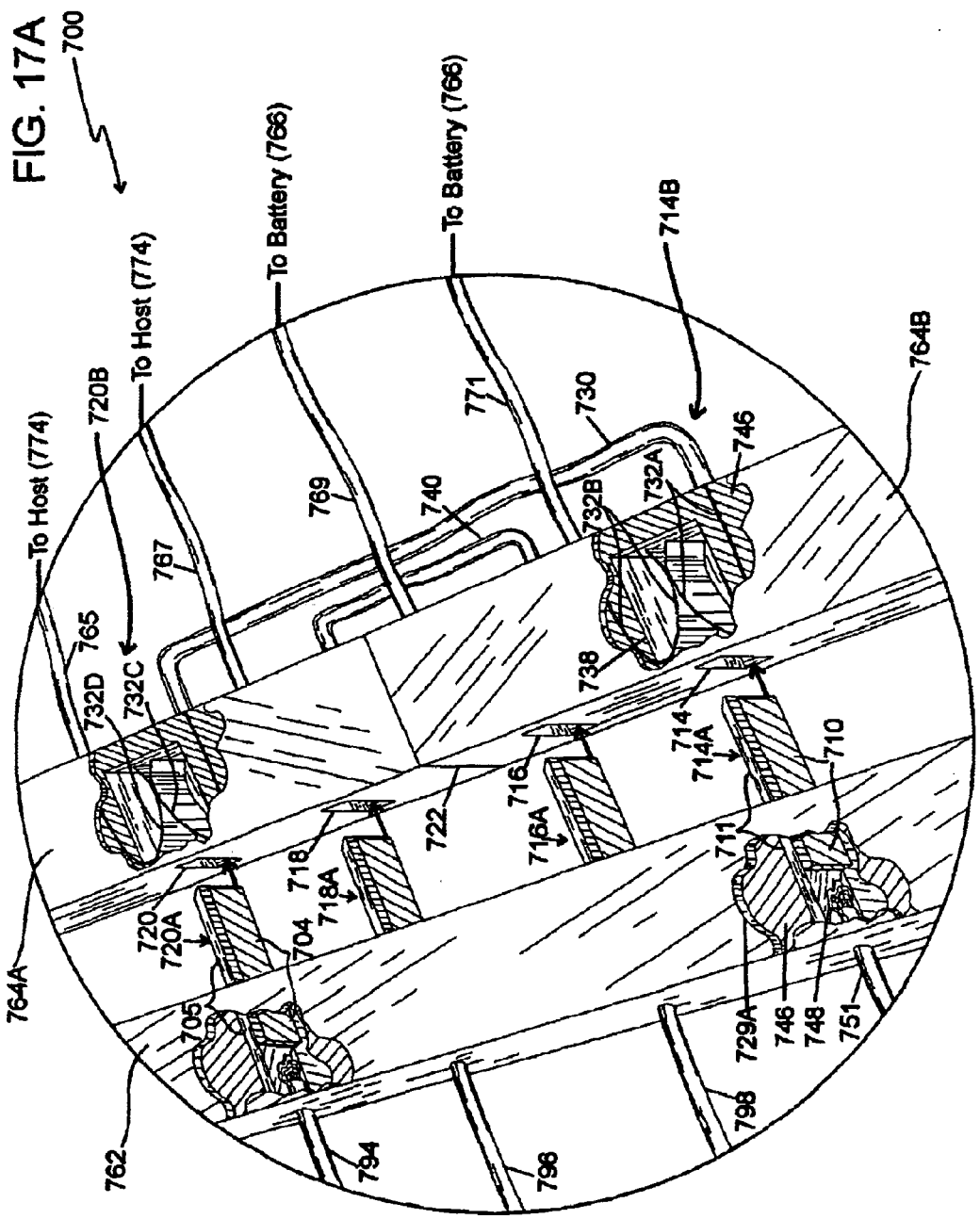

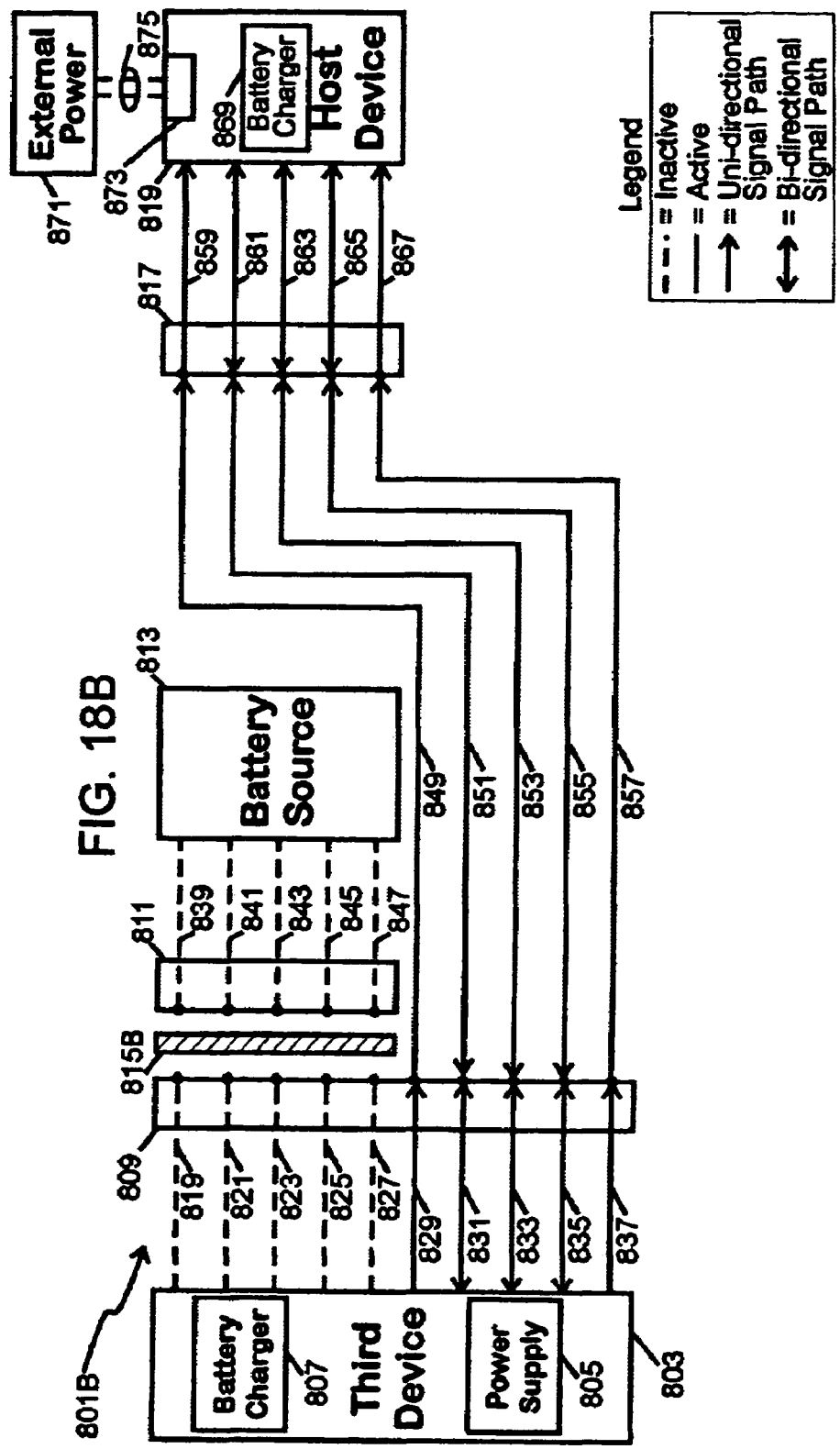

APPARATUS FOR ENABLING MULTIPLE MODES OF OPERATION AMONG A PLURALITY OF DEVICES

1. Related Applications

This application is a Continuation in Part of U.S. Pat. No. 6,152,597, issue date Nov. 28, 2000, based on U.S. patent application Ser. No. 09/105,489 filed Jun. 26, 1998, which is based on U.S. Provisional Application Nos. 60/051,035, filed Jun. 27, 1997, and 60/055,883, filed Aug. 15, 1997, all of which are incorporated by reference herein in its entirety.

BACKGROUND OF THE INVENTION

1. Field of the Invention

This invention relates to temperature-sensing devices, specifically to an improved apparatus for monitoring temperature that integrates a thermistor construct into a connector construct. Further, another aspect of the invention relates to connector devices, specifically to an interface apparatus for inter-device data communication, power transfers, and inter-operability among multiple devices.

2. Description of the Related Art

Temperature-sensing devices have previously been manufactured as two general types of goods. Discrete electronic thermistor components are mounted on circuit boards, or attached in wire runs. Monitoring probes, as another class, are attached on devices or placed in proximity to them, as might be typified in laboratory test environments.

Both classes of temperature-sensing devices are characterized by a thermally-resistive element, such as a thin section of metal that changes its resistance at it warms or cools. The temperature-reactive element is traditionally affixed to two or more conductors. In the case of board-mountable thermistor components, the conductors are solderable lands. Probe-type units attach to other devices with 2–4 lengths of wire. The type of conductors employed limit the way these temperature-sensors can be used in a circuit, especially where they can be located and how they can be installed. For example, if an already-manufactured power source's internal temperatures are to be monitored, board-mountable components are not a feasible solution without opening up the power source's enclosure. Even if there is access to the internal areas of the power source, for example a rechargeable battery pack, the component-style thermistor would require the correctly-configured attachment points on a circuit board.

A probe-style device offers more flexibility as to methods of attachment, for its leads can tie into an internal circuit board.

But, what options are available if there is no internal circuit board? For power sources like battery packs, for example, some have "smart" internal circuits, while others do not. If there is no internal circuitry, neither type of thermistor affords easy implementation of temperature sensing. A probe-style sensor could be installed, assuming that the battery pack could be opened (most are sealed). But the probe's wires would have to pass through a hole made in the housing, which is not very practical. Even if an access point could be created, the thick wires routed along the outside of the battery pack would likely make it difficult to reinstall the modified battery pack into a host device's molded battery cavity. Furthermore, such a radical modification to a manufactured battery pack would require significant skills, and the modified device would be aesthetically compromised.

Beside the physical limitations imposed by the traditional form factors of existing temperature-sensors, these device's modes of operation and electromechanical characteristics create further limitations.

Flexible Circuit Boards

"Flex" circuit boards are commonplace in today's small and lightweight electronic devices. Phillips Electronics (Sunnyvale, Calif.) incorporates a small flexible circuit in its two-cell rechargeable battery pack used in that company's Velo handheld computer. A discrete thermistor component is mounted on the Velo's flex-board. In particular, Duracell (Bethell, Conn.) used a component-style thermistor on a flexible circuit in its now discontinued "smart" batteries. Neither of these devices is upgradeable by the addition of a second temperature sensor, even though the Duracell's internal flex-board had a provision for a second temperature sensor. While a probe-style ancillary thermistor could be attached to either the Duracell or Phillips battery packs, as a post-manufacture retrofit, none of the various discrete thermistor types discussed below would provide its own data interface.

Thus, while flex-circuits do routinely incorporate component-style thermistors, none of these data and power circuits incorporates an integral thin and flexible thermistor as one of the traces on the circuit board itself. They therefore lack temperature sensing capabilities, combined with data and power interfaces appropriate for use on already-manufactured power sources, such as "smart batteries," for example.

As a result of this absence of a self-contained data interface compatible with the existing contact locations on these battery packs, including the lack of integral power conductors, today's thermistors cannot be used to provide a second level of safety by monitoring heat within either of these battery packs. All of the thermistors below are also limited in their ability to deliver their temperature information to an external device, such as an external battery charger, for example.

Data and Power Interfaces

Intra-device interfaces play a key role in communicating temperature-sensor information when a battery is connected to more than its associated host device. Third devices, such as external battery charges, external power supplies, and monitoring apparati, often require access to either the battery's data or power paths, or to a host device's data or power circuitry.

For devices such as battery packs for products already manufactured, the ability to provide simple add-on data and power access ports for access by third devices (e.g., an external battery charger or power supply) facilitates many modes of operation, including but not limited to, temperature monitoring. Interfaces that can be end-user applied, or that upgrade an existing battery-powered product by means of a low-cost external connector, eliminate time-consuming product redesigns, and costly remanufacturing.

For products not yet manufactured, adding supplemental connectors and conductors define new data-communications paths, or provide expanded power access ports, enhancing the opportunity to attach peripheral devices that can temporarily disable battery charging, or bypass the battery to deliver external power directly to a host device.

Temperature-Sensing Devices

Temperature-sensing devices, whether a positive temperature coefficient (PTC) or negative temperature coefficient (NTC) type, have not exhibited response times adequate to the rapid heat build-up associated with today's volatile battery chemistries. Nickel-Cadmium (NiCad) and Nickel-Metal-Hydride (NiMH) battery chemistries can show thermal runaway behavior during charge, but Lithium-Ion (Li-Ion) batteries are much more! unstable. Li-Ion cells' sensitivity to charge overvoltages, and even to inappropriate trickle charging, can create sudden heat build-up in cells. If this temperature increase is not ameliorated promptly, the cell can explode.

Temperature-sensing is a reliable way to detect aberrant cell behavior. Early detection of even minor temperature increases inside a cell can prevent overcharging, thermal runaway, and the explosive consequences. Even cell venting, which is an accepted method of releasing a cell's internal pressure caused by heat, can be avoided by detecting temperature increases quickly.

Heat Affects Battery Efficiency and Life

The System Management Bus (SMBus) specifications, (available from the standard body's web site: www.sbs-forum.org) commonly used to define safe laptop battery charging standards, specify not only an in-circuit thermistor, but also provide for an additional temperature sensor external to the battery's circuit board.

Temperature increases during battery cell charging have detrimental effects on the cell's chemistry, often with dangerous consequences. As one battery charger application engineer notes: "Temperature increases [within the cell] generate additional chemical reactions that are irreversible . . . For example, heat creates oxygen, which builds up pressure in a nickel-metal hydride (NiMH) cell. Not only is that an unsafe condition, but it reduces battery life, because it's nonreversible." Another application engineer indicates that: "As far as temperature is concerned, . . . there's a big difference between NiCad and NiMH. It's highly recommended to use a thermistor sensor as part of the primary or back-up [charge] termination method" (McKinnon, Cheryl, "Battery mission: to charge and to protect," *Portable Design* (October, 1997), pp. 33–43).

Even "smart" circuits in rechargeable batteries leave room for improvement. Traditional component-style thermistors are mounted on circuit boards located at one end of the battery-pack's plastic housing. There can be as many as 10 cells in a battery pack, yet a board-mounted thermistor can only be in relative proximity to the nearest cells at that end of the battery pack. Cells as much as 8 inches away from this board-mounted thermistor can overheat, and the remote temperature sensor at the opposite end of the battery pack will not indicate an over-heated condition for perhaps 15 seconds or more. This is an eternity when preventing a potential cell explosion.

Thermistor Response-Time is a Function of Distance

Critical time-to-respond is determined by the distance between the heat source and the temperature-sensing mechanism. The model is analogous to the thermostat in a house. A household thermostat can only sense room temperature near to its location, so an over-heated room at the opposite end of the house is commonplace. Battery pack enclosures are just like a house. If there is a temperature sensor (thermostat) only at one end of the battery housing, detecting a distant over-heated cell (remote room) is impractical.

Typical Thermistor Response Times

Not only does distance between a heat source and a remote temperature sensing thermistor contribute to lack of adequate response time, but the inherent lag or delay in a thermistor design also increases total response time. Thin Film Detectors (TFDs), discussed below, can have a response lag time of 13.5–55 seconds when detecting the temperature of local air (as would be the case in a battery pack, where a single thermistor is sampling ambient air temperature within the enclosure). Average response times of PTC-style sensors are typically 20 seconds. Thus, placing such slow-responding temperature sensors at a distance from an over-heating cell only exacerbates problems with timely responses.

Remote Thermistors Don't Fit Existing Battery Pack Manufacture Configurations

Although SMBus specifications provide circuit board connections for a remote thermistor, this device is rarely implemented. This is a function of thermistor configurations. Temperature sensors manufactured by Keystone Thermometrics (St. Mary's, PA), Semitec (Babylon, N.Y.), among others, are configured as board-mountable components. These do not lend themselves to convenient placement in remote locations in a battery pack.

Some battery pack designers embed probe-type thermistors in the opening created by stacking cylindrical cells in a cluster of three. This approach allows for some improvement in thermistor response time by locating the temperature sensor adjacent to the cells. Mounting such devices, however, typically requires potting the probe. The potting compound has an insulator effect, thus degrading the efficacy of the thermistor. Also, few battery cavities accommodate a stacked cluster of three cells. In a cell phone or laptop computer, for example, cells are typically mounted side-by-side in a flat-pack configuration to minimize product thickness.

Cost is an Issue

Among the thinnest thermistors in the marketplace are thermocouples. Omega Corporation (Stamford, Conn.) fabricates thermocouples from Copper/Constantan. The thinnest bead available is 0.005 inches (for a maximum temperature of 400 degrees F.). Although quite thin, these sensor probes are still very localized. Another prohibitive issue is that they are priced at about $17.00–25.00 each. If a thermocouple were attached to each cell in a nine-cell battery pack, the manufacturing cost would be $153.00–225.00 per battery pack. The retail price of such packs would be more than $500.00!

Semi-disposable rechargeable battery packs, commonly used in consumer-electronic products, require cost-effective temperature-sensing solutions. For example, more than 700,000 battery packs are manufactured each year for laptop computers. The board-mounted thermistor used today in such battery packs costs less than 30 cents.

Thin Film Detectors (TFDs) are flat-shaped platinum-resistance devices often used for temperature monitoring in wind tunnels or air conditioning systems. They measure a mere 0.250 inches and still can only sense a localized area. An Omega "Thin-Film Detector" costs $25 each, and only covers a surface area of 0.040×0.125 inches. The same company's thin-film RTD temperature sensor unit prices at $32–71. For a cellular phone's three-cell battery pack, for example, the cost of individual-cell temperature sensing would exceed $75, for a rechargeable battery product with a typical retail price of $50.

Thermal-Ribbon RTD Thermistors

Thermistors are available configured as "thermal-ribbon RTDs", such as the Minco (Minneapolis, Minn.) S17422. While conformably thin (0.5 mm) and flexible, these thermistors are limited by a requirement for two-conductor wires per sensor. Thus, a 10-cell battery pack would require 20 discrete wires running from 10 thermistors. These wire bundles would have to be run longitudinally in the "valleys" between round cells. Manufacturing such a battery pack would be complex and unnecessarily expensive.

With the advent of newer polymorphic cells that are not cylindrical in cross section, but are rectangular and flat, the complex wiring of thermal-ribbon RTD's would increase the overall size of a battery pack. Adding width or thickness to polymorphic packs defeats one of their primary advantages—a small cross-sectional profile.

Also, existing thermal-ribbon thermistors are fabricated with precious metals, such as platinum, which increases cost. To use six or more of these in a battery pack, so that each cell has its own temperature sensor in order to provide total temperature protection, adds considerably to the cost of a NiCad battery pack.

Polymeric PTC Materials

Raychem Corporation (Menlo Park, Calif.) manufactures Polyswitch Resettable Fuses that incorporate polymeric positive temperature coefficient (PTC) materials. The Polyswitch is used herein to illustrate the PTC class of thermally-conductive materials. Other manufacturers, such as DuPont (Cornwallis, N.C.), Keystone, and Omega have similar PTC chemistries, so by examining the Raychem PTC devices, all other similar products are assumed as equivalents. Composed of a matrix of crystalline organic polymer with dispersed conductive carbon particles, the quantity of conductive particles (which are carbon black) in the polymer matrix changes its physical properties to be less or more conductive. Precipitating this change of physical and electrical states are both the effects of temperature and electrical current, with current being the predominant force contributing to changes in resistivity.

Temperature inside a device, such as a battery pack, for example, is not a predictable means of triggering Raychem's PTC. The rate of heat loss within the battery pack must be less than the heat generated within a Polyswitch device. If the heat generated within a battery enclosure, more importantly heat at the location of the PTC, is greater than the heat loss of the polymeric PTC, the total energy required to make the Raychem device trigger (and thus stop an elevated temperature state within the cell) increases. The greater the heat transfer from the Polyswitch device to the environment, the slower the device's time-to-trip. This method of utilizing PTC polymer temperature sensing makes it extremely difficult to anticipate the change in the time it takes to trip the device. There is also a noticeable break or lag in the "time-to-trigger" with these types of devices, the time-lag created by the polymers' transition from an adiabatic to an non-adiabatic state.

Current-sensing, Not Temperature-sensing Drives Polyswitch Performance

A Polyswitch device may serve as an adequate fail-safe in overcurrent conditions during battery charging, since changes in electrical current-flow resulting from improper cell impedances favor triggered events caused by resistance changes in the Polyswitch device. Devices in this PTC class are not appropriate as early-warning sensors for detecting initial increases in individual cell temperature. Manufacturers of "smart" batteries, that have built-in circuitry to monitor cell voltage, current, and temperature, rely on Raychem's Polyswitch for over-current states. Polyswitch-type devices are not used for direct temperature monitoring because of their slow response times and trip-point lags.

The Role of Previous Printed-Ink Thermistors

Resistive printed-ink devices are commonly known. For example, U.S. Pat. No. 4,882,466 (Friel), is a two-electrode PTC that uses crystalline organic polymer and a conductive filler mixture. This material is applied to a substrate in the form of an ink. Friel's invention, as with the previously described Raychem PTC (the Friel patent was assigned to Raychem Corporation), reacts to electrical current applied to conductive ink to create a heater element. Heating (often referred to as "self-heating") is a generic trait of all positive temperature coefficient (PTC) thermistors. This self-heating characteristic is usually exploited, as it is in Friel, in devices that act as heaters. An example of this is the use of PTC devices as heaters for mirrors, where temperature response is employed to allow current to flow at or below a pre-defined temperature. Thus, an automobile's external sideview mirrors are heated only when the ambient temperature of the mirrored surface drops to a pre-specified temperature. Such self-heating characteristics only contribute to slower temperature-related response times when used inside a battery pack.

While Friel suggests that printable resistive ink traces can be applied to multi-layered substrates, the defined conductive paths are for heat generation through the conductance of electrical power. There is no provision for using conductors for data transmission, as is called for in the thermistor of the present invention. Also, Friel employs layers of conductive polymers and current-carrying electrodes which are attached or bonded in such a manner that they interact electrically, and are not insulated by appropriate dielectric materials.

Battery Charging Solutions

Intra-device data connectivity is essential in today's "smart" battery architectures. Temperature-reporting information from analog sensors must be converted to digital signals, then porcessed into "smart"-protocol-compliant data that can be interpreted by host devices, or third devices such as external chargers, monitoring devices, power supplies, etc. Interfacing with existing data lines can lead to extensive product redesign and costly engineering modifications. For example, redirecting the smart-battery data paths in a laptop computer would necessitate complex changes to circuit boards. It would be preferable to avoid such major invasive approaches or, at a minimum, to limit the redesign and engineering changes to modifications of the removable battery pack.

External smart battery chargers are a good example of third devices that would benefit from supplemental data connectivity. External battery charges have, by and large, become a scarce peripheral offering from laptop manufacturers. End users with multiple battery packs are left to swap them in and out of the host device in order to charge. If the laptop is attached to a docking station, swapping battery packs necessitates undocking the notebook computer, removing one battery and replacing it with another, then re-docking the laptop. This inconvenience can be eliminated by providing a user-accessible battery interface, so that an external charging cable is attached to the spare battery. The battery pack can be charged in situ, for those laptops that support multiple battery bays. In such models, one battery is normally charged, then the charger switches to the second pack, but an interface to an external charger enables a concurrent two-pack charging cycle in half the time. Such accessible interfaces could well spur third-party peripheral vendors to re-introduce the external battery charger.

Thermistor Surface Area Aids Response

Traditional thermistor size parameters have been driven by their applications. For laboratory, test equipment, and industrial applications, monitoring temperature at a well-defined location has required small form factors. Needle-thin probes, circular PTCs smaller than a dime, and rectangular postage-stamp-sized patches have been the norm. However, a single cylindrical ¾-size battery cell has a surface area of approximately 5.25 inches. Present sensor design and form factors are not optimized for wide-area coverage.

For newer prismatic polymorphic cells, with typical dimensions of 1×4.5 inches along their top and bottom surfaces, small-surface-area thermistors are not well matched dimensionally.

Minco (Minneapolis, Minn.) manufactures a custom Thermal-Ribbon temperature sensor (Discoil) that can be ordered with dimensions as large as 2 feet square. While this sensor could cover one surface on an entire battery pack, it is somewhat thick (0.3 mm) and, more importantly, quite expensive. Discoil uses platinum elements, so it would be cost-prohibitive as a semi-disposable thermistor that covers an entire face of a battery pack enclosure. The dimensions of such a battery pack could easily exceed 24 square inches.

Ink-based PTCs Not Optimized

PTC devices, whether or not fabricated with conductive inks, are not optimized for battery temperature monitoring for several reasons. First, they are dependent on sizeable current flow (often 200 Ma or more) to create changes in temperature-response along the conductive ink surfaces. In theory, if one were to use such a PTC temperature-sensing device on a cell, it would only further warm the cell, as current from the battery charging circuit flowed through the sensor. This would be an inappropriate response, and diametrically opposed to the desired effect of keeping battery temperatures low.

Second, because PTC sensors rely on electrical current to achieve functionality, they create a drain on available power. Battery cells can overheat through rapid discharge, where the load imposed by a PTC thermistor only hastens the discharge rate. Even in a charge mode, a PTC thermistor on each cell in a 10-cell battery pack would contribute an excessive additional load, requiring extra power from the charging circuit.

Third, electrode resistivity is critical to the proper operation of PTC sensors. Friel describes specific formulaic electrode width-to-length ratios to establish a stable and repeatable temperature trigger. Electrodes are to be "as thin as possible," according to Friel, with average thicknesses (widths) of 0.0001 to 0.01 inches. Such precision requires close manufacturing tolerances. Furthermore, in an application in which the PTC unit is to be flexed, for example when wrapping a temperature sensor around a single battery cell, these thin traces can crack or delaminate from the substrate material.

Fourth, the lack of durability of such devices as Friel's and others discussed here, do not readily lend themselves to external attachment on pre-manufactured battery packs, where consumer wear-and-tear would degrade the thermistor's performance by constant handling. Because all cellular phones and laptops have removable battery packs, as do many other consumer electronic devices, the frailty of devices like Friel's creates durability concerns. Affixing PTC thermistor constructs to battery enclosures that are repeatedly inserted into, and removed from, battery bays or slots, indicate that abrasion would become an issue. Compounding the problem is the thickness of thermistors like Friel's and the thermal-ribbon and RTD configurations previously discussed. Especially troublesome is the thick mass created at the hardpoints where the thermistor's surface electrodes transition to (often thick) wire conductors. Battery packs usually fit snugly into molded cavities in their host devices, so thickness parameters must be extremely thin.

In keeping with the thin-profile requirements, interface connectors and related conductors should not create significant changes in the overall external dimensions of the battery pack's housing.

Fifth, the Friel device requires the inked electrodes to be printed on conductive surfaces onto which have been deposited or laminated resistive elements, such as electrodeposited copper or other conductive metals. Such a multiple-deposition or dual-layered process increases manufacturing complexity and unit cost.

Externally Attached Labels Using Thermally-Sensitive Materials

Attached labels on battery cells or battery packs are addressed by U.S. Pat. No. 5,626,978 (Weiss), wherein a label incorporates thermally-sensitive materials as part of a test circuit. Weiss does not allow for connectivity to a local or remote circuit, as would be the case with the present invention used with a "smart" battery's A/D circuitry. Weiss does not address any connectivity to external temperature monitoring or charger devices. Weiss' invention is restricted to detecting battery capacity, expressed as a visual display of a "fuel gauge." The information displayed on a battery label in certain modalities of the present invention is passive and unchanging, such as a company logo or user instructions. Weiss' invention, especially its display, is active. By depressing a selected area, Weiss' battery label displays remaining battery capacity. The present invention operates autonomously and without contacts or switches of any sort.

In summary, a variety of features and characteristics of today's thermistors leaves room for improvement in temperature monitoring of power sources, for example rechargeable and removable batteries (especially "smart" batteries), and external power supplies and battery chargers):

1). Traditional temperature-sensors, whether board-mountable electronic components, or attachable/placeable probes with wire leads, cannot be easily integrated into, or attached to, already-manufactured power sources, such as battery packs.

2). Even if a battery pack, as an example of a power source, could be opened up, if the power source requiring temperature monitoring does not have an internal circuit board, traditional thermistors are not of much use. Lacking an internal circuit that provides A/D functions, as well as appropriate contacts on the battery housing, a power source's temperature data cannot be accessed by an external monitoring device.

3). Power sources that do have internal A/D circuits and accessible data contacts on an external surface, cannot be readily modified to add additional temperature monitoring. New contact points on the power source-device's housing, dedicated to the new thermistor, would have to be created. These new contacts would have to be appropriately placed to interface with existing data contacts on the host device, for example, contacts in the battery cavity of a "smart" battery-equipped laptop computer would have to be modified to provide a data interface to the newly added thermistor.

4). Slow response times, as a consequence of a thermistor's inherent lag, or "time-to-trigger."

5). More importantly, slow response times due a thermistor's physical configuration create limitations as a remote temperature sensor. These physical characteristics include size, mounting or attachment requirements, and flexibility.

6). The inability to attach or bond the thermistor to a cell or battery pack housing using materials that act as insulators.

7). The need to have at least two conductors per thermistor.

8). A PTC thermistor's inherent characteristics, dictated by materials, to self-heat from current flow, or to experience lag times due to changes in external and internal temperature variants.

9). The use of power resources to energize current-flow-enabled "self-heating" PTCs that can further drain a battery's charge, or create additional load demands on a power supply or battery charger.

10). Cost of thermistors, driven by fabrication materials primarily, in a consumer marketplace where low-cost battery packs are the norm.

11). Small "foot print" or area coverage of thermistors.

12). The need to redesign the battery pack enclosure, whether because of additional bulky wiring, or to accommodate cross-sectionally thick sensors.

13). The requirement to hold close manufacturing tolerances to create ultra-thin strands of precious metals, or to control the complex dimensions of printed-ink electrodes.

14). The need for specific substrates, which often must be coated with metals, and which are often costly to fabricate.

15). Lack of durability, especially of thermistors which have a reasonably thin cross-sectional profile, when attached to the exterior of a removable battery pack.

16). For an external application of a thermistor to an existing battery housing, the absence of an effective data interface to a "smart" battery, or the battery's host device.

Therefore, there exists a need for an improved apparatus for monitoring temperature that addresses one or more of the deficiencies in today's apparati for monitoring temperature.

Furthermore, in another aspect of the invention, by providing a low-profile, non-invasive (or semi-invasive only to the removable battery pack, and not to the host device) interface, new and practical intra-device operations such as battery charging from an external device without removing the battery pack, or externally powering a host device without charging its battery) can be added.

SUMMARY OF INVENTION

The present invention is directed to an apparatus for monitoring temperature known as a "thermistor assembly" for detecting and communicating changes in temperature of power sources. The thermistor assembly of the present invention may be applied to an exterior or interior surface of a power source, for example a battery cell, group of battery cells, battery pack, power supply, or charger to monitor the temperature of a power source during operation, with its own data and power paths that enable the thermistor assembly to communicate temperature and related information to a plurality of devices. The apparatus is in direct contact with the power source, whereby it provides an improved response time for temperature sensing, while a self-contained construct of conductors and connectors allows for the temperature information to be easily accessed. Alternatively, the thermistor, separate from the thermistor assembly, can be attached to one or more power sources in a plurality of modalities that optimize temperature response time.

In one embodiment of the present invention, the thermistor assembly comprises a resistive element, at least one non-conductive medium, one or more conductive elements, of which two conductive elements are electrically coupled to the resistive element, at least one connector capable of carrying power and data signals, and a suitable method of attaching one or more of the components of the thermistor assembly. The resistive element is applied to one of the non-conductive media and, as an option, other non-conductive media may be bonded or attached to the medium with the resistive element, to form a multi-layered construct. The resistive element may comprise various materials having resistive properties such as, but not limited to, inks and metals. Conductive elements may comprise various materials having conductive properties such as, but not limited to, inks and metals. Each non-conductive medium is preferably a thin material that is flexible and capable of conforming to one or more surfaces of a power source.

Further, in another aspect of the invention, an apparatus for enabling multiple modes of operation among a number of devices creates conductive paths between and among those devices in a way that, for example, a battery can be charged form an external device, while that external device is also powering the battery's host. Through the use of existing interfaces for data and power, which includes both hardwired connectors, removable insulators, and even wireless data ports, devices that had limited ability to communicate or use external power devices are upgraded with low-cost interfaces and related apparatuses.

Separated Constructs

In an alternative embodiment, a multi-layered thermistor assembly can be separated into various sub-assemblies, one or more of which may be placed inside a power source, while one or more of the sub-assemblies are placed on the outside of that power source, or a housing containing that power source. It is not essential to the operation of the invention that more than one layer of the multi-layered thermistor assembly be attached either to the inside or outside of a power source.

Should such a divisible thermistor assembly be configured in a modality that provides a sub-assembly that provides temperature sensing without layers for data or power conductors, this thermistor sub-assembly may be configured as a single non-conductive stratum upon which is applied an area of continuous thermally-resistive ink. This continuous ink area is partitioned into segments by the application of conductive traces. Thus configured each inked segment provides an independent thermistor that can be accessed by its two conductors, one of said conductors being shared by the adjacent segment of thermally-resistive ink.

Connectors and Connector Constructs

In any embodiment of the thermistor assembly, any removable connectors may be eliminated by attaching conductive elements or resistive elements to a power source's existing contacts, connectors or wiring points. Non-removable connectors may replace removable connectors in certain modalities of the thermistor assembly, so that connector type, location and configuration are interchangeable in those embodiments of the present invention that indicate appropriate connectors.

The thermistor assembly may be in the configuration of a thin covering similar to a product label applied to the exterior of a power source, such as a single battery cell, multiple adjacent battery cells, or a battery pack housing, for example. The flexible and conformable qualities of the invention are achieved by the use of electrically conductive inks and thin metals. The configuration of the thermistor assembly is so thin as to not significantly add to the exterior dimensions of the power source, for example, such that the thermistor assembly can be attached to a battery pack housing without increasing the overall dimensions of the enclosure to the point of interfering with the easy insertion and removal of the battery pack in its battery compartment. The configuration of the thermistor assembly or any sub-assembly thereof, both dimensional and flexural, provides for conforming around corners of various sizes and shapes of power sources, such as battery cells and battery housings, for example.

In an alternative embodiment, the thermistor assembly of the present invention may include a suitable interface to a data-enabled power source, an example of which is a "smart" battery pack's connector or internal circuitry. Such a data interface may be achieved by permanent conductors, or semi-permanently attached conductors. Power conductors may also be included, should suitable power signals be required by functions (such as charging or delivering primary power) at the power source or other connected "smart" devices. Such a thermistor assembly may interface with multiple contact points, or use at least one pair of conductors each for power or data functions. The data or power interface may be internal to the power source, or external. Moreover, the connector construct of the thermistor assembly of the present invention can exist and function independent of its thermistor construct, and thus is not limited to being attached to thermistor construct. For example, the connector construct's data or power conductors can be located on the exterior of a power source, while the thermistor construct can be internal to a power source. Alternatively, both the thermistor and connector constructs can be internal, or the data or power conductors can be internal to a power source, while thermistor construct is attached externally to that power source. Other variants and combinations are possible, as best suits the available space within the battery, the exterior size and shape of a battery housing, the location of contacts, whether battery is already manufactured, and other similar variables.

OBJECTS OF THE INVENTION

Accordingly, several objects and advantages of the present invention are:

1). To improve temperature-sensing response times by using a rapid-response ink formulation, in conjunction with a form factor that allows the thermistor to be in direct contact with each battery cell. For pre-manufactured battery packs, the present invention affords an opportunity to add safety features by attaching the thermistor directly to a battery enclosure.

2). To provide a thermistor with an ultra-thin cross-sectional profile, so that existing plastic battery pack enclosures do not have to be redesigned or increased dimensionally.

3). To provide a highly flexible temperature sensor that can be easily contoured to conform to various cell shapes and dimensions.

4). To provide a thermistor with "large-foot-print" form factors, both to detect heat across the large surfaces of pre-manufactured battery packs, or to cover a substantial "wetted area" of a polymorphic cell.

5). To provide a temperature sensor with good flexibility, so that it can be contoured to irregular battery housing shapes, especially around corners.

6). To provide a direct-applied thermistor that can eliminate any adhesive whatsoever by printing thermally-resistive conductive inks directly onto materials like the nylon faces of polymorphic cells, for example.

7). By providing a direct-applied thermistor that requires no adhesives, to eliminate any loss of sensitivity or response time due to insulator materials or gaps when bonding a pre-manufactured ribbon or thin-film thermistor.

8). To provide a series of thermistors inside a battery pack that require only four thin, flexible, inexpensive, and dimensionally non-critical conductors to connect three discrete temperature sensors, i.e., less than two conductors per sensor.

9). To provide a PTC thermistor that does not require the application of significant amounts of current, but instead operates efficiently at microamps to conserve battery or charger power resources.

10). To provide a PTC temperature sensor that does not self-heat, but remains at an ambient temperature corresponding to that of the monitored device, such as a battery cell, to which it is attached.

11). To provide a method of manufacturing low-cost thermistors using non-critical silk-screening processes and relatively inexpensive thermally-resistive conductive inks.

12). To provide a manufacturing process for large production quantities of thermistors that is time- and cost-efficient.

13). To provide a thermistor with variable geometries that can be readily adapted to different form factors and footprints.

14). To minimize the total bulk and mass of devices required to attach a thermistor to every cell in a multiple-celled battery pack.

15). To provide a thermistor that does not require close manufacturing tolerances, or the control of complex dimensions but, instead, can be printed in simple patterns or shapes.

16). To provide a temperature sensor that can be applied to low-cost, readily available dielectric materials such as pre-printed labels, or even coated paper stocks.

17). To provide very-thin cross-section to an externally-applied aftermarket thermistor, so that it does not disrupt the clearance tolerances within the powered device's battery bay or compartment.

18). To provide a temperature sensor that consumers can attach themselves to battery packs as aftermarket temperature-sensor upgrades and that, when damaged from normal wear-and-tear, can be discarded and another applied.

19). To provide a thermistor that has removable conductors, or that can be attached by a simple connector, thus eliminating the thickness of hardwired attachment points along the edge of the sensor.

20). To provide a thermistor that can comply with existing standards and specifications for "smart" battery products.

21). To provide a suitable interface to a "smart" battery pack's connector for a thermistor that must communicate with other "smart" devices.

22). To provide an integrated thermistor and connector interface that can be manufactured cost effectively, using known processes and that can produce such an integrated product in large volumes.

23). To provide temperature sensing and related data and power functions in a thin, flexible unit with a footprint large enough for temperature sensing across an entire pre-manufactured battery pack.

24). To provide a temperature sensor with a data/power connector interface that is versatile enough to be built into a battery enclosure, or that can perform all necessary sensing, data, and power functions when attached externally to an existing battery housing.

25). To provide suitable connector interfaces and conductive paths to allow a multiplicity of data and power connections among a plurality of devices, so that a variety of functions—including temperature sensing—can be facilitated in existing, as well as yet-to-be-manufactured battery-powered products.

Further objects and advantages are to provide an ink-thermistor printing process that can include the use of company logos, bar codes, user instructions, or other printable information applied on the same substrate as the temperature sensor.

Still further objects and advantages will become apparent from a consideration of the ensuing description and drawings.

BRIEF DESCRIPTION OF THE DRAWINGS

FIG. 7 shows a multi-layered "thermistor assembly" with a thermistor sub-assembly from FIG. 5, and the conductors expressed as external data and power traces in FIG. 6 herein shown as a permanently-wired circuit within the battery pack.

FIG. 14C depicts diagrammatically multiple device interconnected for data and power transfers, including wireless.

FIG. 14F is a detailed schematic view of switches in a powerline-modulation circuit.

FIG. 14G is another schematic view of the switch in FIG. 14F, showing a second configuration.

FIG. 14H is a third diagrammatic view of a switch configuration in FIGS. 14F and G.

FIG. 17A is a detail of a connector apparatus in FIG. 17, which manually creates alternative data and/or power paths among multiple devices.

FIG. 18B depicts a variant of the connector apparatus shown in FIG. 18A.

DETAILED DESCRIPTION OF THE DRAWINGS

Figure 1:
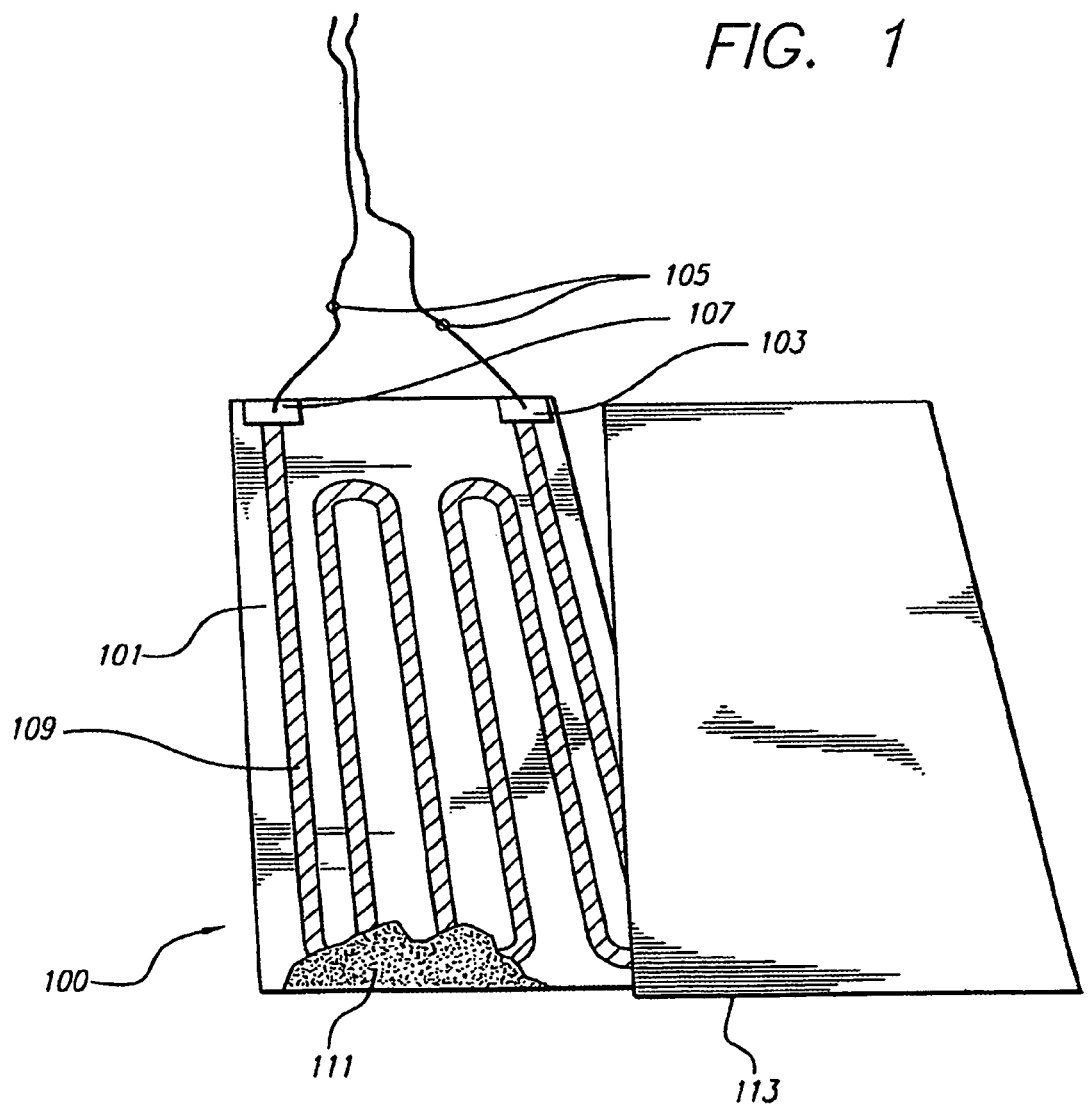
FIG. 1 illustrates various aspects of a basic thermistor sub-assembly of the present invention, along with an optional attachable protective sealed cover layer.

As shown in FIG. 1, the thermistor sub-assembly of the present invention is generally referred to by the numeral 100. Thermistor 100 is comprised of the elements defined below. Two general embodiments of thermistor 100 are described. One embodiment uses resistive elements such as platinum, or equivalent thermally-reactive metals such as iron or copper constantan, for example, that react to changes in temperature by exhibiting detectable differences in resistance. The second embodiment uses thermally-resistive inks, or equivalents such as thick- or thin-film polymer/carbon composites, for example.

Thermistor 100 generally comprises at least one medium or stratum 101, a resistive element 109, an optional dielectric medium 113, and electric leads 105. Medium 101 has non-conductive properties, is thin enough to allow good thermal transfer and to provide flexibility, and to which can be applied traces of thermally-resistive material, such as platinum or thermally-resistive ink, for example. There may be more than one such strata 101, as shown by a second dielectric medium 113. The two layers 101 and 113 can be bonded one to the other by means that seal the perimeters, such as with a flexible adhesive, so that resistive element 109 is captive between two layers of medium 101 and 113. Examples of media which exhibit suitable characteristics for use as medium 101 or 113 are Mylar (DuPont brand name), Kapton (3-M brand name), vinyls, coated papers, and label stock.

Mylar and Kapton have been used as substrates for various metals, for example copper for "flex" circuit boards. Companies like TV Interactive (Fremont, Calif.) have printed conductive inks on mylar and kapton for circuits which behave like membrane contact switches. TV Interactive has karioke implementations of their conductive ink devices on sale in Japan. Consumers press an area on the packaging of an audio CD-ROM. This area is a thin-membrane switch that activates a remote audio track. Thus, the consumer can hear music selections in the store, simply by activating a membrane switch on the CD-ROM's packaging.

Paper is only suitable for medium 101 if thermistor 100 is used to monitor temperatures within a reasonably low temperature range (a maximum temperature of about 200-degrees Fahrenheit). Paper, if not laminated or otherwise bonded to a more stable media, such as foil or vinyl-type plastics, exhibits "creep" in the presence of moisture and or temperature. Changes in the physical dimensions of paper goods is not desirable for thermistor $10q$. Curling, rippling or other dimensional distortions are tolerable to a certain extent, but delamination of resistive element 109 from stratum 101 is to be avoided, as is delamination of thermistor 100 from the surface to which it is affixed, such as the casing of a battery cell, for example.

3-M (Minneapolis, Minn.) and Fasson (Avery-Dennison's (Pasadena, Calif.) brand name for commercial label stock) manufacture both paper and foil label stock which can withstand temperatures in the 150–200-degree Fahrenheit range.

If ink is being used as resistive element 109, it can be applied to "coated" stocks, such as for example "coated" paper stock used for labels and badges, which often have an adhesive backing. A carbon/polymer-based resistive [changed from "conductive"] ink, or equivalent, can be applied to the coated stock on either the plasticized side, or to the adhesive-backing side (but not on the adhesive backing). If the application is to the adhesive side, the thermally-resistive ink which is used in thermistor sub-assembly 100 is applied as the first step, and then the adhesive coating is applied over the resistive ink. The last step is to apply the "peel-off" backing, which typically has a wax or plastic non-bondable surface to facilitate its removal from the adhesive surface. These are often referred to as "crack-and-peel" stock in the printing industry, and are available from companies such as Avery/Dennison (Pasadena, Calif.). The Avery "Fasson" brand is for industrial label makers, and is not marketed to either the general printing industry, or to the mass market). Commercial paper stores carry "crack-and-peel' stock in numerous thicknesses (weights) and with many finishes, including metalized and colored front faces.

Most of these "coated" stocks use plastics to achieve their smooth outer surface finish, and even those which look metallic are actually plastics or vinyls. There are "paper foils," which are true metals bonded (usually laminated) to plastics. These may not be desirable, in that the resistive value of the platinum or ink can potentially be compromised, although there is no indication of that empirically.

Protective Layers

Second medium 113 can be eliminated if thermistor 100 is to be applied to a surface with suitable bonding material 111 so that thermally-resistive element 109 will not be compromised by handling, or by a chemical interaction between resistive element 109 and the adhesive. In embodiments using thermally-resistive inks, element 109 can be protected by overprinting printable varnishes, acrylics or lacquers commonly available to printers (not shown in FIG. 1) Flexible adhesive 111 in such an application, as shown in the Figures which follow, may be either permanent, or of a low-tack, so that it is removable.

The implementation of this single-sided embodiment of thermistor 100 is only recommended if it is fabricated and applied in a controlled environment, preferably where fabrication and application machinery is used. The fragile nature of resistive element 109 is such that it can be easily damaged if a second layer, such as dielectric medium 113, is not present. The advantage of this single-sided application is that the thermistor's resistive element 109 is directly in contact with the surface being monitored for changes in thermal characteristics, which is illustrated in the various Figures as power sources, such as battery packs or individual battery cells, for example.

Thermally-Resistive Materials

The resistive element 109 that makes thermistor 100 in FIG. 1 work as a thermistor sub-assembly of the apparatus for monitoring temperature that is the present invention comprises, in one modality, a metal or metallized material applied in such a fashion that when electrical current passes through it, it exhibits a known electrical resistance characteristic which can be measured. By the type of material used in resistive element 109, as well as its physical dimensions (the thickness, i.e., depth, of conductive ink that is applied on medium 101, as well as the width of the conductive ink trace), resistive element 109 varies its electrical resistance as the temperature of resistive element 109 changes. The result is that the resistive-value of resistive element 109 can be read as either a change of current or voltage along leads 105 in FIG. 1. These voltage or current readings are translated by an external device (not shown) to resistive values that correlate with temperature. Contact pads 103 and 107 weld or solder leads 105 to resistive element 109. Conductive epoxy cements can also be used to electromechanically attach leads 105 to contact pads 103 and 107, or crimped or stapled attaching devices can be used.

Thermally-Resistive Metals

Resistive element 109, as expressed in metal, is built by one of two methods. The first method is to laminate a thermally-reactive metal in an even layer onto stratum 101. The depth and width of the platinum is dependent on the thermal and or resistive range to be detected with device 100. Very thin or narrow traces of platinum will give better thermal characteristics at low temperatures. Platinum thicknesses of 1–2 μm will yield stable thermistor values from about 20 degrees F. to +950 degrees F. It is most important that the layer be of an even thickness, since layer thickness and the width of the platinum trace both determine the final resistive/thermal characteristics of resistive element 109.

Once an oversized trace of resistive element 109 has been applied to stratum 101, either sputter etching or laser trimming can be used to define the final configuration of element 109. Optimum precision is achieved by a combination of both sputter etching and laser trimming, as discussed in "Laser Trimming vs. Sputter Etching of Platinum Thin Film Temperature Resistance Elements," by Walter Diehl (Sensors Magazine, May 1997, pp. 87–89). While this article uses examples of platinum applied to $Al_2O_3$, the photolithographic sputter etching process is generic to mylar and kapton, and also lends itself to some coated paper and label stocks, especially "fluid-line tapes" as often used in the aircraft industry for hydraulic and other hose labels. The precision of the laser to control the depth of the cut defines the substrates which are suitable for laser trimming.

An alternative modality of thermistor sub-assembly 100 is to fabricate a hybrid temperature sensor using aluminized paper available from Hazen Paper (Holly, Ak.). This material is a 10 pt paper backing, to which is laminated one or more layers (as thin as 0.0005 mm) aluminum foil. This material can be die-cut ("kiss" cut preferred) to create two narrow (about 0.150 mm) of conductive traces, between which can be silk-screened thermally-resistive ink.

Printed Thermally-Resistive Inks

While temperature-response resistive metals can be used for thermistor 100, thermally-resistive conductive inks are preferred in the best modes for building temperature sensors used in rechargeable battery devices. Primary considerations for selecting inks over metals are cost, ease-of-fabrication, "thin-ness," durability, and flexibility.

Thermally-resistive element 109, when embodied as an ink, can also be applied directly onto materials used in the fabrication of battery devices. For example, a thin nylon material is used as the enclosure for polymorphic battery cells. This material can be run through a silk-screen press prior to the stock being trimmed to size. The "semi-dry" Lithium-Ion anode and cathode materials are then captured between two layers of nylon, and heat sealed along all edges. Thus, thermistor 100 does not require a discrete stratum 101, as the nylon material itself serves that purpose.

Thermally-resistive inks 109 can be suitably thinned and spray-applied to the inside of plastic battery pack housings, or hand silk-screened on either the inside or outside of such materials. Thus, there are several modes where actual materials used in fabricating the final product to which thermistor sub-assembly 100 serve as suitable substitutes for stratum 101.

Inks for resistive element 109 may have at least a portion thereof made of a thermally-variable-resistance material having a resistivity that changes in response to ambient temperature. Preferably, the variable resistivity ink material has a positive resistive coefficient, so that it exhibits upward changes in resistance with increases in ambient temperature.

Generally, positive temperature coefficient (PTC) inks have characteristics that make them suitable for thermistor 100's resistive element 109. While the fabrication of thermistor 100 is not limited to a particular brand of commercially-available ink, Acheson Colloids, Inc. (Port Huron, Mich.) manufactures a PTCR ink that exhibits characteristics shown in FIG. 11.

Figure 11:
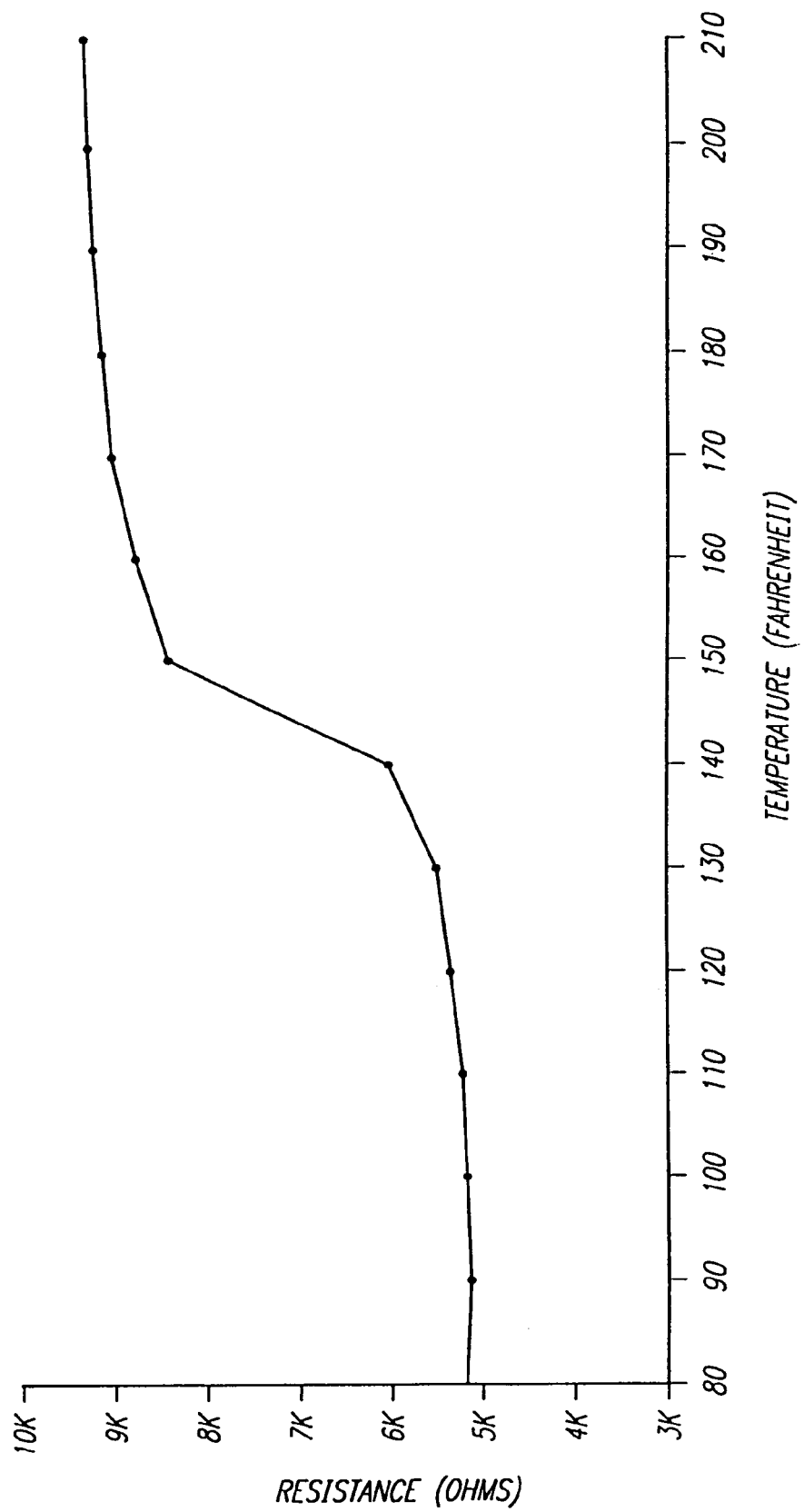
FIG. 11 is a graph of resistance versus temperature characteristics of a resistive element of the "thermistor assembly" of the present invention.

Carbon-based conductive ink as resistive element 109 is achieved by both the amount of conductive carbon which is admixed in the ink fluid, as well as the physical dimension of the resulting trace. By varying the carbon content, as well as the deposition (depth) of the ink, and the width of the resulting trace, suitable resistive performance is achieved. By varying the combination of polymeric and acrylic materials and carbon, an Acheson ink can be configured to a particular temperature "trip" or "trigger" point. This trigger point is a characteristic sharp increase in resistance at a pre-defined temperature, as shown in FIG. 11, which triggers at 145-degrees Fahrenheit. This phenomenon is observable in many other PTC inks, but the Acheson material is a "non-self-heating" formulation, so there is no migration of the material's physical states, from adiabatic to non-adiabatic, as a consequence of temperature and current. Being non-heating, it is not necessary to power the material with significant amounts of current.

Performance Characteristics

As shown in FIG. 11, the behavioral characteristics of resistance-versus-temperature of the Acheson PTCR inks are illustrated. The thermistor configuration charted in FIG. 11 has a rectangular inked area measuring 2.5×5 inches, at a thickness of 0.0004 inches. Reference FIG. 5A as an illustration of the physical layout of the test thermistor (only one of the three segments 109 was created for the tests).

To calculate the resistive value of an area of the Acheson PTCR ink used to create the chart in FIG. 11, "Resistance (Ohms)" is the known resistive value of the ink, divided by the width (as a ratio of the length), multiplied by the length. Width is always the largest dimension of a rectangular printed area, and length is the shorter of the two dimensions. Thus, with an ink having a known resistive value of 2K Ohms, if Width=0.5 cm, and Length=0.1 cm, the calculated resistive value is 400 Ohms. To increase the resistive value of a printed area, without increasing the width and length, a second pass through the silkscreening press will increase the Ohm-value.

This footprint of ink coverage shown in FIG. 11 yielded a resistive value of 5K Ohms at 72 degrees Fahrenheit.

Conductors were painted onto a polyester substrate, using an Acheson silver-pigmented ink (Electrodag 6S-32). Two conductive traces (225a and 225b, for example in FIG. 5A) were created to contact the PTCR ink along its 5-inch widest edges. The thermally-resistive ink was applied to 0.03 mm thick polyester, and cured in a standard printing dryer. Once cured, the ink was "exercised" by heating it to the trigger-point temperature three times. This last process stabilizes the ink's resistive properties, so that it is more linear during the heating process. Acheson formulated the test ink to trigger at 145 degrees Fahrenheit.

The test was performed in an autoclave with a source of variable heat, and a small fan to create evenly distributed convection heating throughout the heat chamber. A calibrated digital probe thermometer was mounted to read the ambient air temperature approximately 10 mm above the thermistor's surface. A multimeter was attached to the silver-ink painted edge conductors, so that only the current from the multimeter was activating the resistive-conductive elements of the thermistor's ink.

The Acheson ink has many properties that are compatible with thermistor 100. In particular, the printed material can be trimmed to various resistive values with ordinary tools, such as a paper cutter. Multiple resistor values can also be created by applying conductive traces at various locations along a fully inked area.

Figure 5A:
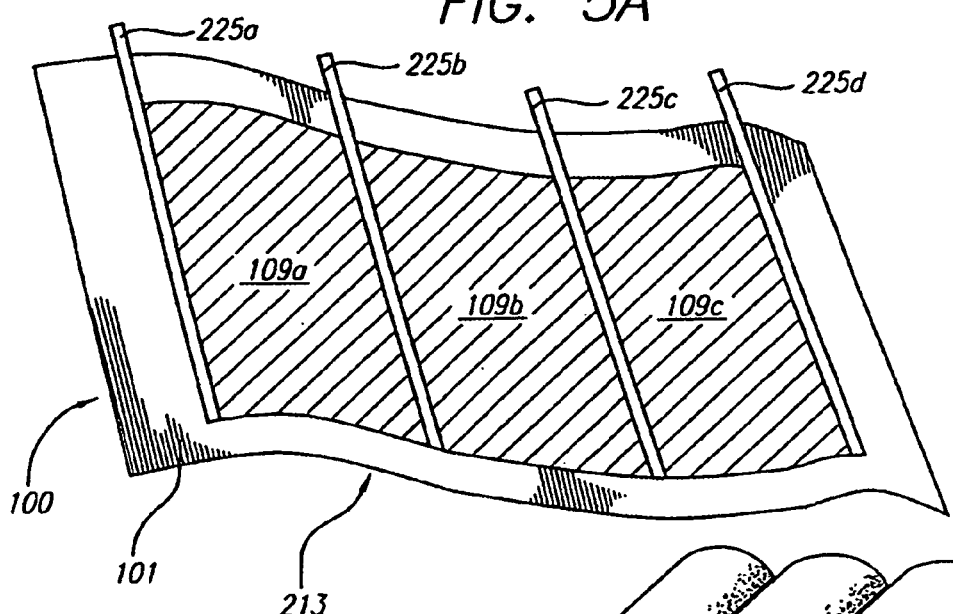
FIGS. 5A and 5B show a temperature-monitoring construct of the present invention that includes a printed thermistor layer applied as a continuous area of thermally-resistive ink that is segmented into three discrete thermistors by the application of shared conductors.
Figure 5B:
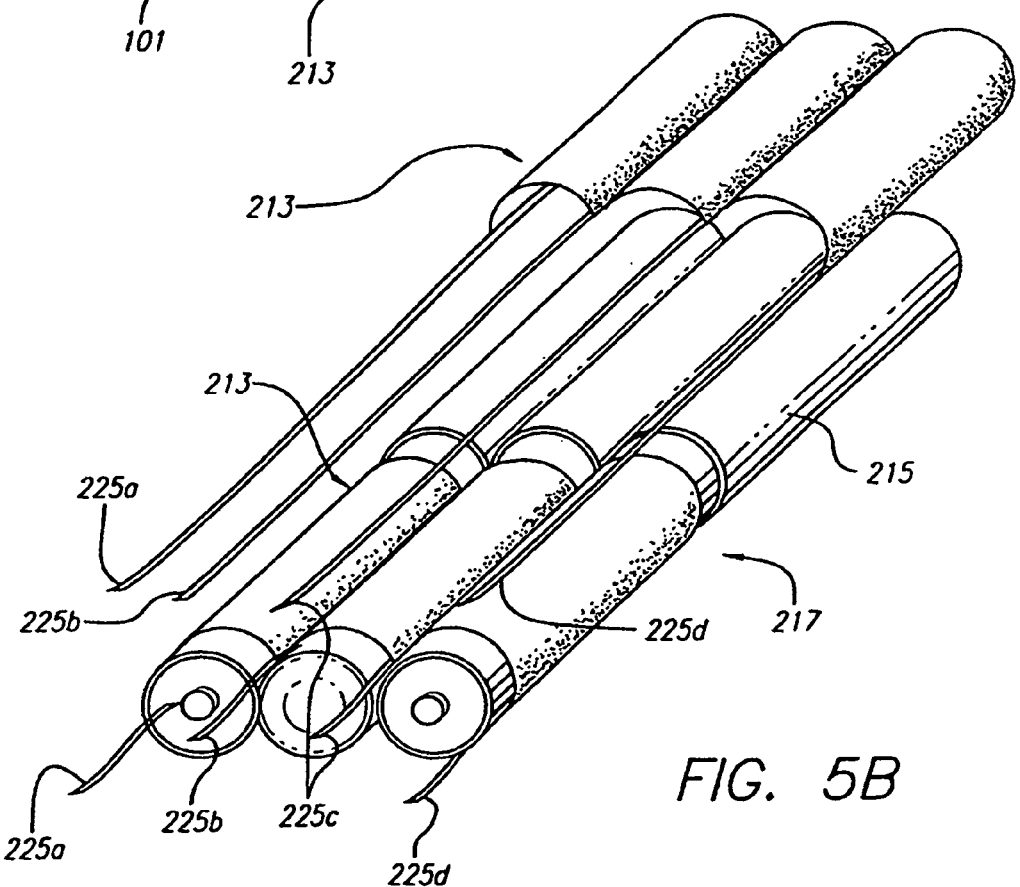

FIGS. 5A and 5B show thermistor 100 expressed as a continuous coating of ink applied to a flexible, non-conductive medium 101. Conductors 225a, 225b, 225c, and 225d are then applied at appropriate locations to alter the resistive value of each segment. These conductors can, for example, be narrow copper strips bonded in place with conductive epoxy cement, or using SMT PTF inks (from Acheson Colloids (Ontario, Calif.). Alternatively, these traces can be printed with silvered conductive inks. Thus, three equally-resistive segments 109a, 109b, and 109c are created with a simple process.

FIG. 1 Operation of Invention

Thermistor 100 is designed to cover a larger area than today's commercially available temperature sensors. As such, the size of insulator medium 101 matches the device being monitored for changes in temperature, for example a cell in a multi-celled battery pack. Resistive element 109 is capable of detecting changes in temperature as a function of the material's (metals or inks) ability to change resistive value as the ambient temperature of the device to which it is attached warms or cools.

For example, if a battery cell is being monitored, the measured resistance (expressed in Ohms) might be 5K Ohms at battery's ambient temperature of 72 degrees Fahrenheit. If the battery cell is then connected to a battery charger, the temperature of the cell will move upward, because of internal changes to the cell's chemistry that generate heat during the charge cycle. During charge, the temperature increases, and resistive element 109 of thermistor 100 also warms, since thermistor 100 is attached directly to the outer casing of the cell.

An external temperature-monitoring circuit (not shown) is coupled to thermistor. 100 in FIG. 1 by leads 105. Leads 105 are connected to the edges of resistive element 109. Thus, resistive element 109 is a variable resistor in a lead 105, such as a wire that is attached to a device that is monitoring changes in resistance on lead 105. The resistance detected on lead 105 increases from the original 5K Ohms in a predictable way (it is predictable because the behavior of resistive element 109 has been charted, as shown in FIG. 11, and perhaps stored in an external monitoring device's software).

Tracing the changes in resistance, software can translate different Ohm values detected on leads 105 as values relating to temperatures, so that 6K Ohms might, hypothetically, equate to 95 degrees Fahrenheit. Software can also have a stored temperature value that acts as an "alarm," so that once that pre-defined "Do Not Exceed" temperature is reached, the battery charger will be shut off. In today's "smart" batteries, the software that matches resistance values in thermistor 100 to corresponding temperatures is stored right in the battery pack.

There's usually a circuit, as well, that enables the battery to turn off its charger by sending a request to the attached charger. Thus, thermistor 100 is essential to the safe operation of the charging process, and temperature readings (as resistance-values) can be taken every ½0th of a second, if necessary. Temperature sensing is enough of a priority that there is circuitry in the battery to which a second thermistor can be attached. Typically, there is already one temperature sensor built right on a "smart" battery's circuit board. It is this second thermistor function that thermistor 100 performs. Monitoring temperature with a second thermistor is so vital a function that the "smart" battery specifications drafted by Intel (Santa Clara, Calif.) and nine other companies, reserves a dedicated contact on a five-contact connector, specifically and exclusively for temperature sensors like thermistor 100.

The Importance of Cell Temperature Monitoring

As resistive element 109 continues to warm, its resistive value (related to its temperature that is an expression of the cell to which it is attached) might reach the pre-set "alarm" value. This elevated temperature indicates a problem with the battery charging process. The safest thing to do is to shut off the charger—and as soon as possible. Since either the charger, or the battery circuit itself, is constantly monitoring the temperature of thermistor 100, it is important that resistive element 109 is accurately representing true values. Not only is accuracy important, but timely information about actual temperatures is also vitally important.

A temperature sensor like thermistor 100 can be extremely accurate, i.e, it can differentiate a minute change in temperature, but if it takes time for resistive element 109 to change its value, no amount of accuracy can compensate for a "lagging" response. The more lag time, the longer the battery problem goes uncorrected. If the delay before the real temperature of a cell is reported is long enough, a cell can go into "thermal runaway." This condition means that the internal temperature of the cell has exceeded a "point of no return." The cells internal heat is feeding itself and generating even more heat—the cell is now a glowing ember that is using its own chemicals to feed the impending fire. More oxygen is being generated, and oxygen makes excellent fuel for a fire or explosion. The longer it takes for thermistor 100 to catch up to the actual cell temperature, the higher the risk that the impending fire or explosion will not stop, even when the charging function is disabled.

To ensure that cell temperatures are reported immediately, thermistor 100 is configured to cover as much area on a battery cell as possible. Thermistor 100 can literally be wrapped around the entire cell, or can be in contact with just a portion of the cell surface for example, a thermistor] in contact with at least 10% of the cell's surface is sufficient for temperature monitoring. The fact that thermistor 100 is adapted to be placed directly on the cell is, in itself, something that significantly accelerates response times. The closer to the heat source, the faster the response, and the more accurate the temperature information. The thermistor 100 may be coupled to a cell by an adhesive 111, or by other means for chemical or mechanical bonding well known by those skilled in the art.

Technically, there is no reason why thermistor 100 cannot get even closer to the heat source. If non-conductive medium 101 is of a chemically impervious material, such as single-linked polyethylene, thermistor 100 can be immersed into the chemicals inside the battery cell. Laminating resistive element 109 between two layers of chemically non-reactive material requires a second layer 113 as shown in FIG. 1. Heat sealing the edges, or using adhesives that can withstand prolonged exposure to battery chemicals, creates a sealed construct that can be inserted into the battery cell. This is advisable for lead acid cells, such as car batteries for example, so that readings in the immediate vicinity of the battery plates can be made.

Printing Makes the Difference

The best mode of monitoring temperature in a multi-celled battery pack is to attach a thermistor 100 to each individual cell. However, with battery packs that can contain as many as ten cells, the cost of outfitting every cell must be considered. Thermistor 100, in one of its modalities, can be fabricated with resistive element 109 as a thermally-resistive ink. These inks behave just like metal thermistor elements. The big advantage in using inks is that they can be printed (silk-screened), which is a low-cost process that can produce hundreds of thousands of thermistors. Depending on the surface area to be covered by resistive ink 109, a high-speed silk-screen printing press can produce 50,000 thermistors per hour.

Fortunately, there are also a wide variety of low cost non-conductive insulator materials 101 for use as a medium. Any non-porous material that can pass through a silk-screening press is a candidate for a suitable insulator. Coated paper or card stocks, adhesive-backed labels, nylons, polyesters, and mylars, among others, all work well as mediums 101 or 113. To keep costs down, leads 105 can be coupled to resistive material 109 with staples, or metal-impregnated adhesives, for example.

Thermistor 100 offers significant advantages to an apparatus for monitoring temperature, that is the present invention. By locating thermistor 100 directly on the cell, and producing it inexpensively by using cost-effective printing processes, improved battery charging safety is achievable.

Multiple Cell Application

Figure 2:
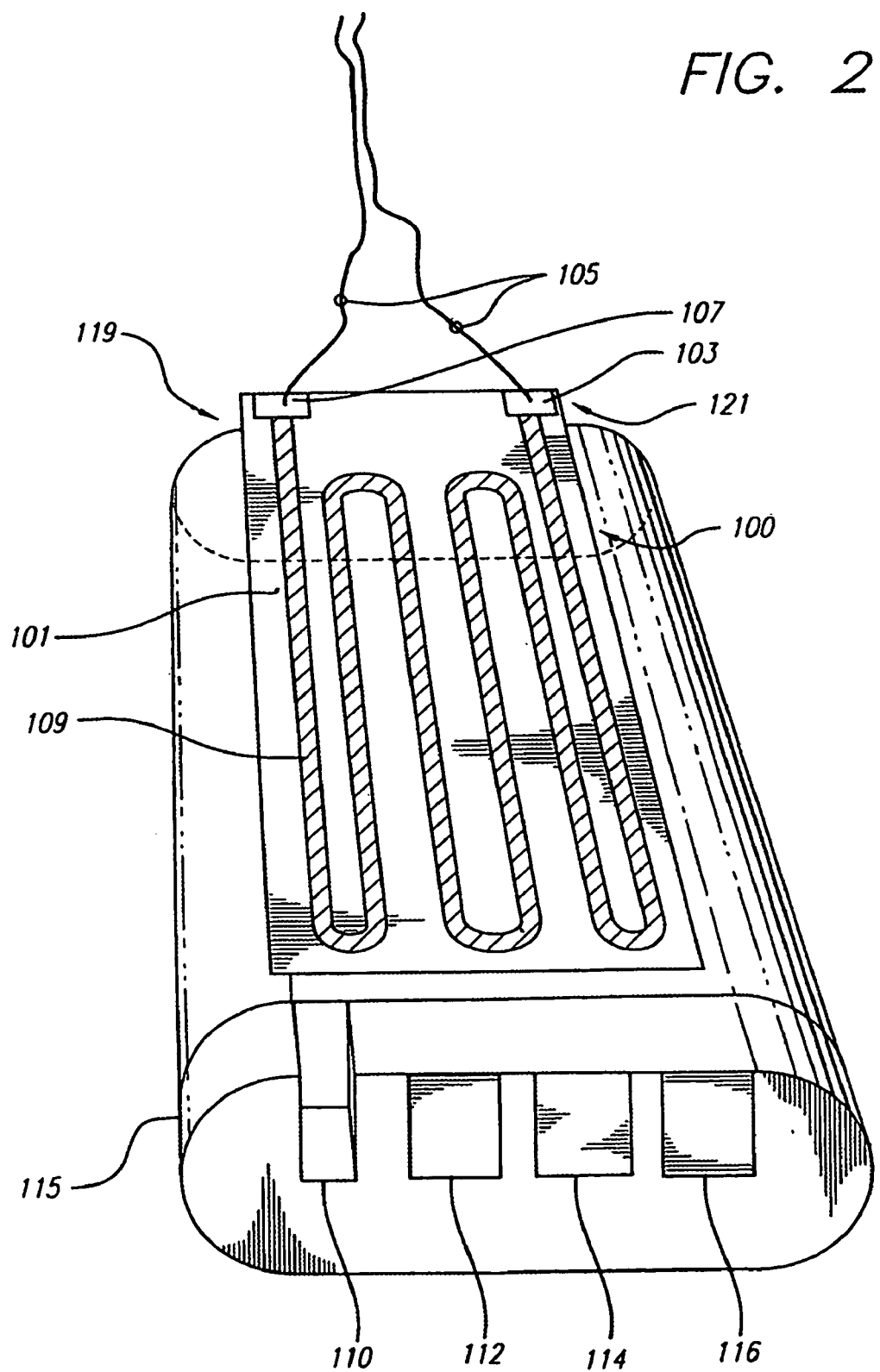
FIG. 2 shows the basic thermistor construct, of FIG. 1 applied to a generic removable battery pack as an "upgrade" to the already-manufactured rechargeable battery pack.

FIG. 2 shows thermistor 100 installed on a multi-celled battery housing 115. Battery housing 115 is shown as merely representational of most generic plastic battery enclosures. Use of thermistor 100 is not limited to multi-celled packs, since a thin, flexible thermistor 100 can be easily wrapped around each individual cell within the pack. Such an application is detailed in FIGS. 5A and 5B, and 7. This has significant advantages over thermistors which are embedded within the battery cluster, since a more immediate and direct reading of each cell enhances battery monitoring performance, as compared to a thermistor placed in the space adjacent to the cell. Because thermistor 100 can be built inexpensively, especially with ink and common paper materials, vinyls (labels, for example), or mylar/kapton, attaching a thermistor to each cell is practical.

Monitoring individual cell temperatures provides better safety measures than obtaining a relative reading inside the gap created by stacking individual cells next to each other. In multi-celled packs, individual cells respond differently to charging. A particular cell may have, over its numerous charge/discharge cycles, vented multiple times, resulting in changes to its impedance. Internal chemical reactions (such as stalactites or anode pitting) may have developed as a function of improper usage, for example memory in a NiCad or NiMH pack. A cell can malfunction for numerous chemical or mechanical reasons, and that individual cell will have a change in its resistance which will alter its normal charge curve.

Lithium-Ion (Li-Ion) battery chemistry is significant in the behavior such cells or packs exhibit when being charged. First, "cell matching" is essential to manufacturing a "balanced" pack, so each cell's resistive value is carefully monitored when assembling alike cells into a pack. Over time, and especially with cells using heavy metals or rare metals (e.g., cobalt), the cells become mismatched and no longer charge evenly. Today's "smart" batteries, with their internal temperature monitoring and sophisticated cycle-counts, are designed make data available to a processor-based host device, so that cell failure during charging can be detected early enough to avoid an explosion. Li-Ion packs, because they are voltage-charged and current-charged, can readily go into a dangerous failure mode. Temperature elevation is one of the best indicators and precursors of a battery pack about to explode.

A battery failure, as detectable by changes in temperature, is a very dramatic event, and readily identifiable. This is especially true if the particular battery pack has been monitored several times during its normal charge and discharge cycles. Software, which is reading the thermistor values over time, can be accurately tuned to thermistor 100's transmitted values, expressed as voltage or current, and a very practical look-up table can be built by the software in a very short period of time. An appropriate alarm voltage or current level can then be set, which is used to shut down the charging circuit should the battery pack reach that alarm temperature.

External Applications

FIG. 2 is shown as an external application because thermistor 100 can be retrofitted to an existing battery pack which was not manufactured with internal temperature monitoring. This allows the battery user to "upgrade" battery 115 with temperature telemetry provided by an easy-to-produce and inexpensive thermistor. The thermistor, when fabricated with inks on inexpensive paper, vinyls or mylar/kapton, can be viewed as disposable. One modality of thermistor 100 is to use a low-tack adhesive, so that thermistor 100 can be removable and reusable.

The thin wall design of most of these battery "packs" 115 makes them suitable for an externally-applied thermistor 100. While the wall-thickness of the battery enclosure makes it necessary to temperature-compensate thermistor 100's calibration, the advantage of being able to fabricate thermistor 100 in numerous footprint configurations affords a better overall detection system than one or two thermistors inside the battery pack housing. Calibration of thermistor 100 can be achieved easily. If a transmitter (analog-to-digital converter) is used between battery 115 and the host device (not shown, but connected to leads 105), it can be adjusted to deliver a suitable output voltage or current. Because the battery does not have to be in use, as is the case with an internally embedded thermistor, a very accurate reference temperature can be set in the transmitter. From that precise ambient surface temperature reading while the battery is totally passive, the voltage or current scale can then be calibrated when the battery is put into use.

Thus, thermistor 100 brings to previously "dumb" battery packs, a reasonable safety feature by providing an easy-to-install and inexpensive thermistor.

Applications of thermistor 100 are not limited to external applications. Battery pack manufacturers, for example, may find it efficient to attach thermistor 100 to the inside of a battery cavity or housing.

Internal Applications

The ultra-thin profile of thermistor 100, makes thermistor 100 practical as a label on individual cells. Current thin-film thermistors, as available from Minco (Minneapolis, MN), or Omega (Stamford, Conn.), are as thin as 0.010 inches (typical). Device 100 can be built as thin as 0.005 inches (typical), with ink and 0.5-mil mylar/kapton. Battery cell manufacturers can continue to build their cylindrical cells to the same outside diameter, and existing molds for battery-pack housings do not have to be re-manufactured to accommodate thermistor 100.

Since individual cells are typically labeled by the manufacturer for purposes of identification, thermistor 100 serves both as a product identifier (for example, a bar code can be printed on the outer surface or a mylar, paper or vinyl label, with thermistor 100 printed on the back of that printable surface, and a layer of adhesive to bond the label to the battery cell applied over thermistor 100's ink trace). Thus, FIG. 2 can be viewed as representational of an individual cell, as well as a group or pack of cells.

FIGS. 5A, 5B, and 7 more clearly show the implementation of thermistor 100 on individual cells within a battery pack.

Extensible Tab

Thermistor 100 can be mounted to a battery or battery-pack housing 115 (FIG. 4), so that some portion of it extends. This allows a tab 119 to be folded downward, out of the way, thus providing extra clearance along the outside for the battery pack to fit in its compartment. The style of battery 115 represented here, which is loosely based on the Duracell BR-15 form factor, inserts lengthwise into a molded cavity (not shown), so the overall clearance for wire leads 105 is achieved by folding extension tab 119 downward. An adhesive is applied to the bottom side of tab 119, to make contact with the battery housing 115. Tab 119 will adhere to the back end of battery housing 115 when folded downward. As shown in FIG. 2, the stratum 101 is facing outward, with resistive element 109 on its underside, as the "middle" layer, with an adhesive bonding this construct to battery housing 115.

If ink is used for resistive element 109 (FIG. 4), there is no need to sandwich resistive element 109 between two non-conductive strata 120 and 121. Additives (usually rubber-based agents) can be admixed into the ink which make it flexible, thus eliminating the risk of damaging the resistive element 109 when tab 119 is folded downward. No second-layer of material like 113 (FIG. 1) is necessary to preserve the integrity of resistive element 109, providing that tab 119 is folded only once. Repeated flexing of tab 119 can result in cracking of the resistive used for resistive element ink 109. Another benefit of this "bare" resistor design is that thermally-conductive adhesives (for example, Omega's (Stamford, Conn.) "Omegabond" and "Thermcoat" cements) can be used to enhance thermistor 100's sensitivity. These adhesives also form a non-conductive barrier.

Figure 3:
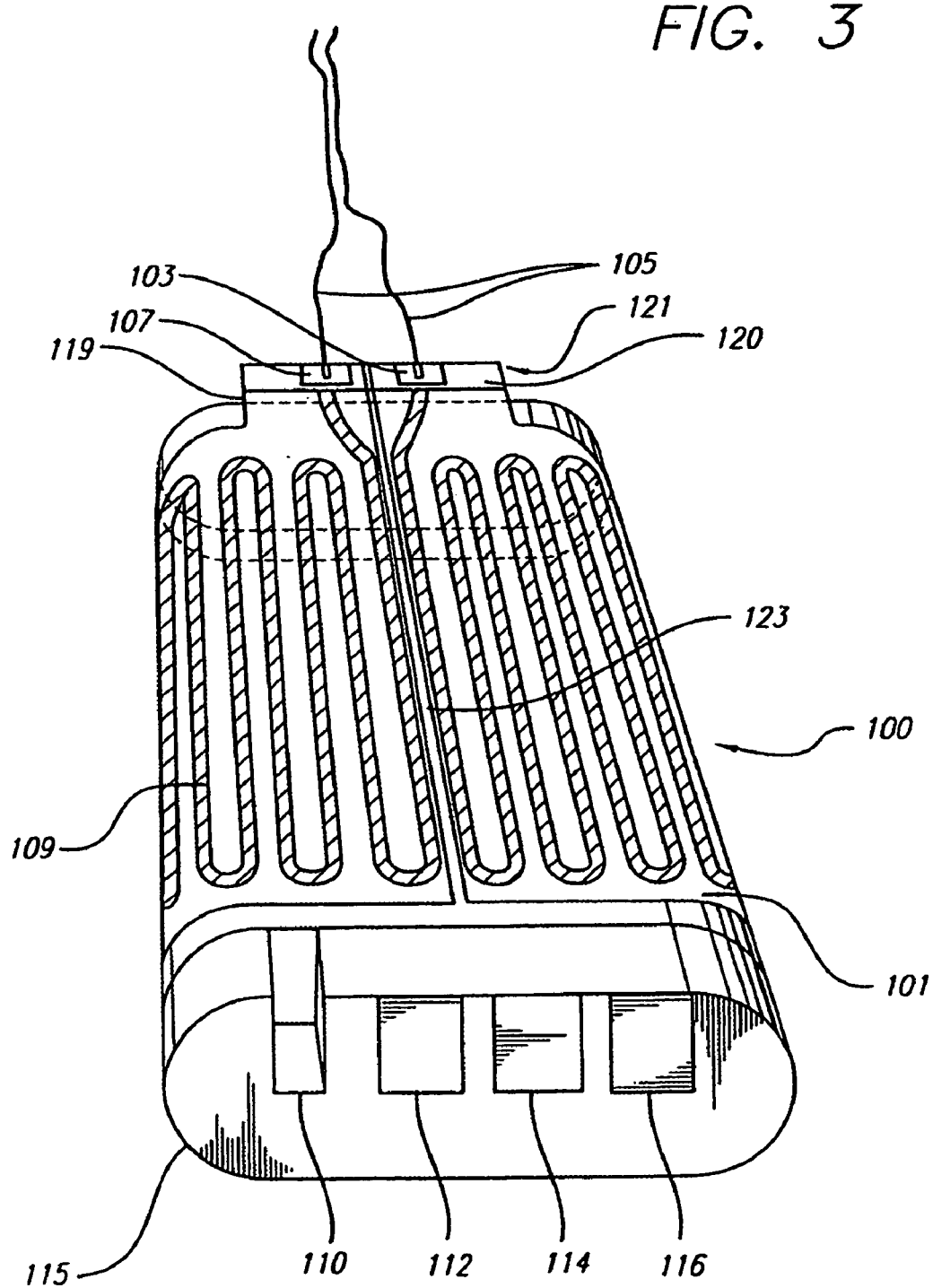
FIG. 3 shows a modality of the flexible thermistor sub-assembly of the present invention wrapped around a generic removable battery pack, with an extended connector tab to which are hardwired conductors.

Shown in FIG. 3, is an expanded thermistor 100 according to the present invention, which totally surrounds battery 115. Battery 115 is shown here to reveal the two ends of expanded thermistor 100, as it is wrapped around the outside of the battery housing, and gap 123 indicates the edges of expanded thermistor 100. Tab 119 is shown terminating in a reinforced stiffener 120. Stiffener 120 adds strength and rigidity to tab 119, and also ties together the two lengthwise sections of thermistor 100. Lead wires 105 can be eliminated, and alligator clips or other detachable probes can be used on conductive pads 103 and 107.

Figure 4:
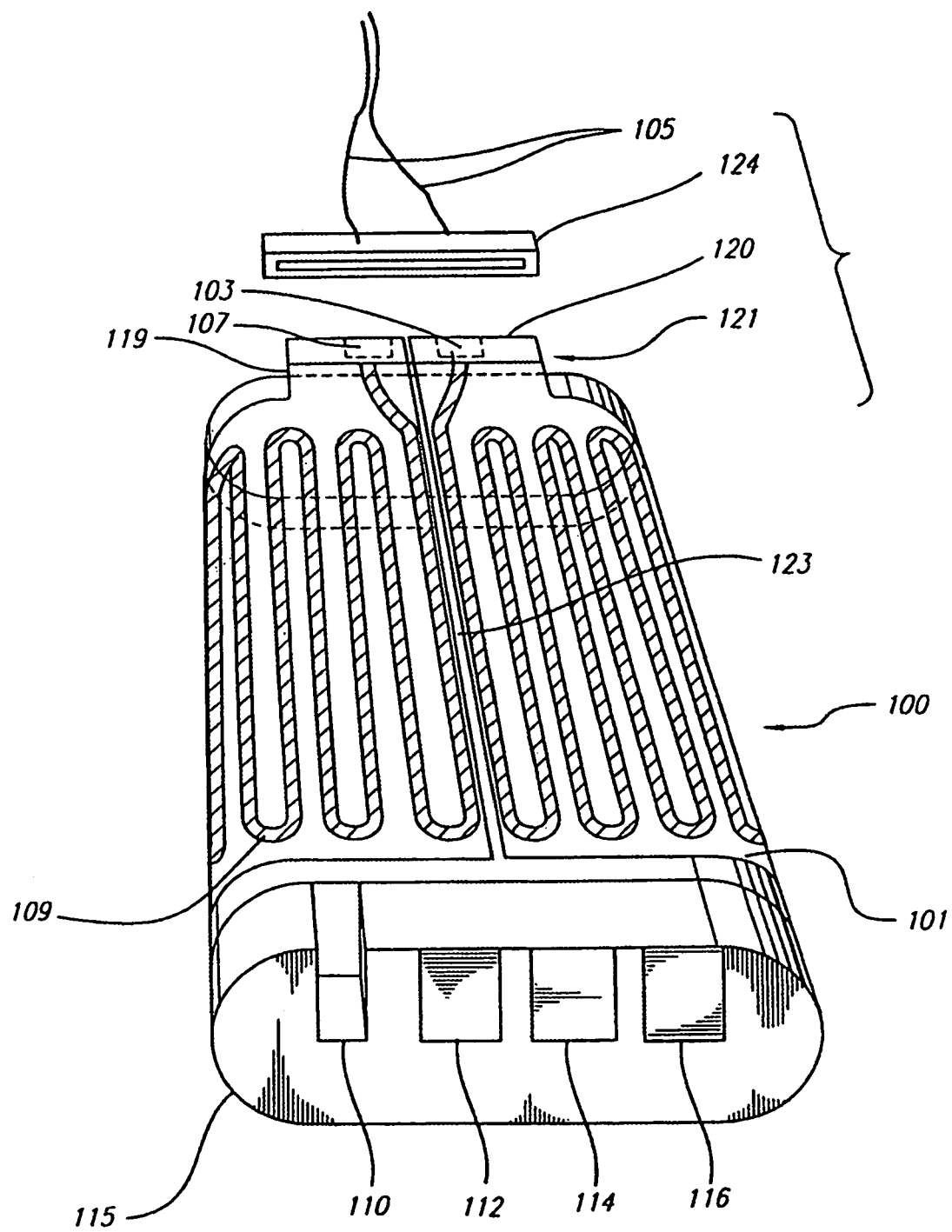
FIG. 4 shows a flexible thermistor construct of the present invention, having a simple two-wire data interface, attached to a battery pack, with a removable connector that attaches to an extension tab on the thermistor.

As shown in FIG. 4, tab 119 may be being used as an insertable male plug for a removable connector 124. This modality is detailed in FIGS. 9 and 10. Stiffener strip 120 can be thick enough to enable end-tab 119 to act as a male connector. Removable connector 124, or an equivalent, can be used as a connector on a test-probe lead, or to facilitate changing removable battery packs. Expanded thermistor 100, if fabricated from paper-stock and ink, is not so rugged that normal wear and tear from inserting and removing the battery pack in the host device will not eventually compromise the integrity of the device. By making a removable connector 124, the more expensive wires 105 (as typified in FIGS. 1 and 2) are preserved when externally-applied expanded thermistor 100 is discarded. Also, user attachment of thermistor 100 to a battery housing 115 is facilitated, and the host device into which battery pack 115 is inserted (not shown) need not have wiring dangling from its battery compartment.

Because resistive element 109, especially if comprised of conductive ink, is very thin, the outer surface of expanded thermistor 100 is so smooth that it can be imprinted with information. In the iterations shown in FIGS. 3 and 4, virtually the entire battery can be imprinted with advertising or product information. The smaller form factor of thermistor 100 in FIGS. 1 and 2 also afford good advertising or labeling opportunities.

Expanded thermistor 100's flexibility and thin cross-section makes it viable as an overall surface thermal detection device for both external and internal uses. These larger footprints can be handled economically with carbon-based conductive ink silk-screened on label stock, coated paper, or polyester for example, or other low-cost media 101.

As shown in FIGS. 5A and 5B, thermistor 100 may be a multi-segmented panel 213 that attaches to more than one contiguous cell 215 within a battery pack (not shown). This modality affords several benefits over individual thermistor 100s applied to each cell. By employing one contiguous section of non-conductive medium 101, additional cutting and trimming of materials is eliminated. In manufacture, larger pieces are easier to handle. The screens required to silkscreen a thermally-resistive ink onto insulator 101 are simplified, as well.

This configuration, not limited to the three discrete but connected panels 109a, 109b and 109c shown, can also be effective as a panel 213 attached to the external housing or enclosure of a multi-celled battery pack. As external panel 213, each discrete segment 109a, 109b, and 109c monitor a zone or area of a battery pack housing, wherein each zone correlates to groups of cells inside the battery enclosure. The response rate of an external thermistor panel 213 would not achieve detection of cell heat as rapidly as an internal modality. However, the external mode does make for an efficient and cost effective thermistor 100 for battery packs that are already in use.

A major advantage of using multi-segmented panel 213 is that two conductors are eliminated (conductors, generically, are represented in FIGS. 5A and 5B as 225a–d). In the crowded confines of a battery housing (not shown), open spaces for large number of wires are rare. If three discrete thermistor 10s were to be used on one column of three adjacent cells 215 as shown in FIG. 5B, six separate conductors (two for each thermistor 109a, 109b, and 109c) are required. By using shared conductors 225b and 225c, two conductors are eliminated. In six-cell pack 217, four conductors are eliminated.

Trading Space-Savings For Circuitry

Eliminating conductors can only be achieved by muxing the remaining conductors 225a–225d. An N-signal switch, or equivalent, is required to activate each segment 109a, 109b, or 109c of segmented thermistor 213. To read segment 109a, for example, conductors 225a and 225b are accessed by a data acquisition device (not shown). For example, current flows from conductor 225a, across resistive ink area 109a, to the opposite conductor 225b. Once that resistive value has been acquired by a remote device, conductor 225b is left active, and conductor 225a is switched off, and replaced by conductor 225c. Thus configured, resistance across segment 109b is read. The same process continues for reading segment 109c, as conductor 225c stays active, while the N-signal switch deactivates conductor 225b and switches to conductor 225d.

This switching process, while elemental, does add a small incremental cost to the "smart" circuit embedded in a battery pack. This cost is offset by the savings associated with fewer conductors, as well as savings in the cost of adhesives to attach the extra two conductors. Less materials handling, and ease of installing fewer wires into the battery enclosure indicate that the trade-off in adding a switch is justifiable. If, as in cell configuration 217, there are several columns of cells, the savings are even more pronounced, for one N-signal switch can be used to control conductors for two thermistor panels 213.

Assembly Considerations

The process of fabricating thermistor panel 213 follows standard silk-screening and flex-board techniques. Note that inked panels 109a, 109b and 109c are one contiguous resistive ink application. Only conductors 225b and 225c determine segmentation, and these conductors are applied directly over the pre-printed ink surface. When laying out panel 213's segments, all three are of the same size. Any variants among the segments will result in mismatched baseline resistance readings. The need to calibrate each segment is avoided by ensuring that the spacing between conductors 225a, 225b, 225c, and 225d is identical.

Conductors 225a–d can be any thin-cross-section conductive material. Strips of copper foil have advantages. Circuit board repair tape, such as GC Tech (Rockford, Ill.) "Pure Copper Circuit Tape #22–509, or equivalent with non-conductive adhesive, has desirable properties in this application. The adhesive side of the tape is left face-up, and the exposed copper side is bonded with a silver-pigmented epoxy cement, or an equivalent such as Acheson Colloids' SMT PTF inks, directly onto conductive ink areas 109a, 109b, and 109c. The outward-facing adhesive on the 3-M tape is used to secure segmented panel 213 to cells 215. The tape's adhesive also secures the loose leads of conductors 225a–d to cell 215's casings.

Design and Fabrication Notes

Most cell casings are metal, so care must be taken to not short any part of segmented panel 213 or its conductors 225a–d. Dielectric materials such as printers' varnishes or acrylic overcoatings, or equivalents, are acceptable to protect resistive inked areas 109a–c. Conductors 225a–d can be held in place with insulating double-sided tapes, or equivalents. Panel 213 may be adhered to cells 215's surfaces, to avoid abrasion or any movement. Battery manufacturers often sleeve cells with heat-shrink plastic. These cells are preferred to ensure proper electrical insulation between the cell and panel 213.

It is not recommended that panel 213 be mounted with the resistive ink surfaces facing outward. Cells move within even the closest-fitting battery enclosure, and resistive-ink scratches readily, even with protective over-coatings. Even minor blemishes in the inked surfaces may deteriorate performance.

If resistive inks from Acheson are used to create any thermistor 100 devices, it is recommended that the material be heat-cured. Standard printing dryers are suitable for curing.

Avoid handling freshly-inked materials. Oils from finger prints may alter the resistive characteristics of the inks. Micro-scratches, from sliding sheets of printed materials over each other may also alter the electrical and thermal characteristics of inked areas.

Finally, the Acheson inks should be cycled 2–3 times to full operating temperature. If manufacturing constraints prohibit this stabilization process, accurate temperature readings will optimize after several cycles during normal operation of the thermistor.

Figure 6:
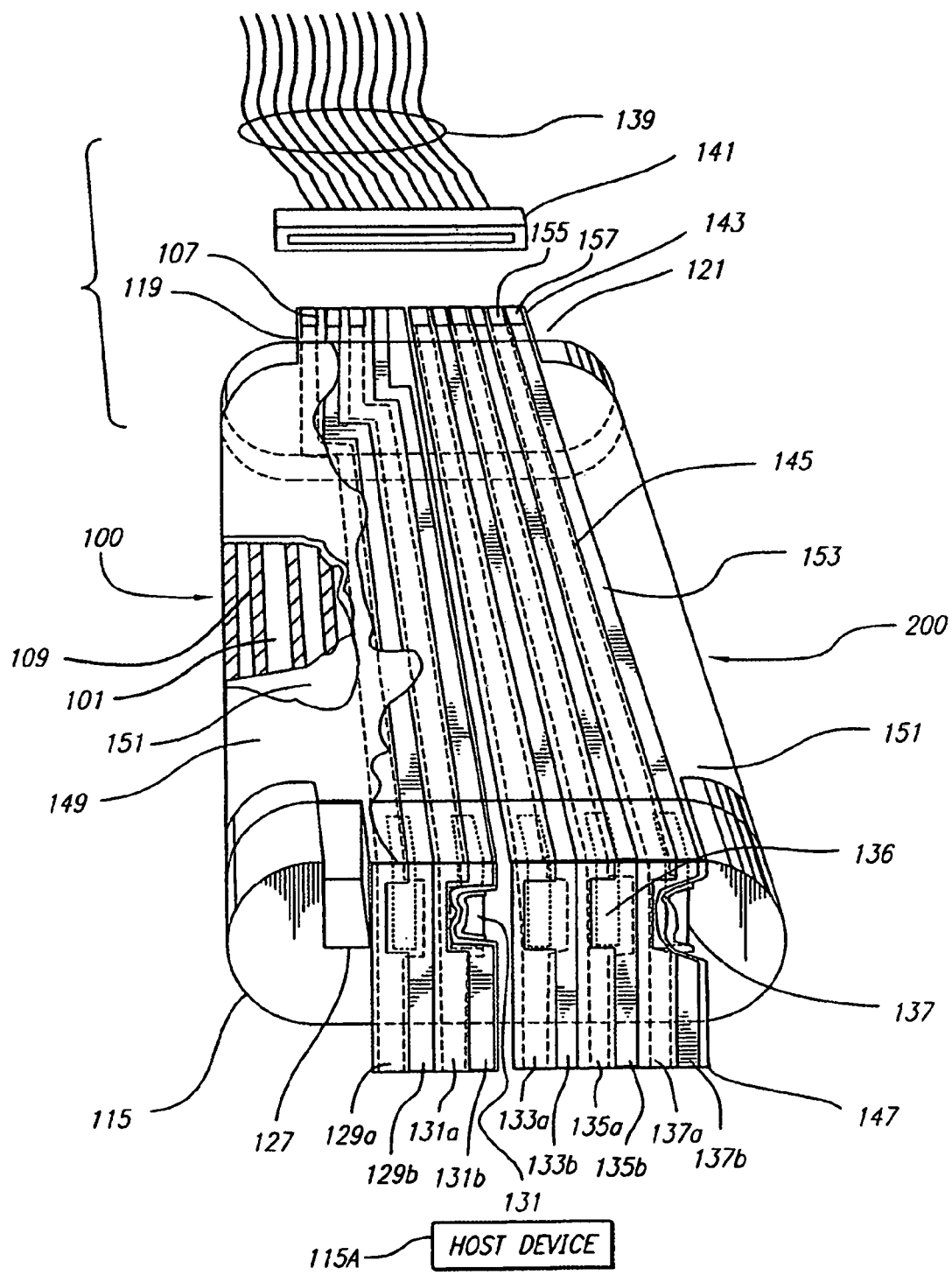
FIG. 6. shows the elements in FIGS. 1–4, integrated into a multi-layered construct of data and power conductors separated by insulators, to form an apparatus for monitoring temperature.

In reference to FIG. 6, a resistive element 109, which is part of expanded thermistor 100 previously shown in FIGS. 3 and 4, is shown in a partial cutaway section. The covering layers 151 and 149 can also be seen. Over thermistor 100 has been affixed a multi-layer construct 200 which serves as an integrated data and electrical connector interface to battery contacts. Battery contacts 131 and 137 are visible here in cutaways, while three other contacts 129, 133, and 135 are more fully visible in FIG. 8. As represented here, these contacts are indeterminate in their functions. While the placement and configuration of contacts 129, 131, 133, 135, 137 are representational of a smart" battery pack, as expressed by Duracell (Bethell, Conn.), the number of contacts, their location, spacing or configuration is not limited. They are illustrated as multiple contact points to show the adaptability of connector 200, but there need be only one pair of conductors for connector 200 to properly function. The function of each contact 129, 131, 133, 135, and 137 can be power, or data. A locator key 127 is shown, but it is only representational.

Connector construct 200 can exist and function independent of thermistor 100, but the preferred mode is to incorporate thermistor 100 as part of connector 200. Connector 200 is not limited to being attached to thermistor 100 in any way, nor to its location within connector 200.

For example, connector 200's data or power conductors can be located on the exterior of battery pack 115, while thermistor 100 (in any of the modalities described herein) can be internal to battery 115. Or both thermistor 100 and connector construct 200 can be internal (see FIG. 7), or connector 200's conductors 145 and 153 can be internal to battery 115, while thermistor 100 is attached externally to battery 115. Other variants and combinations are allowed, as best suits the available space within battery 115, the exterior size and shape of a battery housing, location of contacts, whether battery 155 is already manufactured, and other similar variables.

Conductor strips 145 and 153 can be comprised of conductive materials, for example copper traces on an insulator film 151, such as mylar or kapton. Conductors 145 and 153 can also be, as is resistive element 109, of conductive ink. Given the current-carrying limitations of conductive inks, as compared to metals like copper, a hybrid of connector construct 200, comprise of both conductive inks and metals, is indicated. Thus, if conductors 145 and 153 are carrying power at contact 137, copper or tin, for example, would be more suitable than conductive inks. Battery pack 115, for example if used in a laptop computer, could deliver 2–3 amps at a connector 137. In low-current-carrying implementations, such as data, conductive inks can provide efficiencies of manufacture or cost. Both materials are typically available as traditional flex circuit design and fabrication, so such a hybrid connector construct 200 is implementable.

Figure 9:
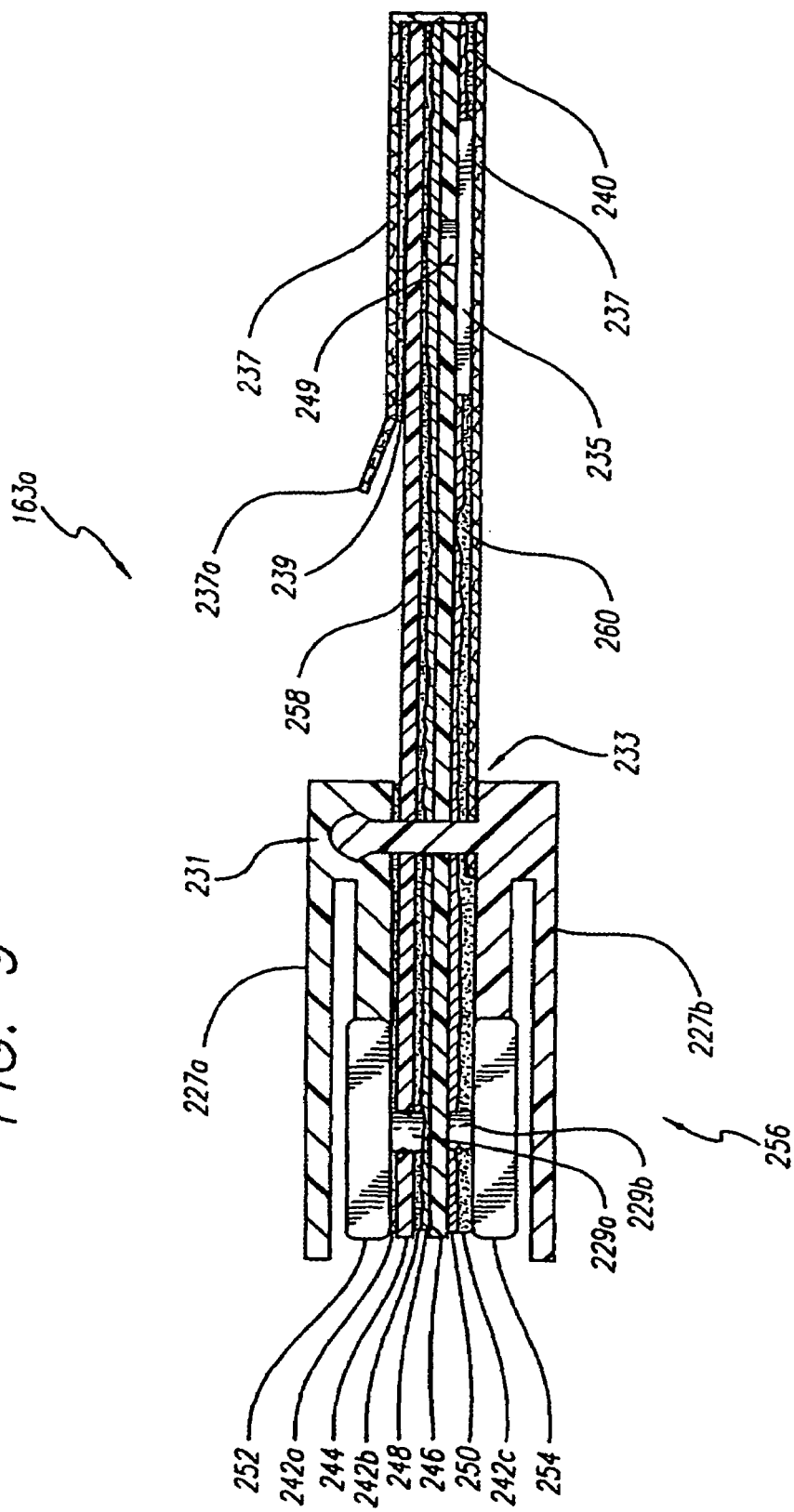
FIG. 9 shows a cross-sectional side view of one of the removable connector tabs in FIG. 8.
Figure 10:
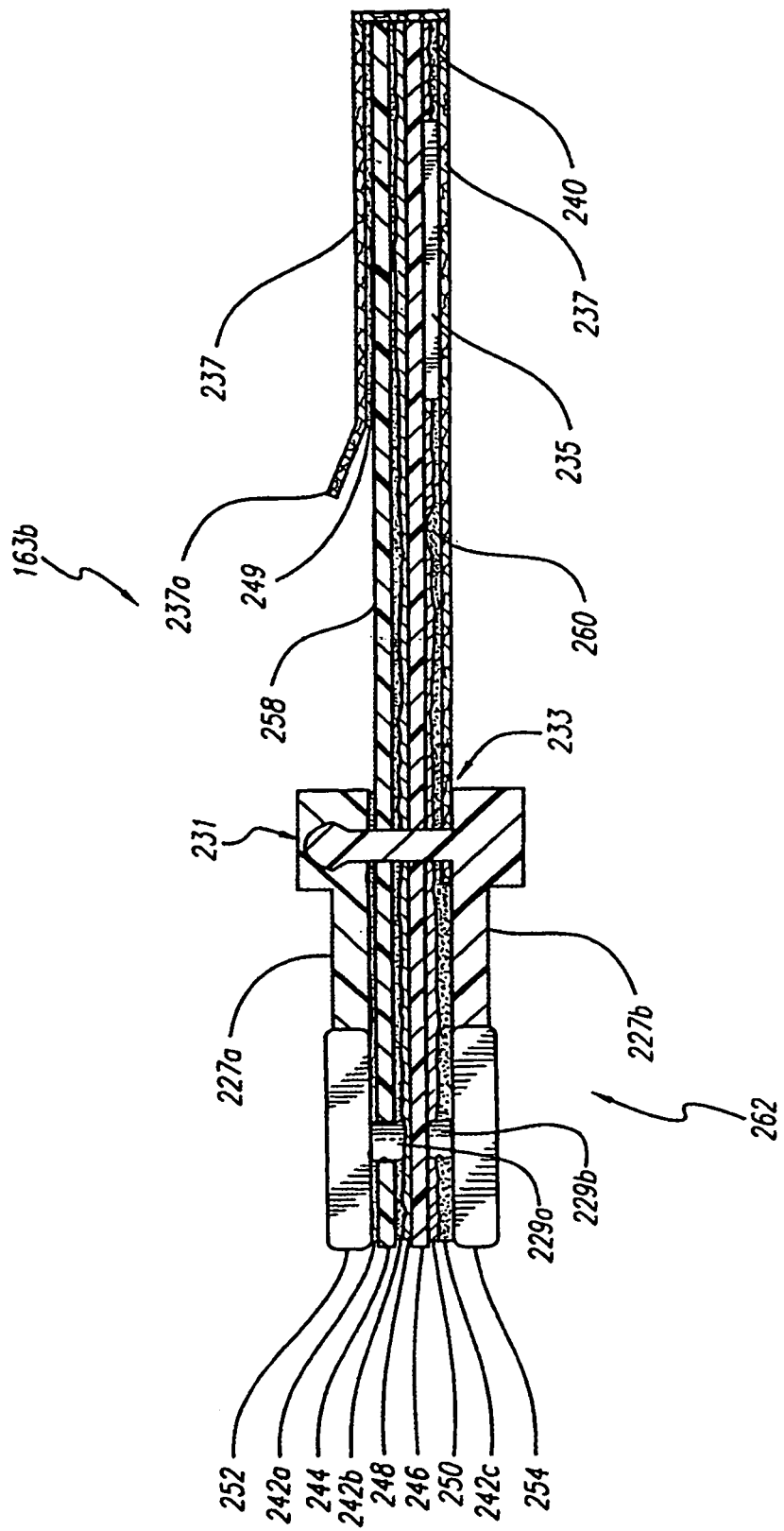
FIG. 10 shows a cross-sectional view of the various interrelated layers of a removable connector tab in FIG. 8.

Outer layer of thermistor 100 has, as the next layer above it, one or more conductor traces 145. There are ten conductive traces shown in FIG. 6, but any number (one or more) can be laid on the insulator layers 101, 151 or 149. These can be a mix of power and data conductors, if necessary. Conductive traces 145 or 153 can be laminated on the bottom surface of a lower insulator layer, such as conductor trace 145 laminated to the top surface of insulator 101. A conductive trace 145 or 153 can also be attached to the bottom of a layer 151 above it. FIGS. 9 and 10 show a cross-section of a representative layer configuration. Insulator layer 179 shown in FIG. 9 has the conductive traces 165 and 161 laminated to both sides, which would be very efficient if etched copper traces on kapton or mylar were being employed, since this two-sided lay-up is available as a stock item.

A layer of conductors 145 and 153 is sandwiched between insulator film layers 151 and 149. There are five such conductor 145s and 153s shown here. There will always be two conductors, here 145 and 153, for each contact on a battery housing 115. They may all be adjacent to each other within a two insulator sandwich (for example between layers 101 and 151, or between layers 151 and 149), or they can be staggered between various layers of insulators. There are no maximum number of either conductive traces 145 and 153, or insulator film layers 101, 151, and 149.

Y-Connector

By having an insulator layer 149 between the two groups of conductive traces 145 and 153, connector 200 can act as a Y-connector to any device (not shown) attached to cable 139, via connectors 141 and 143. Conductive trace 145 is on one side of insulator layer 151 (below it as shown here), while each conductive trace 153 is above layer 151. Thus, conductive trace 145 and its counterparts, are making contact with battery contacts 131 and 137 on the forward facing end of the battery housing 115, while conductive trace 153 and its counterparts are on the opposite side of insulator layer 151, and not covered by layer 149 at the location of battery contacts 131 and 137. Conductive traces 153 are thus exposed to whatever opposing connector (for example, a host device not shown) would have that matches battery contacts 131 and 137.

Thus, power (or data) from battery contact 137 flows along conductive trace 145, to its remote contact pad 155 on tab 119 at the opposite end of a battery 115. Power or data from a device to which the battery is normally attached (not shown here) would make contact with conductive trace 145 at the same location as battery contact 137, but on the outside of multi-layered connector 200, where conductor 153 is exposed. Overlapping conductive tabs 136 on both conductor 145 and 153 allow opposing attachable devices, for example a battery 115 and a host device (not shown) into which battery 115 is inserted, to correctly align. Since conductive tabs 136 are aligned to each other by overlapping the location of contact 137, and insulated from each other by layer 151, each conductor of the pair formed by 145 and 153 serves only battery 115, or its mating counterpart, such as a host device.

The power (or data) from the host device (not shown) travels along conductor 153 to contact pad 157. When connector 141 is attached to tab 19, the two conductive paths created by 145 and 153 are separately available to a third device not shown), via cable 139. Thus, this third device (not shown) can be a combination battery charger and power supply, for example. The charger circuit in an attached combination charger/power supply can charge battery 115 (using conductive trace 145 to battery contact 137), while the power supply circuit in an attached combination charger/power supply separately and simultaneously delivers power to a host device (not shown) along conductive trace 153, which makes contact with the corresponding contact (not shown) in a host device that corresponds to battery contact 137.

Discrete Thermistor Contacts

Thermistor 100's resistive element 109 exits on tab 119 also, but these contact pads (shown more clearly as pads 103 and 107 in FIGS. 1–4) are on the underside of tab 119. Contact pads 103 and 107 in FIGS. 1–4, as equivalents expressed here in FIG. 6, are directly below the row of ten contact points 155 and 157, et al. Thermistor 100 occupies two of the twelve conductor wires in cable 139, of which one can be a shared ground, depending on the design of the temperature sensing circuit (not shown). Thermistor 100's contact pads 155, 157, et al in FIG. 6 are kept separate from the ten power/data lines in connector 143, which has independent upper and lower contacts.

This is only to simplify fabrication, since keeping the termination points of resistive element 109 on the same plane of medium 101 avoids having to resort to vias or other mechanical transitions to other layers on tab 119. This also helps to minimize the spacing and final width of connector 143. Connector 143 can be further minimized in width by using pins, instead of contact pads 155 and 157 to transfer power or data. Some of contact pads 155 or 157 can be routed below insulator layer 151 on tab 119, as needed, to further minimize width.

Receptacle 141 in FIG. 6 can also be a jumpered terminating block. FIG. 7 shows connector 209 which, using cross-wiring 211, reconnects discrete conductors 145 and 153 by electrically jumpering contact pads 155 and 157 together. By jumpering these contacts, the conductive paths between the battery and its host device are re-established. The presence of thermistor 100 and connector matrix 200 in the battery/host interface is electrically removed when connector 141 is wired as a jumpered terminal block. Thus, the simple process of disconnecting connector 141 and replacing it with a jumpered connector allows the battery and host device to operate as if thermistor 100 and connector construct 141 were not present.

If battery 115 is a "smart" device, as defined in the System Management Bus (SMBus) specifications (available on the internet at www.sbs-forum.org), it will have it's own internal thermistor. This internal thermistor (not shown) is addressable at one of the contacts 129, 131, 133, 135, 137 shown in FIG. 4. Thermistor 100, whether as an internal second temperature sensor inside battery 115, or applied externally as in FIG. 6, provides additional battery-safety protection against overheating and possible cell explosion.

As shown in FIG. 7, thermistor 100, is in the form of a multi-segmented panel 213, attached to a six-cell cluster 217 in battery pack 115. Two panel 213s are used, each monitoring a group of three cells 215. Conductors from each panel 213 have been eliminated for clarity (reference FIG. 5A and FIG. 5B for conductor details). Also not shown herein is a "smart" battery circuit, used to monitor cell temperature, current and voltage. Typically, such a circuit would be installed at connector 201, and powerlines 129a and 137a would interface with the "smart" circuit, then continue to connector 201. The "T" (Temperature), "D" (Data), and "C" (Clock) data-lines would also interface with a "smart" circuit at connector 201. Connector 201 is the data and power interface to a host device, for example a laptop computer.

Connector 200, as described in FIGS. 6 and 8, is represented here with internal conductors 129a, 131a, 133a, 135a, and 137a (numbering herein corresponds to conductors in FIG. 6 for clarity). Connectors 199a, and 199b in FIG. 7 correspond to the row of connectors on extended tab 143 in FIG. 6. Connectors 199a and 199b herein serve the purpose of segregating wires/conductors into two branches of a Y-connector. With connectors 199a and 199b in FIG. 7 configured with conductors corresponding to 129a and b, 131a and b, 133a and b, 135a and b, as well as 137a and b in FIG. 6, this modality of thermistor 100 and connector construct 200 creates individual control and monitoring of cell group 217 as a function separate and apart from a host device (not shown).

Thus configured, battery pack charging functions can be monitored and controlled by an external device, for example a combination charger and power supply (indicated in FIG. 7). Connector 203 is used for such a combination charger power supply, delivering battery charging functions to connector 199a. Connector 199b on battery pack 115 accepts power from the right five pins of connector 203. Power is them carried on lines 129a and 137a to connector 201, which attaches to a host device (not shown).

Thermistor 100, as two multi-segmented panels 213, is accessible from both a host device (not shown) or a data-enabled charger/power supply (not shown). The "T" (Temperature) contacts on connectors 199a, 199b and 201 each can access thermistor 100's temperature readings. The "smart" circuit (not shown) near connector 201 makes this available on data line 131a. Data line 131 loops to the "T" contact on all three connectors (201, 199a and 199b) so that any device connected to battery pack 115 can access temperature data.

Connector Location

Connectors 199a and 199b (FIG. 7) are recessed into battery enclosure 115. This end of battery pack 115 is accessible in the battery bay of the host device (not shown), so that any of connectors 203, 205a and 205b, or 209 can be plugged in without removing the battery. Because the Y-connector created as described above services both the battery cells 217 and the host device (not shown) simultaneously, this connector, wiring configuration and thermistor that is the device of the invention, replaces the traditional power port found on electronic devices, of which a laptop computer is an example. Functions of battery charging, powering the host device, and monitoring "smart" battery functions can still be normally. Or, in the alternative, such functions can be reallocated to various external devices, such as combined chargers/power supplies, or monitoring equipment attached to connectors 199a and 199b.

For example, connector 205a can be used to charge cells 217 via connector 199a, which is wired along powerlines 129e, and 137e, directly to cells 215. Temperature from thermistor panels 213 can be read, as can the "smart" battery's clock and data functions, via the T. D, and C contacts on connector 199a, since these are tied into data lines 131a, 133a, and 135a, using conductors 135e, 133e, and 129e. Connector 205a should be keyed, in order to avoid risks of reversed polarity.

An external power supply can use connector 205b (FIG. 7) to power the host device. Power from connector 205b to the (+) and (−) contacts of connector 199b, then along powerlines 129a and 137a to the (+) and (−) contacts on connector 201, and finally to the attached host device. Battery pack 115, incorporating this wiring, connector and thermistor combination, need not be removable, since all battery functions normally associated with remote external battery charging stations are now available to battery pack 115 when it is still in the host device. One laptop, the Mitsubishi Pedion, is sold with a non-removable battery pack, so this concept has been validated in the marketplace. In a non-removable battery configuration, connector 201 would not exist, and conductors 129a, 131a, 133a, 135a, and 137a would be hardwired to the host device.

Connector 209 is a simple jumper. Wiring 211 is shown herein diagrammatically, so that the traces across paired pins can be seen. Jumper connector 209, when inserted into connectors 199a and 199b, returns the battery to a mode as if none of the connector and wiring modifications heretofore discussed for FIG. 7 had been made. Battery cells now power the host device, via jumper 209's cross-wired contacts, as would be with any non-modified battery.

Design and Fabrication Notes

FIG. 7 shows battery pack 115 as representational of a Duracell BR-15 configuration. There are hundreds of battery enclosure designs, shapes and sizes. Therefore, the location of connectors 199a and 199b, while appropriate for battery pack 115 as shown here, may vary considerably for other configurations. The two connectors should, where practical be installed adjacent to each other. This is important if a connector 203, or equivalent will be used. Connectors 199a and 199b can be mounted above and below each other, or in other configurations to suit the battery pack 115 design. Connectors 199a and 199b should be, where practical, be accessible without removing the battery pack. There are battery packs that are not as accessible as the one shown in FIG. 7. Use an "extension cord," for example a flat ribbon cable, to route from an inaccessible battery pack to a convenient location on the host device where connectors 119a and 199b can be mounted.

If a battery pack 115 is accessible within its host device via a hinged or removable access door, consider mounting the equivalent of jumper connector 209 so that it will attach to connectors 199a and 199b whenever the access door is closed. Thus, when no external devices are attached, all functions are returned to a direct connection between the battery pack and its host device.

Variations in the way thermistors 213 (FIG. 7) are attached to cells 215, routing and location of internal wiring 129a, 131a, 133a, 135a, and 137a should be planned around available wiring paths in the battery pack. The number and functions of contacts at connector 201 may vary, so that connectors 199a and 199b may require different wiring.

As shown in FIG. 8, a flexible, multi-conductor connector construct 200 incorporates thermistor 100. The entire device 400 is illustrated here as a modified or second modality, and is related to FIG. 6. Removable tabs 163 and 148 create a benefit of being able to return battery 115 to its original configuration, while keeping intact connector construct 200 (reference "Theory of Operation" below). Also, normal wear and tear caused by inserting and removing battery 115 into its host device would be most pronounced at the ends of battery 115, where connector 143 and 163 are. While the modality of the connector construct 200 and its integrated thermistor 100 are durable, user handling of tabs 163 and 148 could, over time, potentially compromise their mechanical and electrical integrity. This might occur by repeated flexing of tabs 119 and 147, for example. Tab 147 interfaces with what typically are spring-loaded contacts in a host device (not shown), for example a laptop computer. Repeated insertions and retractions of battery 115 against such abrasive contacts may, over time, deteriorate conductivity.

Inexpensive replaceable tabs 163 and 148 preserve the more costly connector construct 200. Also, if connector 200 is end-user applied to battery 115, removable tab 148 allows minor realignments of contacts 191 to 187, as well as mating contacts 137 and 137a.

Positionable/Removable/Replaceable Tabs

The extending tabs at both ends of the battery 115 (FIG. 8) are removable, so that previous iteration of tabs 119 and 147 in FIG. 6 are now a separate and discrete tabs 163 and 148. Attachable tab 163 is applied to battery 115 by first peeling away lower protective layer 179, which reveals an adhesive layer 178. Item 173 shows tab 163 with top protective layer 175 removed, to expose a row of contacts 171.

Protective layer 181 on connector construct 200 of battery 115 is also removed, to expose the row of contacts 167. The mating row of contacts 177 on removable tab 163 (contacts 171 on detail 173) is also exposed when protective layer 179 is removed. The contact row 177 on removable tab 163 is mated to contact row 167 on connector construct 200, which causes tab 163 to act as an extension of the various conductors (for example, 145 and 153, as well as thermistor trace 109), so that connector 141 can be attached to a battery 115. Detail item 173 shows tab 163 with the contact row 171.

At the other end of battery 115, the equivalent construct as tab 163 is used on extension tab 148. When top and bottom protective coverings 195 and 189 are removed, both top and bottom contacts 137a, 137b and 191 are exposed. Once protective layer 185 is removed to expose contact row 187 (which mates with contact row 191 on tab 148), the assembly is attached to connector construct 200 on battery 115 so that all ten contacts on the lower side of tab 148 line up. An adhesive on the back face of tab 148 keeps the assembly in place on battery 115. To further secure tab 148, it folds along fold line 193 so that a flap 150 is created. Adhesive-backed flap 50 further secures tab 148 and prevents it from moving or inadvertently peeling off.

Layers

The three insulator layers 101, 151, and 149 are detailed in FIG. 8, as referenced in FIG. 6, to illustrate how the stacking of conductors and insulator layers is achieved. Layer 149 is the outermost layer. Just as in FIG. 3 and its discussion about the ability to print information on the outside of thermistor 100's layer 101 or 113, so too here the outer surface of insulator layer 149 can be imprinted with information.

Operation of the Invention (FIGS. 6–8)

Thermistor 100, expressed as an external (FIGS. 1–4) or internal (FIGS. 5A and 5B) temperature sensor, adds to the safety of rechargeable battery packs by providing a sensor where none may have been available before. By adding external thermistor 100 in FIGS. 1–4, existing battery packs that were manufactured without any temperature-sensing are easily and inexpensively upgraded.

FIG. 5 represents an internal installation, but that may not indicate that a battery pack is fabricated with thermistor 100 pre-installed. The chain of manufacturing steps to produce a battery pack is a multi-layered activity. Primary cell manufacturers do not always offer finished goods (completed battery packs) to equipment vendors such as laptop or cellular phone manufacturers. Ideally, thermistor 100, expressed as a single thermistor bonded to an individual cell, should be attached to cells by the cell manufacturer. Depending on the type of rechargeable battery, battery manufacturers may opt to embed thermistor 100 into the battery, instead of attaching it externally. This has been discussed above in the Principals of Operation for FIG. 1.

A second level of battery pack assemblers purchases raw cells, and configures them into battery packs. Assemblers provide a logical point-of-manufacture where a silk-screening press can be installed, for example, so that thermistor 100 can be integrated into a battery in the mode detailed in FIG. 5. However, the class of batteries identified as "rechargeables" extends into the consumer market. Energizer sells rechargeable alkaline batteries for use in toys, portable audio equipment, etc. Consumers have an opportunity to attach a single thermistor 100 temperature sensor to cells they purchase for their personal electronics products. If the powered device has battery holders that configure cells adjacent to each other, a multi-segmented thermistor 213 in FIG. 5 offers a simple solution. Another modality of thermistor panel 213 in FIG. 5 is to attach the temperature panel to the interior cavity of an "openable" battery case, so that the cells make approximate contact to a temperature sensor that stays with the host device.

In all of these operational modalities, the effectiveness of thermistor 100 in FIGS. 1–5B is contingent upon there being data acquisition devices or circuits that can access resistive element 109's changes of state (resistance changes created by increases or decreases in temperature). Such external devices to the thermistor of the present invention are not within the scope of the invention. Any attached devices used to monitor a battery's temperature devices need not be sophisticated. A simple multi-meter, properly calibrated, can be used to display thermistor 100's present resistive value. Converting these Ohm-values to a valid "alarm" temperature above which the battery should not heat can be accomplished by calibrating the multi-meter indicated changes in resistance to a reasonably accurate thermometer (preferably a surface-reading thermometer). The final resistive value can be stored in the multi-meter's memory, otherwise memorialized.

As detailed in FIGS. 6–8, thermistor 100 is a preferred mode for battery packs that are enabled with data connections. Such batteries, typified generically as "smart" batteries, have integrated A/D capabilities both in the battery pack itself, as well as in the host device. These smart batteries and electronic devices, such as laptop computers and cellular phones, afford thermistor 100 a communications platform. Thus, thermistor 100, when configured with connector construct 200 in FIGS. 6–8, can participate in the information stream between the "smart" battery and its "smart-compliant" host. Furthermore, by incorporating connector construct 200, thermistor 100 becomes seemlessly integrated with existing smart circuitry without any rewiring or major modifications to consumer devices.

Thermistor 100, with its connector construct 200 in FIG. 6 and FIG. 8, provides improved temperature monitoring with a simple, consumer-attachable device that applies like a normal label. Thermistor 100 is already accounted for in the "smart" battery specifications under System Management Bus (SMBus), as a second thermistor that provides redundant temperature information on the SMBus. Furthermore, under proposed SMBus specification revisions, "extended" SMBus functions will be allowed to allow smart batteries and host devices to connect and communicate to external devices, such as an external "smart" power supply or charger. It will then be possible for the functionality of thermistor 100 in FIGS. 1–5B to be optimized with external devices that can access temperature data from an applied temperature sensor.

In the overview, thermistor 100 and connector 200 are considered the best mode, but only in context of the present availability of data-enabled devices to which the invention attaches. As these data-enabled devices extend into external equipment, thermistor 100 in FIGS. 1–5 becomes a significant preferred modality of the invention, in and of itself.

FIG. 8 represents a modality of connector construct 200, with integrated thermistor 100, that features removable conductor tab 163 (and detail 173). FIG. 9 is a cross-sectional view of a construct represented as attachable tab 163 (or 173) in FIG. 8. FIG. 9 shows a mode of fabrication of a tab 163*a* that has a rigid terminator block 256 (female), instead of edge-connector tab 163 in FIG. 8. Tab 163*a* in FIG. 9 can replace tab 163 in FIG. 8. FIG. 10 expresses another mode of FIG. 9's tab 163*a*, with a male connector 262 shown on tab 163*b* in FIG. 10.

Female receptacle 256 in FIG. 9 is not intended to mate with male plug 262 in FIG. 10. Suitable mating parts, both male and female, that connect to FIG. 9's receptacle 256, or FIG. 10's plug 262 are not part of the present invention. Mating parts can be fabricated with compatible interface mechanisms, using models of the connectors shown in FIGS. 9 and 10. It is suggested, however, that using ribbon cable would facilitate fabrication of such compatible connector mates.

Conductive contact pad 254 can be used to conduct voltage or current from thermistor 100, since it is located on the underside of replaceable tab 163*a*. Thermistor 100, as shown in FIGS. 6 and 8 exists below insulator layer 246 in FIG. 9, so using the bottom-facing contact 254 is practical. However, lower contact pad 254 can be used for other conductors than thermistor 100's.

Upper contact pad 252 can be used for power or data, as defined in the text and drawings of FIGS. 6 and 8. There may be more than one contact pad on the top or bottom of connector 256 in FIG. 9.

Adhesive layers 242*a*, 242*b*, and 242*c* are discussed later below in the discussion of peel-away protective film 237 in FIG. 9.

Conductive layers 248 and 250, which are comprised of conductive material, for example copper which has been laminated to mylar or kapton, or conductive ink on mylar or kapton.

Insulator layers 244 and 246, for example kapton, mylar, vinyl, label stock or various papers.

Through-hole conductive transfer material 229 and 249, for example, can be solder flowed into vias in insulator layers 244 and 246.

Housing 227a and 227b for the connector can be attached with adhesive 242a or 242c, and/or with mechanical fasteners, such as pin 231.

The peel-away protective film 237 is captured by sandwiching it under the back edge of connector housing 227b, and pin 231 also holds film 237 in place. Protective film 237 uses a low-tack glue 239 to keep it temporarily secured. When pull tab 237a is lifted, adhesive layer 239 stays on protective film 237, and cleanly comes away from the surfaces of layer 244. As protective layer 237 is peeled away, it exposes lower glue areas 260 and 240. Glue areas 260 and 240 do not adhere to protective film 237, but remain to bond to the surface of a device to which connector tab 163a is to be affixed, for example, connector construct 200 in FIG. 8.

Conductive tab 235 transfers power or data to corresponding tabs 167 in FIG. 8. As shown here, conductive layer 248 is connected to contact 235 via conductive transfer material 249, as described in through-hole material 229 above. Were contact 235 to be electrically connected to conductive layer 250, there would be direct contact between contact plate 235 and conductive material 250. Here, conductive material 250 is directed around contact pad 235, so that there is no electrical connectivity between material 250 and contact pad 235.

Also note that connector 143 in FIG. 6, connector 163 in FIG. 8, and connectors 163a and 163b in FIGS. 9 and 10 respectively, can all be built with additional layers of conductive material 248, adhesive 242 (a, b, or c), and insulator material 246. This would add extra rigidity to removable tab 163 in FIG. 8, but extra layers would also add to total overall thickness, which may not be desirable for battery pack-type devices that are required to slide in and out of battery slots or bays in laptops or cell phones, for example.

FIG. 10 is the same as FIG. 9, except that connector housing 256 is herein shown as a male plug, instead of FIG. 9's female receptacle.

It is appreciated that connector construct 200 described in FIGS. 6–8 can be built with a third layer of FIGS. 9 and 10's conductive material 248 or 250, adhesive 242a–c, and insulator material 246. This would give two layers for conductors 145 and 153 in FIGS. 6 and 8, and a third layer for thermistor 100 as resistive element 109.

Theory of Operation

As presently understood, the theory of operation for the device of the present invention revolves around several assumptions or beliefs. A principle belief which serves as the basic assumption in the theory of operation is that battery charging has inherent dangers and risks. These risks stem from direct observations of rechargeable batteries that have overheated under "normal" charge conditions, as well as conversations with colleagues (some of whom manufacture rechargeable battery cells) who have confirmed the instability of battery chemistries. As an active participant in the Smart Battery Systems (SBS) Implementers Forum, a group of manufacturers that designs products based on the System Management Bus (SMBus) specifications, I have first-hand knowledge of battery functions.

Further evidence of potential risk is indicated by the growing implementation of "smart" battery systems in laptop computers and cellular phones. Were such batteries intrinsically safe, the need for sophisticated (and expensive) "smart" battery temperature sensing would not be part of almost every contemporary battery pack design and implementation.

One assumption is that there may come a time when traditional battery charging with the battery pack in situ might not be the best, or safest, mode. This will be especially true when issues of battery charging safety, including temperature monitoring of cells (or the entire battery pack), make it desirable to monitor or control battery charging activities from an external, rather than internal, charging circuit.

For example, one hypothetical theory of operation of the invention uses a combination external battery charger and discrete power supply that is embedded at the passenger seat of a commercial airliner. My belief is that the potential dangers inherent in charging batteries is elevated to a level of extreme risk in locations such as in the cabin of a commercial airliner. Should a battery vent excessively, due to excess pressure brought on by over-heating, within the sealed air-circulation system of an aircraft cabin, toxic fumes would be unable to escape. If undetected heat from an overcharged battery were to become excessive enough to cause an explosion, passengers would be trapped.

An embedded power source and charger, at locations where battery charging risks would be normally unacceptable, may allow the charging of batteries, provided that a suitable temperature sensor capable of detecting over-heating during the charge cycle is available at the battery pack. A passenger's laptop, as an example, may have been manufactured without any internal "smart" battery circuitry, and would be thus incapable of monitoring its own battery temperature.

In such a situation, the externally applied thermistor shown in FIGS. 1–4 can be useful, by enabling an external temperature monitoring device to detect changes in battery temperature during the charge cycle. An external monitoring device at each seat can deactivate input power to the offending device if excessive battery pack temperatures are detected. This provides a margin of safety that the user's device may not be able to supply. In this theoretical, the best mode of the invention would be expressed in FIGS. 1–4. Such an external thermistor can be installed by the passenger while on a plane, thus eliminating inconvenience and also providing safety.

Because the thermistor shown in FIGS. 1–4 and elsewhere can be manufactured with low-cost materials such as printed ink on label stock or coated paper, these inexpensive "do-it-yourself" disposable thermistors can be provided to passengers. Passengers can peel away a backing sheet to expose a low-tack adhesive, then affix the thermistor to the battery pack as if it were a label. After the flight, the passenger can remove the temporary temperature sensor, returning the battery pack to its original state.

In FIGS. 1–4, conductor 105 could terminate in a connector compatible with an in-seat power port or access an embedded charger. This power supply or charger can be manufactured with A/D capabilities, to read resistive values from thermistor 100. By pre-setting "alarm" levels indicating "not-to-exceed" temperatures in the embedded devices, the charger or power supply can have a self-regulating shut-off. As temperatures sensed by periodic sampling of thermistor 100 begin to approach the "alarm" trigger point, messages can be sent to users (if a display screen is available) advising them of this potentially unsafe condition.

FIGS. 6–8 show thermistor 100 integrated into a connector construct which provides for not only external monitoring of thermistor 100, but also bidirectional data to the battery and the host device. In this modality, "alarms" can be handled not only by communications from an externally embedded power supply or charger to the host device, but by direct communications from an external charger directly to the data-enabled battery.

Second Theory of Operation

My awareness of the volatility of battery chemistries in the charge state suggests another theoretical model. It is believed that no battery charging activities whatsoever will be allowed aboard passenger-carrying aircraft. The issue has already been raised by an article in the Wall Street Journal titled "Is Recharging Laptop in Flight A Safety Risk?" (Apr. 2, 1998, pg. B1).

This poses some unique problems. The battery charging circuit in electronic devices such as laptops and cell phones is a discrete, hardwired sub-system that cannot be easily disabled. The wiring within the equipment's power circuit does not isolate the charging circuit from the main power circuit that operates the device's primary electronics. Every time external power is connected to a laptop, or equivalent electronic equipment, the charger function commences automatically. It cannot be disabled with software.

Without some means of isolating the device's internal charging circuitry so that it can be manipulated and controlled independently of the rest of the device's electronics, the user would not be able to use a device like a laptop computer on an airplane (or at other locations where battery charging poses a risk). Power to the primary circuits of a powered device would have to be provided from another input point than the standard power port, since introducing power at the device's normal power port would automatically enable the battery charging circuit.

In theory, electronic devices with "smart" battery circuitry like that designed around the SMBus specifications, could disable the battery charging function independently from the active main power circuit. This has never been done.

Separating Charging and Primary Power Circuits

The most reliable way to achieve such a separation of the charge functions from primary device power is to use a thermistor 100 in a connector construct 200, as indicated in FIGS. 6–8. This flexible, multi-layered construct provides independent temperature sensing to an external monitoring system, as well as bidirectional data to a "smart" battery. Because connector tab 147 in FIG. 6 has two sets of conductive traces, any two pair of which can be used for power, connector 200 can power a host device independently of power from the battery pack. Selected conductors can deliver power and data to a host device, while others monitor thermistor 100.

FIGS. 6–8 represent the preferred mode of the invention in a model where battery charging is not allowed, and a powered device has a "smart" battery system. Because the ink-based thermistor is integrated, a safe temperature-based override is available to an external monitoring device in the aircraft seat.

As with thermistor 100 in FIGS. 1–4, the thermistor and connector construct shown in FIGS. 6 and 8 can be self-applied, and is also useable on non-smart battery packs (only the power conductors and integrated thermistor circuit would be active in this modality).

Thus, these theories of operation, while not limiting the scope or uses of the thermistor of the invention, indicates a need for a reliable, low-cost method of providing battery charging safety (or, in the alternative, disabling battery charge functions without incapacitating the use of a host device).

CONCLUSION, RAMIFICATIONS, AND SCOPE OF INVENTION

Accordingly, it is appreciated that the apparatus for monitoring temperature that is the present invention can be used to provide additional charging safety when integrated or attached to a battery cell or battery pack. Improved safety can be achieved by wrapping a permanently installed temperature-sensor around each cell in a battery pack. By locating discrete thermistors directly at all heat sources (cells) within a battery pack, the thermistors can deliver rapid and highly accurate localized temperature responses to a monitoring/telemetry circuit within a battery pack. In the alternative, sensor information can be directed to an external remote monitor, charging circuit, or power source. Thermistor 100 also has a modality wherein it serves as a semi-permanent or disposable temperature sensor attached to the exterior of an existing battery pack.

By using low-cost and readily available materials, such as label stock or coated papers, and thermally-resistive and conductive inks, a thermistor can be manufactured in large quantities at prices well below traditional temperature sensors. Since the materials used to fabricate the thermistor are quite thin and have good flexural integrity, the temperature sensor is conformable to small objects, like individual cylindrical battery cells. The thermistor can also be readily wrapped around the contours of a variety of battery pack shapes, without adding undesirable thickness that changes the battery enclosure's original dimensions.

The thin cross-section of the thermistor allows it to be manufactured with multiple layers that comprise additional conductive traces for power and data. These power and data traces can be directed to an internal circuit within a "smart" battery pack, or routed externally, via a connector, to a remote monitoring or power source/charging circuit. When the modality of the multi-layered thermistor that incorporates power and data conductors is attached to a data-enabled battery pack, users gain added safety from both the battery's original internal temperature sensor (if present), as well as the enhanced temperature sensing of a larger-surfaced external thermistor.

The printed ink used in the present invention can be directly applied to any material that can be silkscreened, which makes it especially economical and convenient for applications like the nylon material used as enclosures for polymorphic cells, for example. When printed on such materials, or equivalents that can be fed through a silk-screening press, bar codes or other information can be simultaneously printed on the same, or obverse side, of the material. The application of adhesives can also be included as a simple adjunct to the printing process, and such bonding materials allow the thermistor to be adhered to cell casings or external battery pack housings. By relying on traditional printing and adhesive-application processes, the speed and costs of manufacture are minimized, allowing large production runs.

Although the description above contains many specifications, these should not be construed as limiting the scope of the invention, but as merely providing illustrations of some of the presently preferred embodiments of this invention.

For example, leads 105 in FIGS. 1–4 can be attached by chemical or thermal adhesive bonding, sonic welds, wave soldering, or by mere pressure contacts or clips. In the same drawing, optional second stratum 113 can be attached to medium 101 by heat/pressure fusing, sonic fusing, or gluing.

Conductive pads 107 and 103 in FIGS. 1 and 2, and the equivalent contacts in FIGS. 6–8, are not limited in shape, general size, or materials. Materials such as silver-pigmented epoxy cements, or silvered conductive inks are acceptable substitutes that can be printed or painted directly on the substrate.

Since it is feasible that the internal circuitry of a battery pack may have been outfitted with the second allowable temperature-sensing mechanism at the time of manufacture, thermistor 100 in FIG. 6 and elsewhere would be unnecessary. Without limiting the assembly that is the present invention, thermistor 100 and its associated parts can be eliminated from the multi-layered construct without significantly impacting its functionality as a connector construct. Even without a temperature sensor, the remaining data and powerlines, connectors and other elements provide a functional sub-assembly that will allow functions like independent battery charging while simultaneously powering a host device. Because of the way connector construct 200 in FIG. 6 and elsewhere interconnects two or more devices, the lack of a thermistor 100 still leaves intact a functional assembly.

The shape and orientation of attachment of thermistor 100 in FIGS. 2–4 on battery pack 115 can vary according to the configuration of battery pack 115 onto which thermistor 100 is being applied. Thermistor element 109 in FIGS. 1–4 and FIGS. 6–8 can vary dimensionally, so that it can be represented as a rectangle, square, or other shape or thickness appropriate to the desired resistance required by the monitoring circuit, as well as to cover larger or smaller areas of a power source.

The properties of the thermally conductive inks used in the present invention prescribe a resistivity that changes in response to ambient temperatures, so that resistivity increases as ambient temperature increases. This description characterizes a number of commercially available positive temperature coefficient (PTC) inks, but the invention can also accommodate those materials, not necessarily inks, which exhibit decreases in resistivity with increases of temperature, i.e., negative temperature coefficient (NTC) materials. When PTC inks are used, their upward changes in resistance with temperature increases may require a "reverse reading" conversion in circuits that expect an NTC input. Chips equivalent to the Benchmarq (Austin, Tex.) 2N3904 facilitate this conversion.

Detachable connector 124 in FIG. 4 (also as connector 141 in FIGS. 6 and 8) can be of different shapes than indicated. The rectangular block configuration is illustrated only because male attachment pad 120 in FIG. 4, for example, is flat and elongated. Thus, any suitable connector that conforms to the contour, shape and thickness of attachment tab 119 is acceptable. Connector 124 can be totally eliminated, with an alternative of hardwiring a ribbon cable directly to connector tab 119.

The external placement of thermistor 100 in FIGS. 2 and 3, are shown only because the intended application is for a user-applied device. For manufacturing, the thermistor and associated conductors can be located inside the battery pack housing. Thus, for example, a hybrid model can be constructed which has discrete thermistors wrapped around each cell, as well as data and power conductors (shown as 129*a*, 129*b*, 131*a*, 131*b*, 133*a*, 133*b*, 135*a*, 135*b*, 137*a*, and 137*b* in FIG. 6) that transition internally from a main connector to the opposite end of battery housing 115 in FIG. 6. A suitable equivalent of connector 141 or connector tab 119 can be molded into that end cap (not numbered, but to the aft end as drawn). Thermistor 100 in FIG. 6 can also be attached externally to battery pack 115 that has data and power conductors internally configured.

Battery connectors 129, 131, 133, 135 and 137 in FIG. 8 are representational only. Connector contact number, size, location, shape, keying, and spacing varies considerably. Thus, the shape, angle, and orientation of conductor grouping (shown as 129*a*, 129*b*, 131*a*, 131*b*, 133*a*, 133*b*, 135*a*, 135*b*, 137*a*, and 137*b* in FIG. 6) should be designed to reflect variations in the battery packs connector configuration.

The multiple layers of insulators 101, 151 and 149 in FIG. 8 can be transposed from bottom to top, or otherwise interchanged. However, thermistor 100 should always be kept in close proximity to the battery housing 115.

While the present invention has been described in detail with regards to the preferred embodiments, it is appreciated that other variations of the present invention maybe devised which do not depart from the inventive concept of the present invention. Thus, the scope of the invention should be determined by the appended claims and their legal equivalents, rather than by the examples given.

In another aspect of the invention, a variety of connector apparatuses creates interfaces which enable multiple modes of operation among a plurality of devices.

Whether to incorporate a supplemental temperature-sensing capability, or used independently as a means of redirecting existing data, or power signals (or both), such connector interfaces as those indicated in FIGS. 1–19D create new data and/or power paths which enhance the functionality of at least one of the connected devices. Often, such enhanced operations can usually be accomplished without intrusive modifications to existing hardware (and software, if present). This retrofit capability makes these interface assemblies well suited as aftermarket "upgrades" to existing products.

These connector apparatuses are particularly useful in enhancing functionality and intra-device operations when incorporated into removable battery assemblies, and battery-powered host devices. A variety of "third devices," such as battery chargers, power supplies, and battery monitors with sensor devices other than thermistors, connect such devices to batteries and host devices that may have not been manufactured with access ports for such third devices. Some of the interconnect assemblies discussed here can be integrated into batteries, host devices and third devices at the time of manufacture, as well.

Thus, this ability to introduce such connector assemblies at either pre- or post-manufacture stages adds flexibility and upgrade capabilities for product designers and engineers, original equipment manufacturers, aftermarket device suppliers, and even end users.

Illustrations of Connector I/O Operational Modes

Based on FIGS. 1–10, the following discussions of intra-device operational modes are intended to illustrate non-limiting examples of the multiplicity of inter-connectivity schemes that can be created with the connector assemblies of the invention. Where appropriate for clarification, specific references to related Figures are indicated, but the applicability of any of these operational modes often extends to more than one of the drawings.

Figure 12:
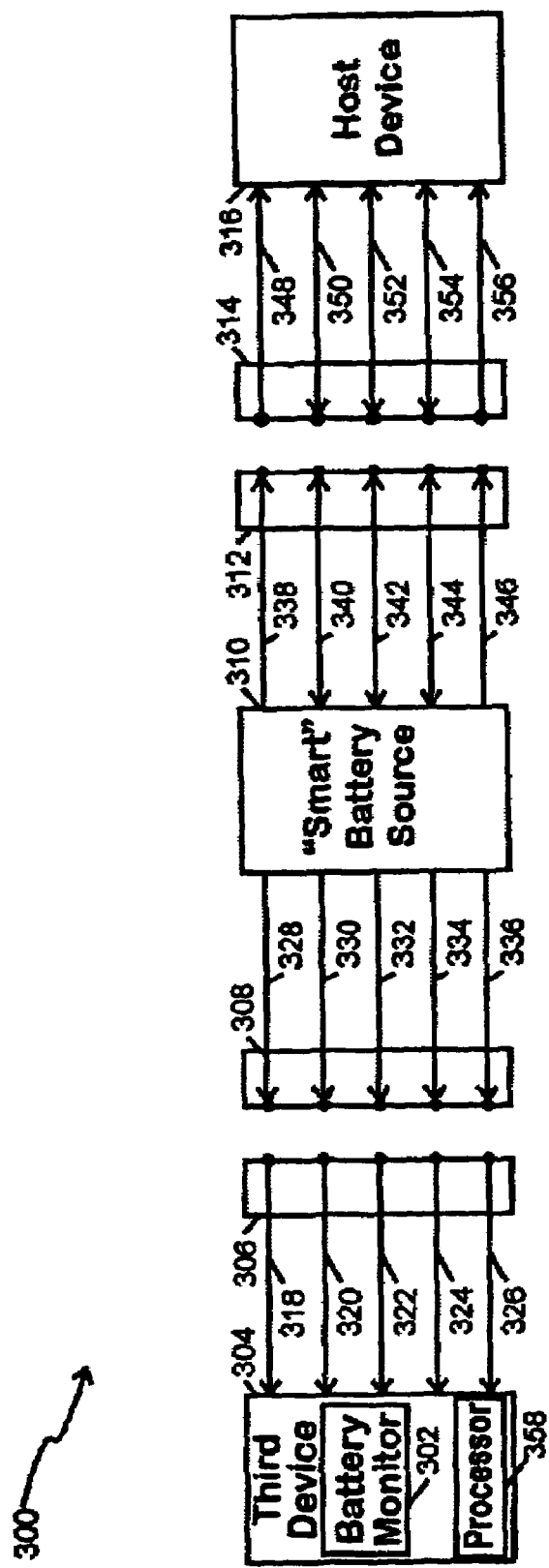
FIG. 12 diagrammatically depicts a representative example of an operational mode of a connector apparatus connecting a third device for monitoring a battery.

In FIGS. 12–19D, connectors are indicated diagrammatically as simple blocks, although in actual use these can be mechanisms such as spring-loaded clips in host devices which contact-mate with rectangular pads on removable battery-pack housings. Most host devices have the actual battery connector embedded inside a battery cavity, or "battery bay"(as depicted in FIG. 12 as 417L, for example). Most batteries have their connector interfaces along one face of the pack's enclosure. The physical connectors in the Figures may not extend outside of the devices but, for clarity, short lines representing conductors are shown in the Figures to accentuate and easily identify conductive paths (and direction of flow) for power and/or data.

Usually, arrowheads are used on lines in the Figures to show directional flow along conductors. Lines with double arrowheads indicate bidirectional flow. Typically these are data lines, although power conductors can also be bidirectional, especially in Figures where switches, jumpers/terminators are employed.

When connector-interface assemblies are used with rechargeable-battery-powered devices, there is an implicit understanding that power flow is bidirectional. Flow is in one direction for delivery of power from a battery power source to its host device, and power flow occurs in the opposite direction (to the battery) when a battery is being charged. Where single arrowheadsare depicted on power conductor lines in the Figures it is to emphasize a particular operation (e.g., battery charging), and should not be construed to indicate that flow along those conductors cannot be bidirectional. For implementations with primary (non-rechargeable) batteries, only one direction of power flow can occur . . . from a battery to its host device. These distinctions should be kept in mind when viewing the Figures.

Not all power or data lines shown may be active (or even required at all) in order to perform a particular operation, but the assumption in the Figures and related text is that all conductors are available to perform some part of the operation being described. Dashed lines are used to show (temporarily) inactive lines (e.g., FIGS. 18A and B), and dashed lines are also used where appropriate to show conductors passing through an object (e.g., FIG. 16 has its conductors 698, 651, 653, 655, and 657 passing through the physical enclosure of a battery 658).

The thin cross-sectional form-factors of several of the actual connector apparatuses (reference FIGS. 6 and 8, for example) discussed herein are designed to be thin enough to allow a battery to remain in its battery bay within its host device, with only an exposed and accessible connector interface to which a third device is attached. While the connector assemblies in FIGS. 12–19D may suggest a profusion of wires running between devices, in reality the only exposed cables or cords are those typically shown between an external third device, and a battery source (or where an in-line adapter is interposed between two devices) in the diagrammatic drawings.

Figure 19A:
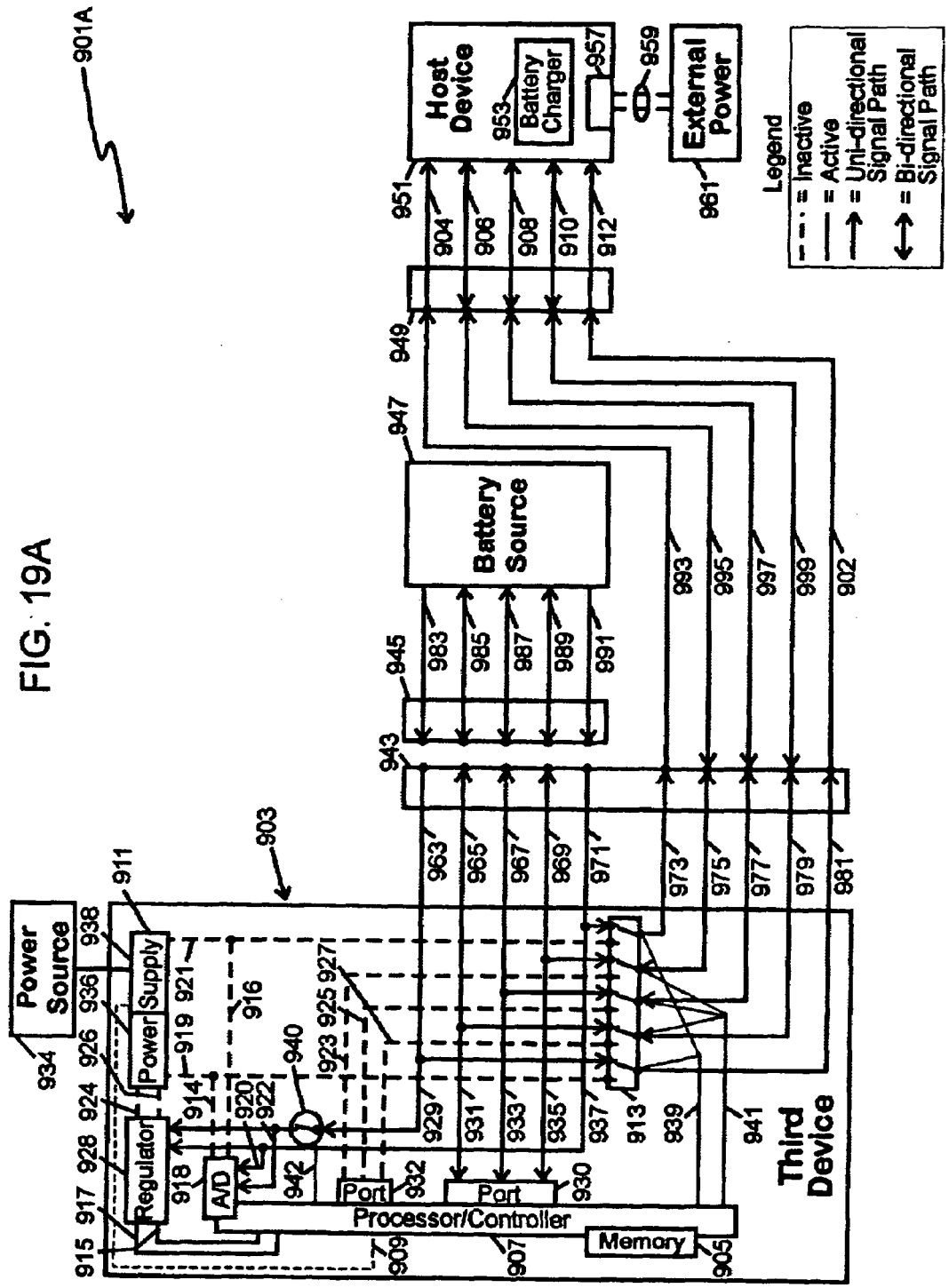
FIG. 19A depicts a wiring diagram view of a connector apparatus which uses a controllable switch to address either a battery or host device.

For example, note that conductors 993, 995, 997, 999, and 902 in FIGS. 19A, B and C do not represent actual wires in the diagrams depicted, but rather only serve to indicate inter-device connectivity. In reality, the lower section of connector block 943 mates directly to connector block 949 (reference connectors 199a and 119b in FIGS. 8A and B, for example). Note also that connector 949 is physically located in host 951's battery bay 998, and mates with battery connector 945 when a third device 903 is not present. Unless otherwise indicated, all Figures depicting block diagrams follow this drawing convention, as here exemplified by FIGS. 19A, B, and C.

Examples of Connector I/O Operational Modes

FIG. 12 shows diagrammatically an example of three devices inter-operating. Rechargeable battery source 310 is communications-enabled (i.e., a "smart" battery), which normally provides power to its associated host device 316. In this non-limiting example, pre-existing connectors 312 and 314 were integrated into battery source 310 and host device 316 at the time of manufacture. Conductors 338, 340, 342, 344, 346, and 348, 350, 352, 354, 356 are assumed here to be internal to associated battery source 310 and host device 316 respectively. Connector 312 is integrated into an exposed face of battery 310's housing, in a location where it can be electrically mated to connector 314 of host 316. Connector 314 is assumed here to be built into a battery bay 323 into which a user inserts a removable battery 310. Upon insertion, battery connector 312 mates electrically to host's connector 314. Unless otherwise indicated, all Figures depicting block diagrams follow the above drawing conventions, as exemplified by FIG. 12 here.

Note: A shorthand convention is used for enumerating a series of conductor segments in the Figures that represent a conductive path. For example, in defining a conductive path, what may be usually written as something like "The flow of power along a conductor 1, which transitions to a second conductor 2, and then power continues along conductor 3," is herein written as "the flow of power along conductor sets 1/2/3."

In FIG. 12, matched conductor sets 338/348, and 346/356 are for power delivery between battery source 310 to host device 316. Matched conductor sets 340/350, 342/352, and 344/354 are data lines. While three data lines are indicated, the actual number of data lines can vary (e.g., SMBus communications architecture vs. Dallas "One-Wire").

Connector I/O assemblies depicted in FIGS. 6 and 8 can be configured to provide a monitoring mode of operation as shown in FIG. 12; however, FIG. 7 may best illustrate the conductive paths. Table A correlates the corresponding connectors and conductors in FIGS. 7A–C to those depicted in FIG. 12:

TABLE A

| FIGS. 7A–C | FIG. 12 |
|---|---|
| Conductors | |
| 129e | 328 |
| 135e | 330 |
| 133e | 312 |
| 131e | 334 |
| 137e | 336 |
| 137a | 338 |
| 135a | 340 |
| 133a | 342 |
| 129a | 346 |
| Connectors | |
| 201 | 312 |
| 199a | 308 |
| 205a | 306 |

Note that only a single connector 205a is used from the set 205a and 205b, since there is no "Y-Connector" circuit branching for two third-device 304 outputs required here.

Figure 15:
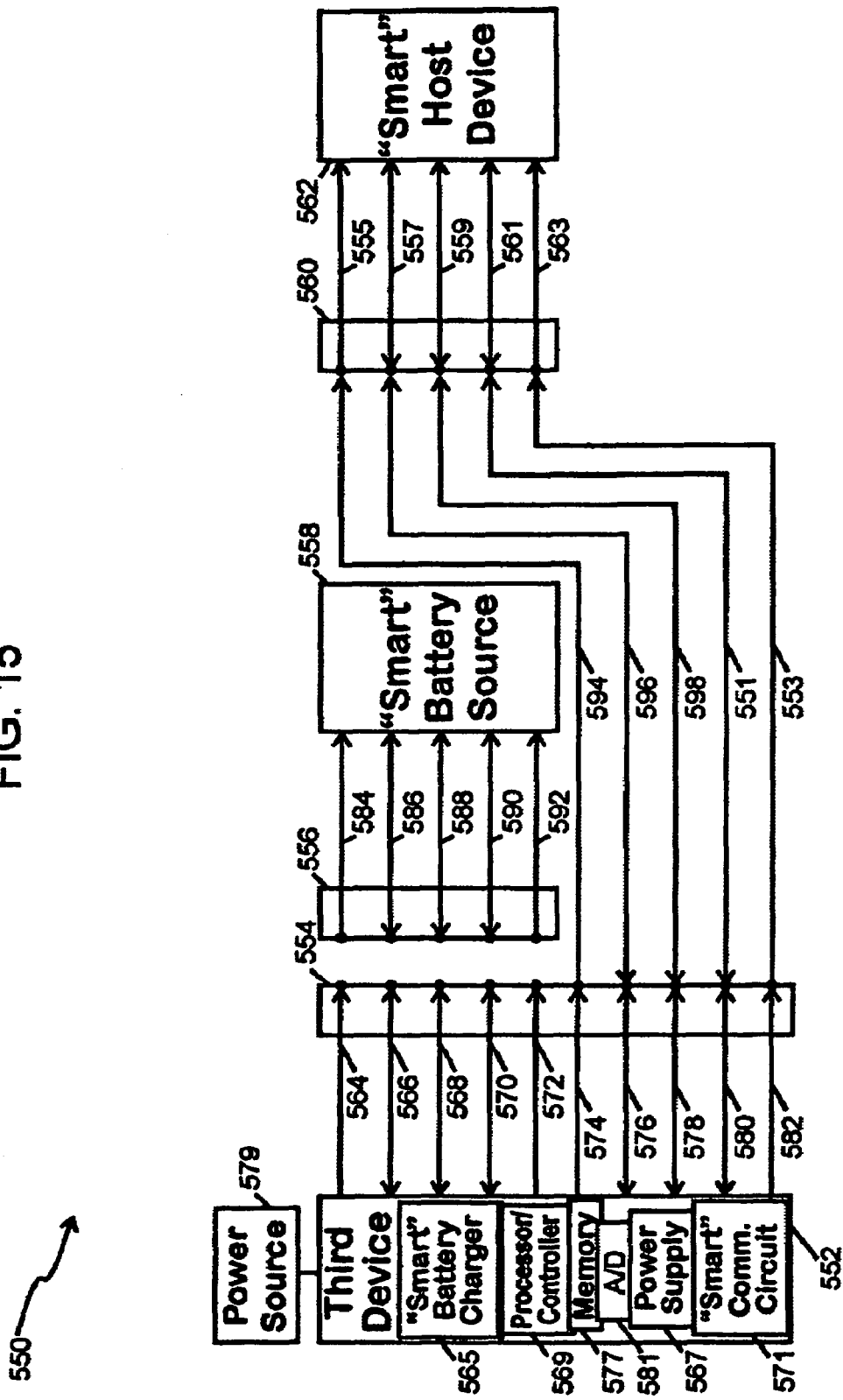
FIG. 15 shows a typical wiring diagram representative of a connector configuration which provides for a dual-mode device to operate concurrently when interfaced with a battery device and a host device.

A connect-able fourth device is representative of FIG. 15's battery charger 565 (as suggested for connector 205a in FIG. 7), and an attachable power supply 567 (as suggested for connector 205b in FIG. 7). Table B correlates the corresponding connectors and conductors in FIGS. 7A–C to those depicted in FIG. 15:

TABLE B

| FIGS. 7A–C | FIG. 15 |
|---|---|
| Conductors | |
| 129e | 584 |
| 135e | 586 |
| 133e | 588 |
| 131e | 590 |
| 137e | 592 |
| 137a | 555 |
| 135a | 557 |
| 133a | 559 |
| 131a | 561 |
| 129a | 563 |
| Connectors | |
| 199a | 556 |
| 199b | 560 |
| 205a | 554, 564, 566, 568, 570, 572 |
| 205b | 554, 574, 576, 578, 580, 582 |

Note that connector 199a in FIG. 7 has its powerlines 129e and 137e directed to the battery's cell pack 217 (charger access only), and that power conductors 129a and 137a create a power path from connector 119b only to host device 280. While "T," "D," and "C" data conductors are shown in FIG. 7 as 135e, 133e, and 131e, no "smart" battery circuit board is indicated. This is because of the numerous variants of how such smart circuits are wired in battery packs and connectors. Those skilled in the art will readily be able to appropriately wire the connectors into such smart data circuits.

In FIG. 12, battery source 310 provides power to both its associated host device 316 along conductor sets 338/348, and 346/356, and also delivers power to battery monitor 302 in third device 304 along conductor sets 338/348, and 346/356.

In one operational mode, battery monitor 302 (FIG. 12) is a passive device which only detects or diagnoses activities within battery source 310. But a monitoring device 304 also operates in a pro-active mode with its associated battery source. For example, monitor 302's processor 358 is capable of providing control/command capabilities, overriding a battery charging request issued by battery 310 . . . perhaps upon detecting an undesirable thermal state within battery 310. An external third device 304 is capable of functions such as upgrading software in battery source 310, or to test and recalibrate a battery's fuel gauge. In these examples of a pro-active monitoring device 304, the directional indicators of data lines 320, 322, 324, and electrically-coupled lines 330, 332, and 334 would be indicated in FIG. 12 with dual arrowheads, indicating bidirectional data communications.

FIG. 13

Figure 13:
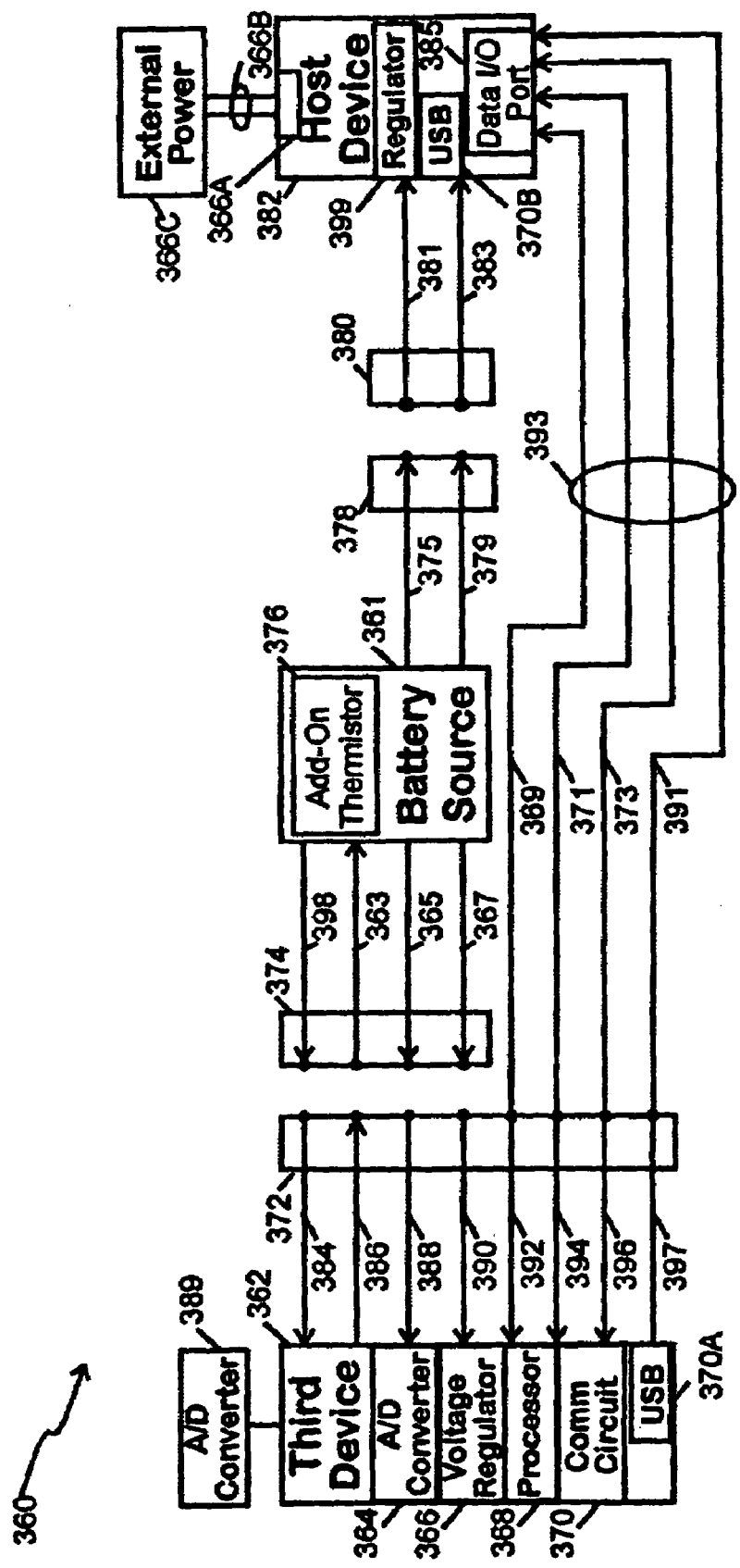
FIG. 13 shows a representative diagram of an operational mode of a third device that monitors battery functions and communicates independently with a host device.

FIG. 13 represents a non-data-enabled battery source 361, at which has been placed a thermistor 376 (see FIGS. 1–4 as non-limiting examples). A third device 362 is capable of monitoring thermistor 376 by providing a low-voltage output from voltage regulator 366 along conductors 384 and 386, which electrically mate at connectors 372 and 374 to conductors 398 and 363, respectively. The low voltage power signal passing through thermistor 376 is directed to third device 362 at A/D converter 364. The digitized temperature information is then processed at processor 368, and a "smart" system-compliant communications circuit 370 transports the temperature data along conductor sets 392/369, 394/371, 396/373, and 397/391 to a compatible data port 385 at host device 382.

Data I/O port 385 in FIG. 13 may be, for example, a four-conductor Universal Serial Bus (USB) port, PCMCIA (PC Card) data port, or any other appropriate data port available at host device 382. The actual configuration of conductor set 393 and associated communications circuit 370 is determined by the data transport protocol selected. Software installed in host 382 interprets temperature data signals from third device 362. While not shown, it is assumed that a host device 382 has a processor and other basic communications capabilities. If a user of host 382 is to view any of the communicated temperature information, a display screen and appropriate software would be required, but is not shown here.

Power for third device 362 comes from battery source 361, but an independent power source 389 may be connected to third device 362 in which case battery power conductor sets 388/365, and 390/367 would be present, but not be electrically active to power third device 362. If power source 389 is present, regulator 366 handles any power conversion or voltage adjustments.

In an alternative modality, should host's data I/Oport 385 in FIG. 13 be powered (such as for USB or PC Card communications protocols), third device 362 is capable of being powered from host device 382. Power travels from battery 361, along conductor sets 375/381, and 379/383 to host 382. Powered data I/O port 385 uses conductor set 391/397, and 369/392 to deliver power between port 385 and third device 362. The example shown here, with four conductors, represents a typical USB low-voltage and data connection. The USB-provided power is used to power processor 360, communication circuit 370, etc.

For a PC Card interface, more than four conductors would be required for power and data (see PCMCIA specs at web site www.pcmcia.org). Of course, any other available data port at host 382 can be used, and even a wireless link between a third device 362 and host 382 is viable, as will be discussed later (for data, but not power).

Note that conductors 369, 371, 373, and 391 in FIG. 13 do not represent actual wires in the circuits depicted, but rather only serve to indicate inter-device connectivity. In reality, the lower section of connector 372 mates directly to connector 380 (reference connectors 199a and 119b in FIGS. 8A and B, for example). Note also that connector 380 is physically located in host 382's battery bay 321, and mates with battery connector 374 when a third device 370A is not attached.

110-Volt USB

In another alternative modality of FIG. 13, host 382's data port 385 is configured as a 110 VAC USB connector. Third device 362 does not require its voltage regulator 366 to configure a DC voltage signal for host 382, because power source 389 provides a 110 VAC output. A 110 VAC power signal now travels from third device 362 along power conductor sets 392/369, and 397/391 to host 382 at data port 385 (configured with USB protocol shown as 370B), where its regulator 399 converts the AC signal to a compatible DC signal for use by host device's internal circuitry.

Because USB-compliant data is now being transferred from third device 362's USB communications circuit (numbered in FIG. 13 as 370A to differentiate it from a DC-voltage communications circuit 370) to data port 385 across conductor sets carrying 110 VAC (392/369, 394/371, 396/373, and 397/391), a host device now has two sources of power available: battery power at its battery connector 380, and convertible AC power at I/O port 385 (in a modality of this port being a 110 VAC USB interface). This modality minimizes conductors, since there is only one externally-exposed interface 385 to host 382 that supplies both operational power and data (battery connector interface 380 is technically not exposed, as it is located within a battery bay 321).

Further, this alternative modality eliminates any need for host device 382 to have a separate external AC/DC power adapter 366C, as third device 362 replaces such an external adapter with a power+data combination that provides users portability and convenience. Such a third device as described in this alternative modality becomes even more effective if battery 361 is a data-enabled "smart" battery (see FIGS. 14A–D for example), and elsewhere. Further interoperability is achieved by incorporating a battery charging circuit 419 (see FIGS. 14A and B) in a third device 362, so that a single third device 417 can power a host device, charge its battery 415, and fully communicate with both a battery and a host. Third device 362 in FIG. 13 does not necessarily have to be portable. Device 362 (as well as all other representations of third devices throughout this document) operates also as an embedded power and data module. A non-limiting example would be to embed a third device 362 in an airline seat, or on any transportation vehicle, so that users can connect various host devices 382 to a convenient power and data outlet (represented generically by connector interface 372 in FIG. 13). Depending on the desired operation of an embedded third device 362, it is not essential to the invention that both a battery 361 and a host 382 be connected. A battery connection may only be necessary to prevent battery charging, for example, while the principal device operation is to deliver power and data to a host 382. The 110 VAC alternative modality discussed above provides the ability to be data-compatible with a wide variety of both AC and DC host devices. There are host devices, such as laptop computers, which support a direct 110 VAC input, as well.

Thus, even though a "dumb" battery 361. (FIG. 13), and host device 382 have no pre-existing communications interface, employing an add-on upgrade connector interface assembly 360 creates a new and valuable mode of operation for both a battery and its associated host device, that has an available data-access I/O port 385 or equivalent.

Minimalist Wiring

Figure 14A:
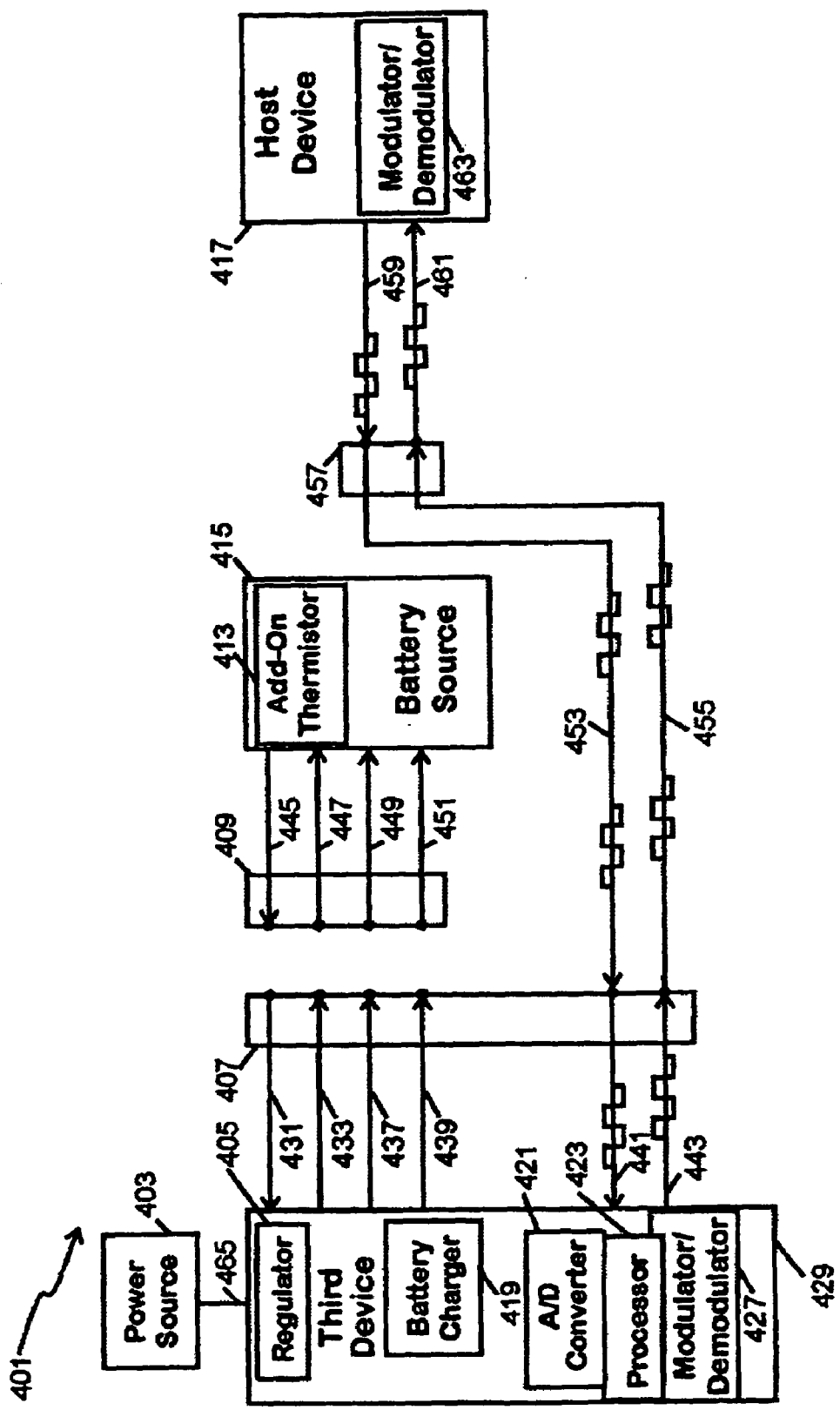
FIG. 14A is a wiring scheme using powerline modulation to minimize the number of conductors used with a connector apparatus.

FIG. 14A illustrates a connector apparatus 401 which emphasizes minimal inter-device wiring. Battery source 415 is a "dumb" battery unit, so it—and its associated host device 417—have no ability to communicate with each other. The addition of an add-on thermistor 413 to battery 415 adds a level of battery-charging safety previously unavailable (see discussion of FIGS. 1–4, for example).

Third device 429 in FIG. 14A is comprised of a multi-output voltage regulator 405, which outputs a low voltage at minimal current along conductor sets 431/445, and 433/447 to thermistor 413. Voltage regulator 405 outputs a second voltage for battery charger 419 along conductor sets 437/449, and 439/451, and a third output drives internal processor 423.

A power signal relative to battery 413's (FIG. 14A) output voltage is also provided by multi-output voltage regulator 405. A modulator/demodulator 427 operates either from battery power, or from a power signal from multi-output voltage regulator 405. When not being charged, power from battery 413 may seem like a logical choice as a source to power host 417. Because battery power signals along powerlines tend to be relatively clean, compared to a power signal from a regulator, it makes a good choice for powerline modulation. However, the remaining capacity of a battery 415 is somewhat known because a user has attached an external battery charging device 429, indicating that battery 415 is at less than full capacity. Thus, regulator 405 provides an available power signal that is analogous to that of a battery 413. Later examples of powerline modulation from a third device which incorporates a variable-output power supply are more rational for implementations which use battery power between an external device and a host.

Since host 417 (FIG. 14A) operates within a voltage range of its associated battery 415, the output voltage of regulator 405 directed to powerline sets 441/453/459, and 443/455/461 should conform to battery voltage parameters. Third device 429 uses its A/D converter 421 to read battery voltage. Processor 423 thus confirms whether the output of regulator 405 corresponds to a known battery output voltage.

Note that the output of charger 419 is not a reliable source of information on the input power requirements of a host 417. Charger voltages reflect battery chemistry, charge time remaining, etc., which do not have any correlation to a host's power requirements.

Thus, by incorporating a multi-output regulator and using powerline modulation for intra-device communications, a minimal set of conductors is required to connect three multi-function devices.

Powerline Operations

In operation, analog readings from thermistor 413 in FIG. 14A are digitized by A/D converter 421, then the digital temperature signal is handled by processor 509. Thermistor information at the processor is then sent to M/D 427. Processor chips with integrated DSP and M/D functions for powerline modulation that are capable of 11+ Mbps speeds are available from Intellon (Ocala, Fla.).

The modulated signal is then overlaid on a powerline voltage from regulator 405 (FIG. 14A) across power conductor sets 441/453/459, and 443/455/461. A modulated signal from third device 429 received at host device 417's power port 457 is demodulated by host's M/D 463, then made available to the host device's internal system resources (not shown).

Note that conductors 453 and 455 in FIG. 14A do not represent actual wires in the circuits depicted, but rather only serve to indicate inter-device connectivity. In reality, the lower section of connector block 407 mates directly to connector block 457 (reference connectors 199a and 119b in FIGS. 8A and B, for example). Note also that connector 457 is physically located in host 417's battery bay 417M, and mates with battery connector 409 when a third device 429 is not present.

Non-M/D Hosts

Figure 14B:
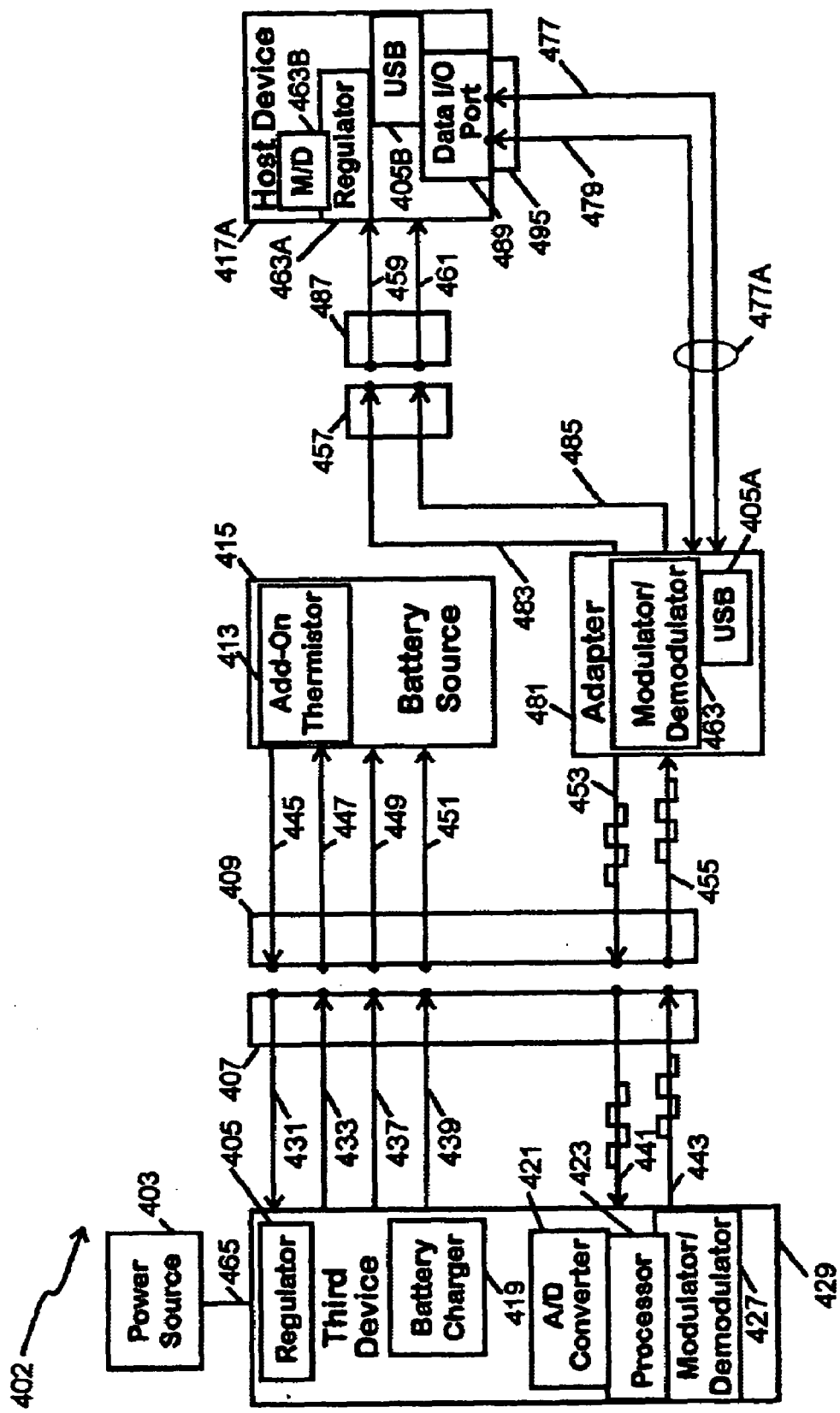
FIG. 14B diagrammatically illustrates connector apparatuses for the operation of an in-line adapter and related devices.

If a host device is already manufactured and has no internal modulator/demodulator 463, an alternative modality of an interconnect system 402 in FIG. 14B provides a solution. An in-line "adapter" 481 between third device 429 and host 417A performs several basic functions. Adapter 481 translates modulated input signals it receives along conductor sets 441/453 and 443/455 from third device 429. The translation process involves data conversion to a host-compatible language, syntax, and protocol. This can get complex when addressing a wide variety of host devices, each of which has its own unique data language, applications, etc. In many situations, the communications hardware/software 405C (FIG. 14B) of adapter 481 will have to be fabricated with a specific host (or class of compatible host devices) in mind. Device designers should look to tools and communications hooks within hosts' operating systems for communications opportunities.

Nonetheless, as an intra-device connectivity issue, an adapter 481 in FIG. 14B demodulates data received from device 429, then outputs that data in a compatible format along a set of data conductors identified generically here as cable 477A, which can be comprised of any number of conductors. Here, for simplicity, two conductors 477 and 479 are shown for reference, which might suggest two-conductor modem access to host device's data port 489.

For a Universal Serial Bus (USB) data connection, which offers the best inter-operability among a variety of host devices, four conductors are used for communications, linking adapter 481's comm. hardware/software 405C (which here supports USB element 405A only as a non-limiting example of a communications protocol other than powerline modulation) to data port 489 at host 417A, where USB element 405B is accessible. Power for the USB link is here assumed to be at USB 405B in host device 417A.

Adapter 481 (FIG. 14B) may also participate in power conversion, although that is not essential to the data re-direction process. Since M/D 463C does require power, a minimal regulator within adapter 481 is used (not shown here, but a more robust in-line adapter is depicted in FIG. 14I). One advantage of incorporating a power-conversion capability in an adapter 481 is that third devices 429 can be built with a generic single output voltage, instead of having an output of a regulator 405 which matches the input voltage requirements of a host 417A. Adapter 481 better addresses the variety of host input power requirements, at a lower-cost and in a potentially more portable form factor than a third device 429.

Adapter 481 in FIG. 14B operates by "stripping" a modulated data signal from powerline conductors 453 and 455. The power signal is then passed through the adapter unit and output along power-only conductor sets 483/459 and 485/461 to host 417A. The power signal output by regulator 405 at third device 429 is compatible with the input signal of host 417A, therefore, no intermediate regulator at adapter 481 is required.

Note that power connector 487 is representative of the battery contacts of host 417A. This allows either battery source 415, or regulator 405, to power host 417A. When regulator 405 is the source of power, its power signal output "mimics" that of a battery 415.

An external, in-line adapter 481 in FIG. 14B also resolves the issue of third device 429 in FIG. 14A being a dedicated battery charger. With integrated power-conversion capability, adapter 481 fills the gap in system 402 of powering a host device, as well as charge batteries. Why not integrate adapter 481's capabilities into a device 429? That approach may limit the uses of such an external device, given the vagaries of addressable data ports among a wide variety of host devices 417A. Combine that with variations in host input voltage requirements, and the complexity of achieving the right combination of communication ports and correct host power input requirements points toward two separate devices. Having noted these issues, dual-mode third devices for charging and delivering power are addressed in FIGS. 15, 18A and B, and 19D.

As previously referenced, an external third device 429 in all of the Figures suggests a portable device. The connector interfaces presented herein are totally applicable to embedded systems, with a device 429 being part of a fixed installation. Examples are a battery charging station for handheld devices used by company employees, or even a charging station in an airport lounge where the public at large can recharge host devices such as laptops, cell phones, etc. In such public or open environments, intermediate adapters connected between an embedded charger 419 (or power supply 497 as in FIG. 14C) and a host device provide a convenient and straightforward means of delivering both power and data. Such multi-user approaches would require a highly adaptable and flexible embedded device 429. These are defined in other modalities of FIG. 14A through iterations of connectivity apparatuses described herein which enable a variety of devices to inter-connect.

Mixing Connectors and Connector-less

Enabling multi-device connectivity is not limited to hard-wired connectors. Connectivity solutions that use battery interface connectors—supplemented with "connector-less" wireless interfaces—enhance inter-device communications. Contemporary host devices, especially laptop computers, routinely come configured with infrared ports, and there are a variety of ways to connect radio frequency (RF) peripherals. Since the connectivity interfaces discussed throughout this document are highly dependent on existing data ports in host devices, so additional flexibility is achieved by incorporating wireless communication links as part of the overall connector apparatus and device interface system.

FIG. 14C shows an alternative to the four-device system 402 in FIG. 14B, with a battery source 415A, an external third device 429A, an intermediate adapter 481A, and a battery-powered host device 417B. Third device 429A replaces the previous battery charger of FIGS. 14A and B with a power supply 497, and also adds a wireless data I/O port 467. As used here, the term "power supply" differs from "regulator." Power supply means a source of power that has either a fixed output, or is controllable and configurable. A regulator has only fixed outputs. A power supply has at least two control-selectable outputs. Selectable control can be either via manual manipulation (plugging in an adapter cord that causes the power output to change, or rotating a dial-able selector), or via a more automatic processor/controller operation.

As a minimalist approach to reducing the number of conductors which inter-connect all of the devices, there are now only two wires between any two devices. Power modulation for data communications is shown between third device 429A and in-line adapter 481A, but that data path may be viewed as redundant since both adapter and the third device have wireless ports.

But, not all wireless ports are created equally. If the wireless platform is radio-based, RF connectivity between an adapter and an embedded device 429A can be costly to integrate. If the wireless platform is infrared (Ir), the cost to implement will be lower, but some infrared implementations may have signal-directionality issues. It is this directionality issue which makes powerline modulation a reasonable communications link between a moveable (portable) adapter 481A (FIG. 14C) and a fixed (or moveable) third device 429A.

There are alternatives to the directional infrared popularized by the Infrared Data Association (www.IrDA.org). Within the IrDA standards is a specification for "Advanced Infrared" (Air), which uses diffuse optics to fill a local 10-meter environment with data-enriched infrared. Advanced Infrared supports both multi-point peer-to-peer operations, as well as network architectures. Currently in final development, the IrDA specification is mature enough to provide a wireless platform suitable to the connectivity needs of the devices in FIGS. 14C, D, E, and I. Companies such as IrData (Irvine, Calif.), and Link Evolution Corporation (Tokyo, Japan) may provide further useful information to designers and builders.

Infrared technology from EFKON AG (Graz, Austria) also provides non-directional optical wireless links. NetSchools (Atlanta, Ga.) uses a quasi-directional infrared between dedicated laptops and a multi-node network, which operationally behaves somewhat like diffuse Ir. With either diffuse Ir, or RF, powerline modulation in the connectivity schemes discussed here may indeed be redundant, and the invention will still operate without data transferred across powerlines. However, until more mobile battery-powered host devices have fully integrated RF or Ir sub-systems, powerline modulation is supported in the present invention.

In all Figures which illustrate wireless device capabilities, the directional arrow indicators that show wireless data paths may not always depict every device-to-device (or network combinations) which can be achieved. For example, in FIG. 14E, wireless data path indicators 469 and 473 depict only data to and from a local network access point 471, but not any peer-to-peer data paths directly between devices 429D and 417D. Given variants in the way RF and Ir operate, as well as distinctions between multi-node peer-to-peer RF (as in "Bluetooth's" Personal Area Networks (PANs), and true RF LANs), accounting for these myriad combinations would overly complicate the Figures. Those skilled in the art of wireless communications can immediately grasp the variations from the Figures and accompanying descriptions.

Mixed Connectivity Operations

The connectivity operations of multiple devices shown in FIG. 14C, with both hardwired connector and wireless interfaces, are varied. In describing this variety in a non-limiting example, third device 429A is assumed to be an embedded source of power, with two data I/—powerline modulation, and a wireless link to either network 471A, or as point-to-point wireless to in-line adapter 481A, and/or host device 417B. Battery 415 has no data capabilities as shown here, although any of the "smart" batteries shown in other figures (especially FIGS. 15, 17, and 19A–D) are applicable also to FIG. 14C.

While battery 415A in FIG. 14C has no obvious data potentials, even a "dumb" battery makes information available. In particular, information about the power input requirements of its associated host device 417B. A/D converter 421 and processor/controller 423 gather battery output-voltage information, and transfer that data to adapter 481A. Adapter 481A receives information on battery voltage via powerline modulation, with a modulated signal sent from M/D (Modulator/Demodulator) 427 in embedded device 429A traveling along conductor sets 441/453, and 443/455 to adapter 481A. Modulator/Demodulator (M/D) 463E and processor 423F in adapter 481A reconstitute the received voltage information (reference adapter 420 in FIG. 141 to view the various internal electronics which may be incorporated into an adapter 481A in FIG. 14C).

Power supply 497 (FIG. 14C) has a fixed output voltage, so delivering a power signal to host 417B requires an intermediate power-conversion adapter 481A that configures its output to match the now known voltage value of battery 415A. Power supply 497 is capable of delivering either an AC or DC power-output signal, and adapter 481A is compatible as either an AC/DC, or DC/DC, conversion unit.

Wireless

A viable means of transferring battery voltage information between embedded device 429A and in-line adapter 481A in FIG. 14C is via wireless. Two possible generic wireless technologies are available: first, a direct link between wireless I/O port 467 at third device 429A, and compatible wireless port 467A at adapter 481A. This exemplifies a peer-to-peer direct link. Ir (infrared) is a logical option, because of its inherent one-to-one operations using the IrDA paradigm of pointing two devices at each other to create a wireless link.

A second wireless approach uses indirect links, via a network (represented in FIG. 14C asnetwork access point 471A). Even infrared devices which are limited to directional "point-and-shoot" operations using a narrow optical cone (typically 8–16 degrees), and a range of approximately one meter, can be networked. Companies like Extended Systems, Inc. (ESI) in Boise, Id. have local network access points that are positioned so that a user "points" a host device 417B (or, in the system architecture of FIG. 14C, an adapter 481A) at an access point. Access points such as those from ESI are cabled to a local hardwired network interface, so that local wireless data is transferred into a traditional hardwired network.

A more advanced approach, requiring less user involvement, is to use the diffuse characteristics of Advanced Infrared, or to implement RF LANs. NetSchoolsCorporation uses infrared technology that, while relying on a point-to-point communications link, uses infrared transceivers which can "look" in multiple directions for the optimum direct line-of-sight optical wireless link between a network access point (usually mounted on a ceiling for coverage of an approximately 10–15 square-foot LAN segment Ir zone) and any host devices within that zone. This hybrid quasi-directional infrared operates quite similarly to fully-diffuse Advanced Infrared, freeing users from the need to manually align two Ir devices. Spectrix Corporation (Mundelein, Ill.) has a diffuse Ir technology which may also be acceptable in the hybrid connector and connector-less apparatuses discussed here.

Network access point 471 in FIG. 14C is here depicted as a multi-directional device, suggesting RF, Advanced Infrared, Spectrix, EFKON or the NetSchools hybrid Ir technologies.

In the use of RF, Personal Area Networks (PANs), which cover a 10-meter local zone using low-power RF, also can serve as a wireless link between an adapter 481A and an embedded power-delivery device 429A. Intel's Bluetooth RF technology (www.bluetooth.org) provides a PAN that is quite suitable to the inter-device communications shown in FIG. 14C. Bluetooth supports a primarily multi-point peer-to-peer architecture, but the Bluetooth specification characterizes a quasi-network implementation. Either wireless approach, Ir or RF, can be integrated into a network architecture, or operate as a simple local inter-device peer-to-peer connection.

Host Operations

Host device 417B, as depicted in FIG. 14C, has no other data I/Os than a wireless data port 475E. So few communications I/Os are highly unlikely in the real world, so this limitation of a device 417B here is for illustrative purposes only. The role of a host device restricted to only a wireless port can be best understood by a real-world example of host operations.

In this non-limiting real-world example, host device 417B in FIG. 14C is a cellular phone which has an infrared data port that operates independently from the phone's primary RF communications. Nokia (Finland) manufactures such dual-mode cellular phones. In this example, phone 417B is to be used on a commercial aircraft, so the RF sub-system in the device cannot be operated. Therefore, the built-in Ir link 475E is the only data port that can be used in the environment.

Continuing this example, third device 429A is an embedded power system in a passenger seat. Power source 403 represents the aircraft's power-generation equipment, so that the power bus for handling passenger equipment is indicated as 465 in FIG. 14C. Power supply 497 is a fixed-voltage unit which outputs either 15 VDC, or 110 VAC at a passenger seat outlet port—here depicted as connector interface 407. This connector may be limited to only a two-conductor seat outlet, in which case only power conductors 441 and 443 are available. In the alternative, a multi-pin seat outlet connector interface is available, which allows for additional conductors 437 and 439. A passenger connects to seat port 407 with a mating connector 409, which may have more than two conductors available.

Adapter 481A in FIG. 14C, as previously noted, is either an AC/DC, or DC/DC power-conversion device, depending on the output of embedded power supply 497. In this cell phone example, adapter 481A may have a fixed power output which matches the requisite input of a host 417B. A configurable adapter adds more value to the communications capabilities of system 404 in FIG. 14C, so this type of power conversion capability is used in this example of real-world operations.

In this example, battery output voltage is acquired by the method already described in the section "Minimalist Wiring" above, wherein A/D converter 421 (FIG. 14C) and processor/controller 423 acquire battery output voltage directly from battery 415A, then communicate this information to adapter 481A, via modulator/demodulator 427. Powerline modulation along conductor sets 443/453, and 441/455 transfers battery voltage data to modulator/demodulator 463E in adapter 481A.

It is advantageous, but not essential to the operation of the invention, that host cell phone 417B in FIG. 14C store information about its battery 415A, and its own operational voltage for later retrieval. Therefore, adapter 481A transfers battery information to cell phone 417B wirelessly, from I/O port 467A to host I/O port 475E. Information about adapter's output voltage is also transferred across the same wireless link. If necessary, such information is also available to a local area network, via a communications link to access point 471. Embedded third device 429A receives confirmation of adapter 481A's successful power delivery either by powerline modulation, along conductor sets 441/453, and 443/455, or wirelessly from adapter's port 467A to embedded device's port 467.

A Second Operational Scenario

Another basic example of operations across a multi-connectivity communications system 404 in FIG. 14C illustrates the flexibility of a hybrid connector and connector-less apparatus. Using the same on-aircraft model of a cellular phone as a host 417B, communications is through both wireless links, and via hardwired connector-based infrastructures that support powerline modulation. A user of cellular device 417B wishes to place a phone call while traveling aboard an aircraft. Since the primary RF system in the cellular phone cannot be activated because of aviation regulatory restrictions, the phone's infrared sub-system is employed. Cell phone 417B has a "hands-free" headset (not shown) which allows a user to place the handset in a location where the phone's directional infrared I/O port 475E can establish an Ir link with port 467A of portable adapter 481A. User's phone call travels via infrared from phone handset 417B to nearby external adapter 481A, then the voice data (it's a digital phone) transfers to embedded device 429A using high-speed powerline modulation along conductor sets 441/453 and 443/455 (as previously referenced, Intellon Corp. has chips and a reference design for 11 Mbps powerline communications, both for AC and DC power infrastructures).

User's phone conversation is then transferred wirelessly from the local embedded passenger seat environment of third device 429A at I/O port 467 to the aircraft cabin's wireless network, via a network access point 471 along a path indicated in FIG. 14C by bidirectional arrow 469.

Thus, implementations, such as the two non-limiting ones cited above, show the various operational modes achieved in a hybrid powerline-modulated and wireless system, as typified in FIG. 15C.

Variants

Figure 14D:
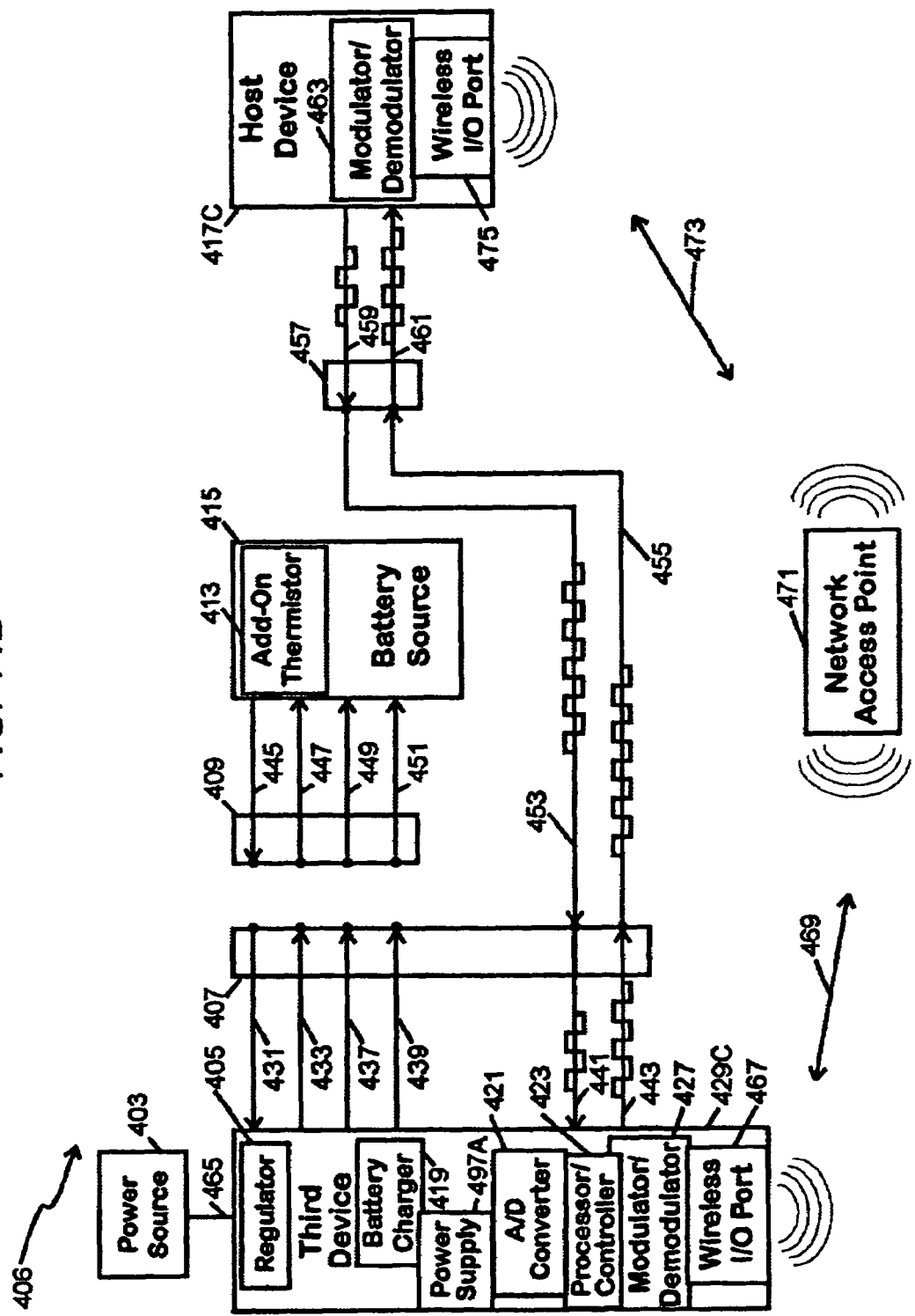
FIG. 14D is a diagrammatic view of connector and wireless apparatuses for three devices to interact.

FIG. 14D is a variant of previous multi-device interconnections, primarily those already discussed relevant to FIGS. 14A and C. The operation of aftermarket-applied thermistor 413 on battery 415 has already been discussed in FIG. 14A. Battery charger 419 also has been detailed in the discussion of FIG. 14A.

Third device 429C in FIG. 14D combines the internal electronic elements of FIGS. 14A with a wireless I/O port 467 and a power supply 497A. However, unlike fixed-output power supply 497 in FIG. 14C, which requires an external adapter 481A, power supply 497A is capable of having its output configured according to voltage information of battery source 415.

Once A/D converter 421 has acquired at least one battery output-voltage reading along conductor sets 449/437 and 451/439, processor/controller 423 is used to configure the output of configurable power supply 497A. As with FIG. 14A, host device 417C has an integral modulator/demodulator 463, as well as a wireless data I/O port 475E, per FIG. 14C. As with FIG. 14A, one method of communications between third device 429C and host 417C (FIG. 14D) is via powerline modulation along power/data conductor sets 441/453/459, and 443/455/461, the operation of which has already been covered. A wireless network is also represented by network access point 471, which is addressable directly from either wireless port 467 in third device 429C, or from host 417C's wireless port 475D. The link is here depicted by bidirectional arrows 469 and 473.

The overall emphasis here is again the minimal number of conductors required to connect the three devices into a combined communications and power delivery system 406 in FIG. 14D. In a non-limiting example of another operational mode, host 417C has access to battery temperature-monitoring data from add-on thermistor 413 along conductor sets 445/431 and 447/433. Processor 423 transfers acquired temperature data either along conductor sets 441/453/459, and 443/455/461 using powerline modulation or a wireless option is also available (which minimizes the need for a host device 417C to have an integrated modulator/demodulator 463 that is addressable from its battery port connector 457).

Note that conductors 453 and 455 in FIG. 14D do not represent actual wires in the circuits depicted, but rather only serve to indicate inter-device connectivity. In reality, the lower section of connector block 407 mates directly to connector block 457 (reference connectors 199a and 119b in FIGS. 8A and B, for example). Note also that connector 457 is physically located in host 417C's battery bay 417J, and mates with battery connector 409 when a third device 429C is not present.

Modulator/demodulators are low cost and relatively easy to integrate into devices such as laptop computers, for example, so device designers that implement M/Ds will find powerline modulation worthwhile. Certainly powerline modulation, in combination with wireless data, affords local two-wire data connectivity and is easily combined with medium-range wireless communications.

In the wireless implementation, connector system 406 in FIG. 14D assumes that third device 429C is embedded. Therefore, wireless port 429C may not be directly accessible for a short-range infrared "point-and-shoot" data link. This assumption does not necessarily preclude the ability for I/O port 467 to be physically located where a user can connect to it by aligning the Ir beam of host's I/O port 475D.

Relating to infrared range and distance, designers implementing the various data interfaces and connection apparatuses discussed herein may benefit by the characteristic of an IrDA-compliant infrared I/O port to operate at zero distance ("glass-to-glass" proximity) to another. Since approximately 1997, all devices that support the IrDA standard (www.irda.org) operate when two physical Ir ports are positioned to literally have their optical lenses touching each other ("glass-to-glass").

In designing and building such devices as illustrated in the Figures cited throughout this document, a peripheral device such as an adapter 481A (FIG. 14C) can be attached to a host device so that its Ir port optics come in physical contact with a host-device's Ir port. This eliminates a need to have a user establish a directional alignment of two wireless devices that are spaced some distance apart. In this embodiment, a wireless link does take on the characteristic of a mate-able connector interface . . . an unusual mixture of the best of connector design and wireless connectivity.

In the real world, an example of how such a "glass-to-glass" connection enhances a user's communications experience is on commercial aircraft, where vibration may cause two Ir devices separated at a distance on a food service tray to move out of alignment. Also, given the limited space available to a passenger, an adapter 481A (FIG. 14C) can be designed so that it remains physically attached to a host device (such as a laptop computer, for example) and maintains the wireless Ir link even while a passenger is repositioning a host device (see U.S. patent application Ser. No. 09/193,790, "Universal Power Supply," filing date Nov. 17, 1998, based on U.S. Provisional Application No. 60/065,773, Nov. 17, 1997; U.S. patent application Ser. No. 09/475,946, "Hardware for Configuring and Delivering Power," filing date Dec. 31, 1999, based on U.S. Provisional Application No. 60/114,412, Dec. 31, 1998; and U.S. patent application Ser. No. 09/475,945, "Software for Configuring and Delivering Power," filing date 31 Dec. 1999, based on U.S. Provisional Application No. 60/114,398, Dec. 31, 1998.

Battery-Centric Connectivity

Until now, the strategic importance of a power and data I/O interface that connects a battery and its host device has not been fully exploited. A laptop computer's battery bay reveals another overlooked combined power-and-data port. The advent of data-enabled "smart" batteries has created one of the most ubiquitous I/O ports found on almost every type of electronic equipment. As has been shown again and again in this document, the untapped battery-to-host connector can serve multiple external devices that performs both battery-centric as well as host-specific functions, without the need to add another I/O port to a host device. Combine this with the fact that a rechargeable battery is user removable and replaceable makes a battery connector in any host device a new interface for both power and data functions.

Figure 14E:
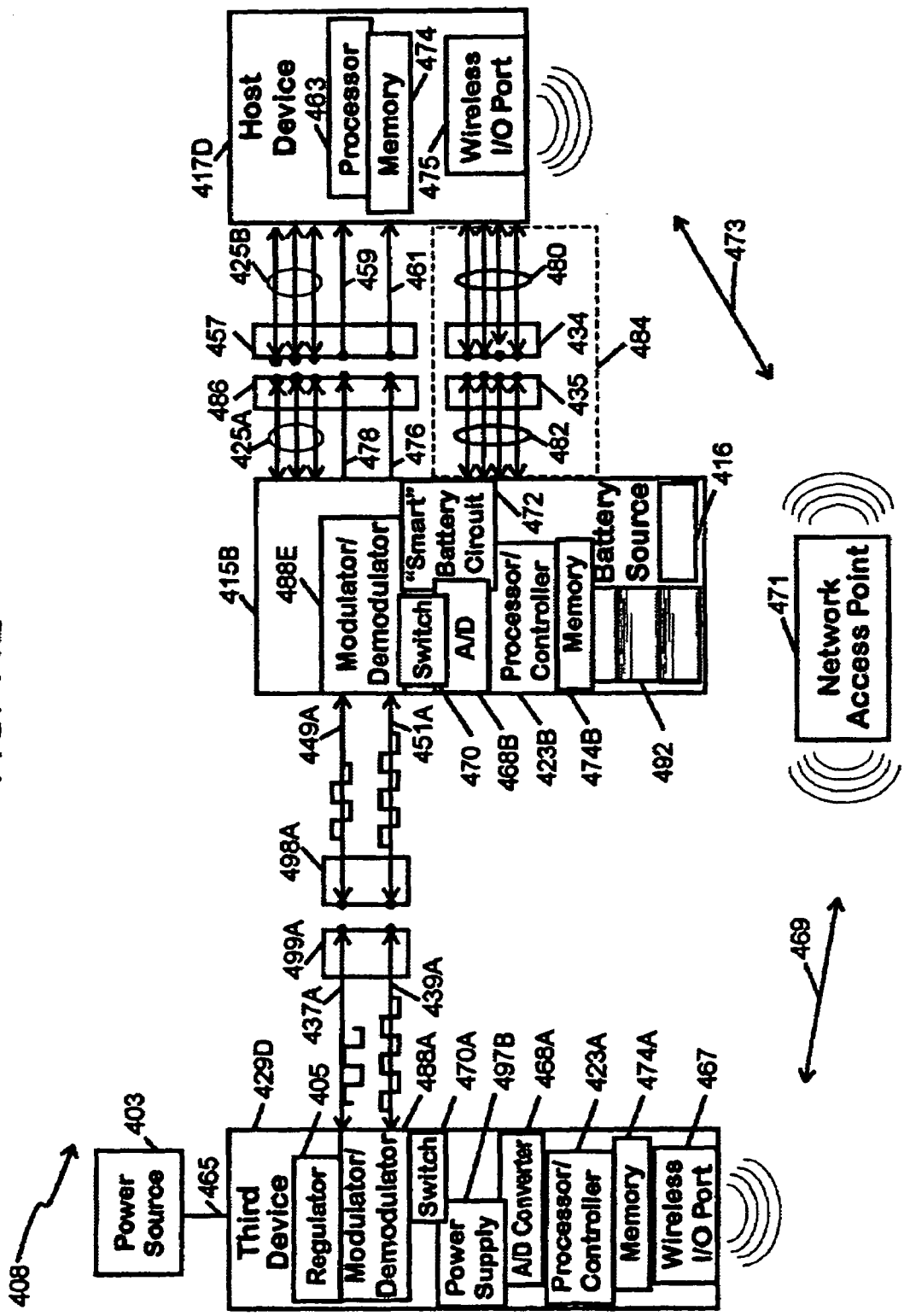
FIG. 14E depicts a block diagram and wiring scheme showing several battery-to-host interfaces.
Figure 14I:
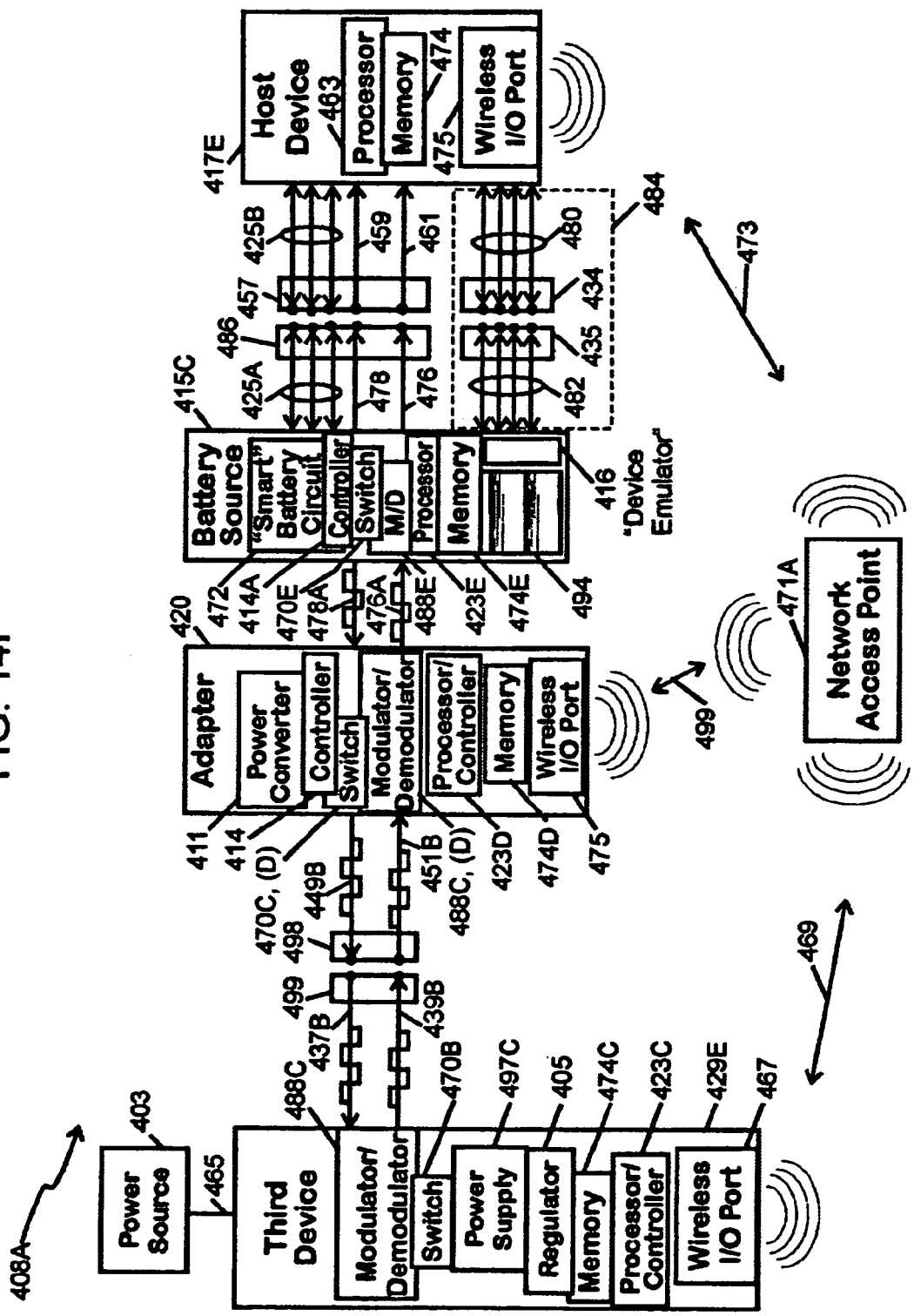
FIG. 14I diagrammatically represents connectivity among multiple devices, including a power-conversion adapter using powerline modulation.

FIG. 14E illustrates a multi-device connection system 408 which is comprised of a typical "smart" battery circuit 472. Such a circuit is, for purposes of this discussion, assumed to include a processor/controller 423B, an A/D converter 468B, and memory 474B with available addressable blocks to which data is written. Designers and manufacturers working with a battery pack of the invention should review the available memory in such circuits, since present SMBus specifications have a considerable number of memory addresses and registers pre-assigned. Memory expansion, if required, should anticipate the full range of functions a battery 415B may perform.

Battery source 415B in FIG. 14E also integrates a modulator/demodulator 488E for battery-to-third-device 429D communications, using powerline modulation for inter-device communications along conductor sets 437A/449A, and 439A/451A. Battery 415B's A/D converter 468B and processor 423B are used in conjunction with M/D 488E.

Communications Interface Switch

The function of a controller may not always be present in a "smart" circuit 472 in FIG. 14E. A controller function is indicated, as part of processor/controller 423B, but it can be eliminated if an onboard controller is already available as part of "smart" battery circuit 472. One use of a controller 423B is to operate a switch assembly 470. The primary purpose of a switch assembly 470 is to configure power and data paths among the available attached devices. Given that only two conductors are used to inter-connect three devices (third device 429D, battery 415B, and host 417D), and that each device has either (or both) power and data requirements across various operational modes, a switch assembly 470 to configure the limited number of available conductors is essential.

Note that the three representative switch assemblies depicted in FIGS. 14F, G, and H are simplified. The data conductor sets 425A and B of FIG. 14E are not shown, for example. To avoid graphic complexity, the three switch assemblies represent only powerline modulation for data communications. Those skilled in the art will readily be able to incorporate any other data conductors into these switch assemblies.

Non-limiting examples of such a battery switch assembly 470 in FIG. 14E are detailed in FIGS. 14F, G, and H, to better illustrate the various device states and active conductors. A second switch 470A (FIG. 14E) is located in third device 429D, which is configurable by means of controller 423A, to create conductive paths corresponding to those established by battery switch assembly 470. The switch assembly shown in FIGS. 14E, F, G, and H is not the only possible way to configure conductors, and those skilled in the art can design switches for specific functions and operations, both for battery 415B and third device 429D, based on the examples in FIGS. 14F, G, and H.

For purposes of this example in FIG. 14E, battery 415B is assumed to be a Master, and third device 429D is a Slave (see www.SMBus.org for info on registering bus-compliant slave devices).

First Switch State: HOST OFF

Battery switch assembly configuration 460A in FIG. 14F establishes a default switch setting. This default configuration is what a switch assembly 470 returns to whenever a battery 415B is not powering its associated host device 417D (FIG. 14E), i.e., a host is in its OFF state. Circuitry within battery 415B can detect a connection to its host, and further differentiate a HOST OFF from a HOST ON state. This can be achieved quite simply by having A/D converter 468B in battery 415B sample line load (current) at conductors 478 and 476. If host 417D is turned ON, the detectable current flowing from battery 415B to its host 417D is distinguishably different than when a host is in an OFF state. Some smart battery circuits may already have such built-in hardware (and software) to monitor battery load, since such load monitoring is routinely used to establish relative "fuel gauge" readings (i.e., remaining battery capacity).

Battery power is always available from battery cells 492 (FIG. 14E) to power host 417D. In a first switch state (default) expressed by switch assembly configuration 460A (FIG. 14F), host device 417D has battery power available from battery cells 492 first along switch conductor 444, then along conductor 442 to a switch contact 422 so that, when multi-contact switch 410 is in the position indicated, moveable switch beam contact 412 transfers power to first primary powerline 476 to host 417D. Further, power from battery cells 492 also flows along conductor 430, which is directed to multi-contact switch 410 by electrical branch line 426 that terminates as a switch contact, so that positionable switch beam contact 418 of multi-contact switch 410 transfers power to second primary powerline 478 which leads electrically to host 417D.

Only by actuating controllable multi-contact switch 410 in switch assembly 470 (FIGS. 14F, G, and H) can a circuit between battery cells 492 and host 417D be broken. Since switch 470 is designed to default to a configuration 460A (FIG. 14F), any potential failure in other switches would still allow battery 415B to power its host 417D (as shown in FIG. 14E).

In a state in which battery switch assembly 470 is in its configuration 460A (FIG. 14F) and host 417D is turned OFF, when a third device 429D is attached, the battery source's A/D converter 468B (FIG. 14E), and related processor/controller 423A are configured to immediately sample voltage across powerline conductor sets 437A/449A, and 439A/451A. If battery switch assembly 470 is configured as in FIG., 14F, battery cells 492 are delivering a voltage across the powerline conductors 449A and 451A now being sampled by third device 429D. Power from cells 492 flows along switch conductor 444, to conductor 442 and, at first single-pole switch 446 which is closed, power is transferred to conductor 452, which is electrically connected to primary powerline 451A directed to third device 429D. A second set of conductors from battery cells 492 further transfers power along conductor 430 to two-pole switch 496, where positionable contact beam 432 transfers the power signal to conductor 436, then power travels along conductor 464, which becomes main powerline 449A to third device 429D. If line voltage is detected once third device 429D is electrically connected to battery 415B (see FIG. 14E), third device's processor 423A now determines that the present state of host 417D is OFF.

Switch assembly 460A (FIG. 14F) provides a battery output-voltage signal to third device 429D. Line voltage readings by A/D converter 468B, and processor 423A in third device 429D (FIG. 14E) serve two purposes: first, to verify the state of battery 415B and host 417D, and, second, to also determine the voltage of battery 415B. The acquired voltage is analyzed by processor 423A for compatibility with the operational output-voltage range of configurable power supply 497B. If a compatible output voltage from power supply 497B is available, a communications session with battery 415B can be established.

If the acquired battery voltage is not within power supply 497B's operational Vout parameters, device 429D will not be able to configure itself for either power delivery operations, or a powerline-modulation communications session.

Since third device 429D is designed to acknowledge all valid battery voltages, and power supply 497B supports that spectrum of voltages, such a voltage mismatch is an indicator that a user has attached device 429D to an invalid battery. This situation might occur because there are multiple third device 429Ds in the marketplace, each built to address a specific class of battery-powered products. One model of such a third device may service only laptop batteries (at voltages of 10 VDC and above), while another model of device 429D is purpose-built to service only cellular phone batteries (at voltages below 10 VDC). In this example, using switch configuration 460A, which causes battery voltage to be identified as a first state, proves an effective way to pre-screen potential attached-third-device mismatches.

Second Switch State: HOST ON

The previous discussion of a HOST-OFF First State of all devices in FIG. 14E, especially switch assembly 470's configuration 460A (FIG. 14F), leads to understanding further device states.

When a user turns ON a host device 417D, a battery 415B configured as indicated in FIGS. 14F and G can detect this change of state. Battery's A/D converter 468B and processor/controller 423B monitor line load. An obvious and unambiguous change in the electrical current draw of a battery occurs when a host device 417D is turned ON. A/D readings of electrical current at primary powerline conductors 478 and 476 will indicate that a host device is operational.

In response to a change of state in host device 417D as it turns ON (FIG. 14E), battery controller 423B changes switch assembly 470 from a configuration 460A (FIG. 14F), to switch assembly configuration 460B in FIG. 14G. Note that the changes in switch configuration alter the positions of switches 456, 446, and 496. Multi-contact switch 410, which controls power from battery cells 492 to host 417D is not altered, thus ensuring uninterrupted battery power to a host device 417D.

Two-pole switch 496 (FIG. 14G) has been reconfigured to now be electrically active to conductor 438, which powers modulator/demodulator (M/D) 488B. Second-pole switch 456 now has its positionable contact beam 454 in electrical contact with conductor 458, which brings M/D 488B online. M/D 488B has a communications path to third device 429D via powerline 451A through closed switch 456, and the second conductive path from M/D 488B includes conductor 462, which is electrically connected to conductor 464 as the same conductor identified as powerline 449A.

First single-pole switch 446 (FIG. 14G) is now also in an open position, so that primary powerlines 451A and 449A (between battery cells 492 and third device 429D) are electrically isolated from any other battery devices (except M/D 488B), ensuring a totally clean pair of conductors for powerline modulation. In this state in FIG. 14E, there is no power on powerlines 437A, 449A, 439A, and 451A between third device 429D and battery source 415B.

The indicated changes in conductive paths shown in FIGS. 14F–H made in configurable switch assembly 470 when host 417D is ON do alter what happens when a third device 429D is attached while a host device 417D is operational. External third device 429D can readily identify the configuration 460B of battery switch assembly 470 (FIG. 14G) as distinctly different from the First State, when switch assembly 470 was in configuration 460A (FIG. 14F). Active battery voltage along conductor sets 437A/449A, and 439A/451A (FIG. 14E) was detectable in the HOST-OFF state, but when switch assembly 470 changed to its 460B (FIG. 14G)

configuration, first single-pole switch 446, and two-pole switch 496 went to open positions, electrically isolating battery cells 492 from the conductors leading to third device 429D. Thus, once connected when host 417D is turned ON, a third device detects no voltage on its powerlines. These two distinct powerline states, with either active voltage or no voltage at all, are the only two voltage states that a third device 429D needs to differentiate upon being connected to a battery 415B (FIG. 14E).

It may be argued that third device 429D cannot differentiate, by checking for voltage along powerlines 437A/449A, and 439A/451A (FIG. 14E), the difference in states between battery switch assembly 470's configuration 460B (FIG. 14G) and configuration 460C (FIG. 14H). The answer is simply that third device doesn't have to concern itself with such distinctions. Battery 415B (FIG. 14E), as a Master, controls switch assembly 470. Battery processor/controller 423B would not configure switch 470 to configuration 460C (FIG. 14H) without a prior communications session with third device 429D. Without a communications session which, among other points, is what battery 415B uses to determine that there is actually a third device 429D connected, battery processor 423B does not set multi-contact switch 410 in switch assembly 470 in the configuration shown in FIG. 14H. To do so would pose a definite risk that a user might turn ON host 417D without there being a confirmed source of power from third device 429D. Therefore, third device 429D can freely apply output power at any voltage along the powerlines between it and battery 415B, without any concerns that battery switch assembly 470 will be in any other configuration than 460B (FIG. 14G).

In a Second Switch State, third device 429D (FIG. 14G) now has information that battery 415B is powering its associated host device 417D, and that the host is turned ON. Further, there is a clear electrical path to battery's M/D 488B, so that third device 429D can initiate a communications session with battery 415 (FIG. 14E). On the part of battery 415B, its processor/controller 423B (FIG. 14E) is waiting for a communications session to commence. Data lines 466A and 466B from M/D 488B (FIG. 14G) electrically connect to battery's processor 423B, along which data is transferred to and from M/D 488B.

Note that, because there are no active power signals along powerlines 437A/449A, and 439A/451A (FIG. 14E), other two-conductor data communications protocols between a battery 415B and a third device 429D can be used, such as traditional CODEC-based modem communications, or simple TTY, as two possible alternative implementations.

Switch 470A in third device 429D (FIG. 14E) is not defined here. This switch only functions to take M/D 488A in and out of the powerline path. Power supply 497B is always electrically connected to primary powerline conductor sets 437A/449A, and 439A/451A.

Third device 429D initiates a communications session by applying a pre-determined voltage along powerlines 437A/449A, and 439A/451A (FIG. 14E). The communications-session voltage may be different than that used by third device 429D in FIG. 14E to power a host device 417D. This is likely to be driven by the availability of M/D modules that can operate at battery-specific voltages. By isolating these powerlines during a communications session, it is not essential that powerline modulation communications with a battery device be conducted at voltages that match a particular battery pack's voltage. This feature provides much better flexibility in designing such interfaces and devices.

Since these powerlines are isolated from a battery 415B's (FIG. 14E) activity of powering a host device 417D, extended communications between a third device 429D and a battery 415B can take place without disrupting power to host 417D. Furthermore, this electrical isolation allows a battery 415B to multi-task with data, carrying on an independent communications session with host device 417D along "smart" battery data bus lines (collectively as 425A and 425B in FIG. 14E), while concurrently participating in another independent communications session with third device 429D along powerlines 437A/449A, and 439A/451A.

Third Switch State: Powering A Host

Once a communications session between third device 429D and battery 415B (FIG. 14E) is terminated, a third switch assembly 470 state is available. Power supply 497B delivering power to host device 417D is the remaining function that switch assembly 470 enables.

FIG. 14H illustrates the switch positions that create conductive paths between third device 429D's power supply 497B (in FIG. 14E) and host 417D. Specifically, a power signal from power supply 497B (in device 429D as shown in FIG. 14E) travels along powerlines 437A, then 449A into battery switch assembly 470 at continuing conductor 464 (see FIG. 14H) which leads directly to switch contact 428. With multi-contact switch 410 configured as in FIG. 14H, switch contact beam 418 transfers the power signal to powerline 478, then finally along powerline conductor 459 (FIG. 14E) into host 417D.

A second power signal from power supply 497B in third device 429D travels first along powerlines 439A and 451A into battery switch assembly 470 (see FIG. 14E), where the power signal then flows along conductor 450 to switch contact 424 (in FIG. 14H). Switch contact beam 412 then transfers the power signal to powerline 476, which then becomes powerline conductor 461 in FIG. 14E to host 417D.

In FIG. 14H, switch configuration 460C, battery cells 492 are directed to powering M/D 488B along conductors 444 and 440; and also along conductors 430, through two-pole switch 496 along its positionable contact beam 432, then along conductor 438. This makes M/D 488B available for powerline modulation, which can be initiated by closing second single-pole switch 456 (shown open here). In this scenario, it is assumed that powerline modulation along active conductors between third device 429D and host 417D can take place at the voltage being output by power supply 497B.

If such functionality is desired, and power supply 497B and battery cells 492 (FIGS. 14E and H) have compatible voltages, the design of a controllable switch assembly 470 can be simplified, as there is no need to have discrete conductive paths for battery 470 and power supply 497B. What may be sacrificed is the capability to build a third device 429D that can be used with a wide variety of batteries (and hosts) that operates across a broad spectrum of voltages.

Note that FIG. 14E does not show a modulator/demodulator (M/D). Reference FIGS. 14A and D for a host device which incorporates an M/D.

Wireless Links

As previously discussed in reference to FIGS. 14C and D, multi-device connectivity includes wireless interfaces. In FIG. 14E, a third device 429D, and host device 417D, are equipped with wireless data I/Os 467 and 475C, respectively. The optimal choice of wireless platforms, whether it be RF or infrared, are driven primarily by the location of a third device 429D.

If third device 429D is embedded, so that optical-link access is limited, RF solutions are a logical choice. If the entire construct 408 in FIG. 14E includes a network, then issues of node-device density may favor infrared, because degradation of data throughput with Ir doesn't occur as a function of a large numbers of users (node density). If peer-to-peer connectivity is desired, so that host 417D can communicate directly with local third device 429D, then RF-based "Bluetooth" as a Personal Area Network (PAN) is a rational choice. Should third device 429D not be embedded, infrared (Ir) is usually less expensive than RF, and it has the ability to contain data dissemination to a confined area. Ir offers a reasonable combination of peer-to-peer connectivity and networking capabilities. Designers should evaluate their choices of wireless links based on these and other parameters.

Unrecognized Data I/O

FIG. 14E illustrates a data I/O assembly 484, which represents an unrecognized existing port that can be adapted to function as a viable battery-to-host communications interface. The specific number of conductors identified generically in assemblies 480 and 482 are determined by the unique device which attaches to the pre-existing battery bay connector 434. In some battery-powered devices, the bay in which a removable battery resides has a second connector 434 for a removable peripheral. Swappable multi-device bays that accommodate a battery pack, floppy drive—and perhaps a CD-ROM drive—have become fashionable in laptop computers, where the perception of thinner form factors and lighter weight are important. By integrating several peripherals into shared bays when a battery isn't installed, the design goals of thinner and lighter are achieved. A secondary effect of these design efforts is that a given peripheral bay may have two or more connectors, e.g., 452 for a battery and 434 for a peripheral, in close proximity to each other, so that the bay in which a battery fits also has an accessible connector 434 for a swappable floppy drive, ZIP drive, CD/DVD drive, etc.

To exploit these available data ports, a mating physical connector interface 435 in FIGS. 14E and I normally for attaching a peripheral is integrated into a battery's plastic housing (enclosure). This results in two connectors on a battery pack—the battery's power (or power/smart battery data) connector 486, and a second connector 435 which was originally intended to be the interface for a peripheral, such as a removable floppy drive. When a battery thus configured is inserted into a shared-device bay, these two connectors are mated—the battery connector set 486 mated to 457 for power (and smart battery data), as well as a second connector set 435 and 434 normally used by an interchangeable peripheral device.

This extra connector is needed because, internal to a host device, data coming in through the smart battery connector port is restricted to the local power sub-systems data bus. The power sub-systems bus is isolated from the open data busses of the host device, such as the PCI bus. Thus, data coming into a host device through a smart battery data interface is not readily available to user applications or the operating system, because the data paths in the power bus architecture are a closed system.

Note: The smart battery bus standards body has proposed that battery data be accessible at a main data bus. This would allow the operating system and applications to handle battery-communications data. Designers and builders are referred to www.smbus.org for further relevant developments.

To access host-device functions on open data busses, such as being able to display, manipulate, and store data, a bona fide data bus such as PCI must be available to a battery (and beyond to external third devices). An adjacent connector in a battery bay 417G (FIG. 14E) that usually attaches a swappable floppy drive to the host system, for example, provides an interface and path to the requisite data buses, as well as processor 423J and E, respectively, and memory 474 in FIGS. 14E and I.

To activate a peripheral connector 435 (FIGS. 14E and I) so that data can be transferred necessitates a "device emulator" 416 within the battery. A host system (including processor 423J and E, respectively, and memory 474) must recognize the device emulator as a valid floppy drive, for example. While all floppy drives may appear to have commonality, they usually are only pin compatible, but are rarely fully interchangeable. Device drivers are one level of proprietary implementations which need be addressed in building a device emulator. Specifications from the manufacturer of a particular host device are useful in building a device emulator. Also, information from third-party vendors that build peripherals such as external floppy drives, CD-ROM drives, etc., that connect to serial and parallel ports will assist designers in understanding how to work with different data I/O ports (435 and 434) pin outs and drivers for peripherals such as a modified battery pack 415C in FIGS. 14E and I.

Because battery shapes and sizes are almost never interchangeable, a host-specific device emulator 416 that only works with a particular host will be the norm for designers and manufacturers of such devices.

Detailing such an emulator 416 is beyond the scope of a document that addresses apparatuses for connecting multiple devices. However, these unrecognized data I/Os that reside in a vast number of laptop computers and other consumer devices are worth pursuing by product designers.

The removable battery platform that is part and parcel of this document includes the untapped peripheral connector interfaces. Throughout this document, an emphasis is placed on creating functionality between and among devices which were manufactured with limited data (and/or power) functionality. This is particularly true in the case of an available (but "hidden") peripheral I/O port buried inside a battery bay.

Thus, a smart battery communicates its power-specific data to the smart battery bus via an available battery interface (connector set 486 and 457 in FIG. 14E), while also communicating relevant data to the host system at large via a peripheral-device connector 435. By accessing this previously undiscovered second connector, operations such as flashing a screen prompt to alert a user of a potential battery problem are viable. No longer is smart battery information restricted to a proprietary closed battery bus.

Further, third devices, and even external adapters 420 as in FIG. 14I, now have access to host device hardware and software via this new connectivity through a peripheral port 434. Operationally, third devices and intermediate in-line adapters access the host operating system of a host device 417E for power-configuration information. For example, adapter 420 queries memory 474 at host device 417E to ascertain whether battery 415C is being charged by an external adapter (reference external power unit 366C in FIG. 13 and the related discussion in the section titled "FIG. 13"). Were an external power unit connected to a host device 417E, battery 415C (FIG. 14I) would be charging along power conductor sets 459/478 and 461/476. Also, data conductor sets 425B and 425A would also be in use. Any attempt to deliver power to host 417E would cause contention with the charging process. In this scenario, adapter 420 has no access to host device 417E through the battery-tohost interface 486/457. However, adapter 420 safely accesses host 417E through the alternate data interface assembly 484, without any risk of interfering with the charging process that is taking place. Adapter 420 also accesses host 417E's memory 474 and processor 423E via wireless port 475B. This wireless link can be peer-to-peer directly with host's wireless I/O port 475A, or indirectly through a network accessible to both wireless ports 475A and B via network access point 471A. These network links are depicted in FIG. 14I as 499 and 473.

The communications path between adapter 420 and host 417E is as follows. Processor 423D at adapter 420 initiates a data signal via modulator/demodulator 488C (or D). The modulated signal travels along conductors 476A and 478A to modulator/demodulator 488E at battery 415C, then is transferred to processor 423E.

Processor 423E at battery 415C then accesses controller 414A to activate switch 470E, selecting a signal path to conductor set 482. Conductor set 482, and its related connector 435 are, in this non-limiting example, configured to be pin compatible with host's connector interface 434. Connector 434 is located in the multi-device battery bay 417F of host 417E and it is normally the connector for a removable floppy drive. Since battery 415C is currently occupying the battery bay 417F, the floppy drive unit is not present, of course.

The "device emulator" 416 at battery 415C (FIG. 14I) represents circuits and software that allow battery's second I/O port 435 to mimic a floppy drive that is recognizable by host 471E at its floppy drive port 434. Thus, the data signal which originated at adapter 420 is transferred to host 417E via connector assembly 484, as if the data were from a floppy drive, and not battery 415C. Processor 423E at host 417E receives the data signal as if it is reading from a floppy drive.

Thus, the unique attaching of a second connector 435 to a battery housing, and the inclusion of hardware and software in a smart battery 415C create a new and previously undiscovered data path between a variety of external devices and a host device 417E. This new communications path, and any equivalents, create new functions and features for product designers, builders, and software developers.

Maximized Connectivity

FIG. 14I represents an example of maximized connectivity among four devices, incorporating both wired and wireless communications links. Since many of the interfaces and operations depicted in FIG. 14I have already been discussed, the focus here is on an add-on multi-function adapter 420.

Multi-function adapter 420 is interposed electrically between a third device 429E and "smart" battery 415C in FIG. 14I. As a multi-function device, adapter 420 operates as a power conversion unit which can be built to receive from third device 429E either (but not both) an AC, or DC input, then output at power supply 411a DC power signal to battery 415C (and to host 417E). If adapter 420 is operating as an AC/DC conversion device, AC power source 403 feeds power signals directly into powerline conductor sets 437B/449B, and 439B/451B for power supply 411 to convert the AC signal to DC. As a DC/DC power-conversion unit, the power to adapter 420 is delivered by power supply 497C in third device 429E, along the same conductive path.

As previously discussed, the output of both power supplies 497C and 411 (FIG. 14I) may be either a fixed voltage, or variable (configurable). Power supply 497C (or 411) provide sources for a power signal onto which a data signal is modulated. Since adapter 420 may be from a different manufacturer than that of a third device 429E, the best approach is to design in power supply 497C and 411 with configurable power signal outputs. Both devices incorporate a processor/controller function 423C and 423D, and adapter 420 is shown with a second controller 414 which is accessible to either switch 470C(D) and power supply 411. This second controller 414 also may represent a second control function of processor/controller 423D.

Also, adapter 420 has two communications modalities: Powerline modulation via modulator/demodulator 488C (or D), and wireless data via wireless I/O port 475B. In that adapter 420 is interposed in-line between two communications-compatible devices, third device 429E and smart battery 415C, the configuration and operation of switches 470B, C, D, and E are based on the guidelines expressed in the description of switch configurations in FIGS. 14F, G, and H. It should be remembered that adapter 420 does not have a self-contained source of power. Unless power from power supply 497C in third device 429E, or from power source 403, is active, adapter 420 has no means of powering its processor/controller 423D, nor can it control its switch assembly 470C (and D).

Further, there may be AC power on powerline sets 437B/449B, and 439B/451B, while the power output of adapter 420 to battery 415C is always DC (see FIG. 14I). Should conditions exist wherein there is AC input to adapter 420, adapter 420's powerline modulation circuits should address two discrete communications sub-systems. Each communication sub-system resides on either side of power supply 411. On the input side of power supply 411 resides powerline modulation across AC powerlines. Downstream of power supply resides a second powerline modulation (see M/D 488C) sub-system that operates across DC line voltage. For the most part, the downstream sub-system can follow the configuration of switch assembly 470 in FIGS. 14F, G, and H, with a second M/D designated as 488D in FIG. 14I.

If both input and output power signals are DC, switch 470C (470D if a second switch is used) and the wiring to M/D 488C can be designed to allow data from third device 429E to flow through adapter 420, bypassing adapter M/Ds 488C (and/or D) and related communication circuits, to be received directly by battery 415C. FIG. 14I shows two item numbers for a modulator/demodulator (488C and 488D), and two drawing identification numbers for a switch assembly (470C and 470D), to indicate a possible need to incorporate two powerline modulation sub-systems. A first switch and M/D serves as a dedicated communications link between third device 429E and adapter 420, while a second switch and M/D is for a dedicated communications link between adapter 420 and battery 415C.

Because of the inherent flexibility of wireless links, adapter 420's wireless I/O port 475B is simply an addressable device in a wireless environment, having its own device ID. The assumption in FIG. 14I is that the choice of wireless implementation will resolve in either (or both) a network architecture, represented by network access point 471A, or a number of possible peer-to-peer links. Wireless network links are here suggested by bidirectional arrows 469, 499, and 473.

Multi-Function Systems

Third device 552 in FIG. 15, as a non-limiting example of intra-device connectivity, performs two primary operations in "smart" data and power system assembly 550. First, "smart" battery charger 565 delivers a charging signal to "smart" battery source 558. Second, external third device 552 is capable of either simultaneously—or independently—also powering host device 562.

Among the advantages of such a multi-functioned third device 552 are that it eliminates the need for a charging circuit in a "smart" host device 562. Charging circuits are complex, especially for "smart" battery systems, so there is the risk of having an entire host device disabled because its battery charging circuit failed. An external charger 565 is easily replaced, without the inconvenience and delay of having to send a host unit to a repair facility. Charging circuits, while not extremely large, do take up space in a host device 562, complicating any product size (and weight) issues.

Probably one of the least-recognized advantages of an external charger is that it can be updated to work with new battery chemistries, while an integrated charging sub-system must always use the dedicated types of batteries for which it was designed. There have been laptop computers, notably during the computer industry's transition-period in the late 1990s from NiMH cells to Li-Ion, which could charge either battery chemistry. This dual-mode charge capability disappeared as laptop manufacturers phased out the lower-priced NiMH packs in favor of more profitable Li-Ion. With the flexibility of an external charger, mobile computer peripheral designers/manufacturers can build charging devices that support multiple cell chemistries.

Integrated Power

Integrating a power supply 567 (FIG. 15) into the same external device 552 as a battery charger 565 brings even further advantages. Traditional external power adapters (wall adapters or in-line "bricks") cause host-device manufacturers to add even more internal circuits. Laptops, and a vast number of other electronic products, have two power ports . . . one for an external power adapter, and another connector 560 for a removable (usually rechargeable) battery pack. By and large, as these types of products are used today, the external power adapter is mostly employed in order to charge the battery! By removing the charging circuit from a host device, then powering the host through its battery power interface, the power-adapter port and related internal circuitry in a host device can be totally eliminated (reference FIGS. 18A–B, and 19A–C). And a battery 558 can be charged, as defined in numerous examples herein, either in situ, or externally—the latter being a good way to reduce heat from the charging process, which helps improve battery life.

Laptops, for example, could be made thinner, lighter, and more reliable by removing virtually all of the host-to-battery power sub-system's components, boards, connectors, etc. Instead of an external adapter that only powers a host device, an external device 552 becomes a multi-purpose flexible device that can be easily updated, or replaced (at a relatively low cost).

Dual-Mode System Operations

Dual-mode charging and power-delivery system 550 in FIG. 15 is a data-enabled smart system, with bidirectional communications between charger 565 and battery 558. Battery-specific data travels along mating conductor sets 566/586, 568/588, and 570/590. Power is transferred along mating connector sets 564/584 and 572/592. Connector 556 resides on battery 558's housing. As defined in the SMBus "smart" battery specification (www.SSMBus.org), the five conductors are identified as Ground (−), Temperature, Data, Clock and Positive (+).

Traditionally, smart batteries are system Masters, initiating a request to be charged. Charger 565 (FIG. 15) then polls battery 558 for information such as battery cell chemistry, voltages, remaining capacity, and other battery-device profiles. Such battery information is typically communicated to a host device 562, where a battery charger usually resides. In FIG. 15, third device 552 is connected between battery 558 and its host 562, resulting in host 562 not having direct access to battery information.

Host device 562 may, depending on the design of the actual implementation of "smart" data communications, need to have its battery information modified or updated. This may be especially true after a charging session, when a host expects to update its battery's remaining capacity ("fuel gauge") information, and also modify the correct number of charge/discharge cycles performed to date. As battery information changes, third device 552 updates host 562 using conductor sets 574/594/555, and 582/553/563 for power transfer. Data transfers bidirectionally along conductor sets 576/596/557, 578/598/559, and 580/551/561. FIGS. 6, and 8 show connector/conductor assemblies suitable for operations of a system 550 as shown in FIG. 15.

Note that conductors 594, 596, 598, 551, and 553 in FIG. 15 do not represent actual wires in the circuits depicted, but rather only serve to indicate inter-device connectivity. In reality, the lower section of connector block 554 mates directly to connector block 560 (reference connectors 199a and 119b in FIGS. 8A and B, for example). Note also that connector 560 is physically located in host 562's battery bay 549, and mates with battery connector 556 when a third device 552 is not present.

By integrating into third device 552 (FIG. 15) a configurable variable-output power supply 567, and providing a "smart" communications circuit 571 for transferring data between third device 552 and host 562, multi-functional system 550's connector apparatus creates new power and data paths to simultaneously power host device 562, while also establishing a communications link between charger 565 and host 562. Processor/controller 569 (using memory 577 as needed), transfers data from smart charger 565 to communications circuit 571, to be forwarded to host 562. In principle, processor 569's role might be perceived as "mimicking" either a host device 562 (when third device 552 communicates with a battery 558), or operating like a "battery surrogate" (when third device 552 communicates with host 562).

"Universal" Operations

If a third device 552 (FIG. 15) is manufactured to match a specific battery/host combination, this previously-discussed ability to operate as a surrogate of battery 558 (or host 562) in the system circuit is a relatively straightforward implementation. However, a third device 552, as part of system 550, is capable of providing a "universal" charger and power supply combined. Given that the adoption and implementation of SMBus specifications is less proprietary than it was even a few years ago (a good standard smart battery reference design is available from Mitsubishi (Sunnyvale, Calif.), for example), the design of a universal charger is not unrealistic. The inter-connectivity provided by the apparatuses discussed herein opens up the formerly "closed" communications between a manufacturer's battery 558 and its associated host 562, so that a third device 552 can participate in intra-device communications sessions. With monitoring, operations defined in FIGS. 12, and 19D, it is not unreasonable to consider an external third device which can use spec-compliant SMBus as a baseline, and then "learn" the subtleties of the connected devices communications, protocols, controls, commands, etc., while in a monitoring mode.

Processor/Controller

Processor/controller 569 (FIG. 15) controls the output of power supply 567, so that it generated an output voltage within a nominal input-voltage range of host 562. Since host 562 is normally battery-powered at its I/O port 560, host 562 expects a voltage signal generated by a battery 558. Port 560 electrically attaches to battery connector 556, when a third device 552 is not present. Thus, the Vout available from battery 558 along its conductors 584 and 592 is electrically compatible with host device 562's Vin at associated conductors 562 and 563, respectively. This is important, because host 562 is "smart." It monitors battery voltage, in order to not over-discharge a battery 558. If battery voltage drops below a pre-set voltage level, low-power alerts or alarms are issued to a user. If the input voltage to host 562 along conductor sets 574/594/555, and 582/553/563 falls below drop-out alarm threshold, host 562 will likely not turn ON. Thus, power supply 567 in device 552 must output a voltage signal above host 562's minimum power-up threshold.

Prior to configuring the output of adjustable power supply 567 in FIG. 15, processor/controller 569 issues a call to charger 565. This call is to acquire battery voltage data, such as present battery voltage, and the battery manufacturer's "design" voltage. This information is used by processor 569 to set a reasonable Vout for power supply 567. A good rule of thumb in calculating a reasonable output voltage is 50% of battery 558's voltage range. Thus:

$$(V\text{min}+V\text{max})/2=V\text{out}$$

where Vmin is battery shut-off voltage, and Vmax is battery no-load peak voltage. These values are often available to a third device as data by querying a "smart" battery. A third device 552 can also query a host for its alarm and shutoff threshold voltage values, if available.

For non-smart batteries, an A/D converter 581 (FIG. 15)—with a controller 569 actuating a switch 585 to temporarily introduce a line load 587 in order to establish a rough Vmin—will yield reasonably accurate values. A reasonably valid Vmax is usually available in the first second or so of a battery pack being turned ON. A noticeable voltage spike is a characteristic of almost any battery, when turned ON without a load. Even a nearly "dead" battery will exhibit a transitory voltage spike if the cells have been at rest for a while. Thus, Vmax is always tested first, in order to acquire an elevated peak voltage (Vmax), and only after that is a load applied to the battery to acquire a Vmin reading.

A look-up chart can also be created and loaded into memory 577 (FIG. 15). This look-up chart expresses a table of:

Number of Cells×Cell Voltage where "Cell Voltage" is an expression of either minimum (Vmin), or peak cell voltage (Vmax) from a battery manufacturer's cell-performance data sheets. An example of calculating Vmax might be (6 cells×1.9 volts[peak cell voltage]=11.4 volts)

where the manufacturer's "design" cell voltage is 1.25-Volts per cell (peak cell voltage is always higher than the design voltage).

Returning to the original rule-of-thumb formula of (Vmin+Vmax)/2 Vout, a hypothetical 12-Volt battery pack might yield:

(10 Volts[$V$min]+16 Volts[$V$max])/2=13 Volts

A Vmax (peak voltage) of 16-Volts from a battery pack labeled as "12-Volts" is not unusual. Host 562 in FIG. 15 is designed to tolerate such an input voltage, because of battery voltage spikes at these (and sometimes even higher) levels.

So, even though a power supply 567 outputting 13-volts may seem excessive for a host device 562 which normally operates from a 12-Volt battery, host 562 can be expected to tolerate voltages well above 13 Volts . . . perhaps even as high as 16-Volts.

Power supply 567 in FIG. 15 will function optimally if it is designed to not exhibit voltage sags when a load is applied (such as host device 562 turning ON). An A/D converter 581 is useful for monitoring the line voltage between power supply 567 and host 562 at conductors 574 and 582. Vout can be readjusted slightly upward should voltage sags prove disruptive to host operations.

In the example discussed here, if the Vout of a power supply 567 drops to 10-Volts, host 562 may shut down in order to not further discharge its battery. The "faux" battery of third device 552 should operate within power tolerances which stay clear of the Vmin range of the battery it is mimicking.

Getting Disconnected

When a third device is removed from the intra-device system created by the connector apparatuses in FIGS. 12–19D, a means of re-establishing a connection between a removable battery and its host device is needed. Several non-limiting examples of methods of re-connecting a battery to its host—without having to remove or alter external or internal wiring paths, as in the manual connections and reconnections of FIGS. 6 and 8A–B, for example—are shown in FIGS. 16, 17, 17A–C, and 19A–D.

Figure 16:
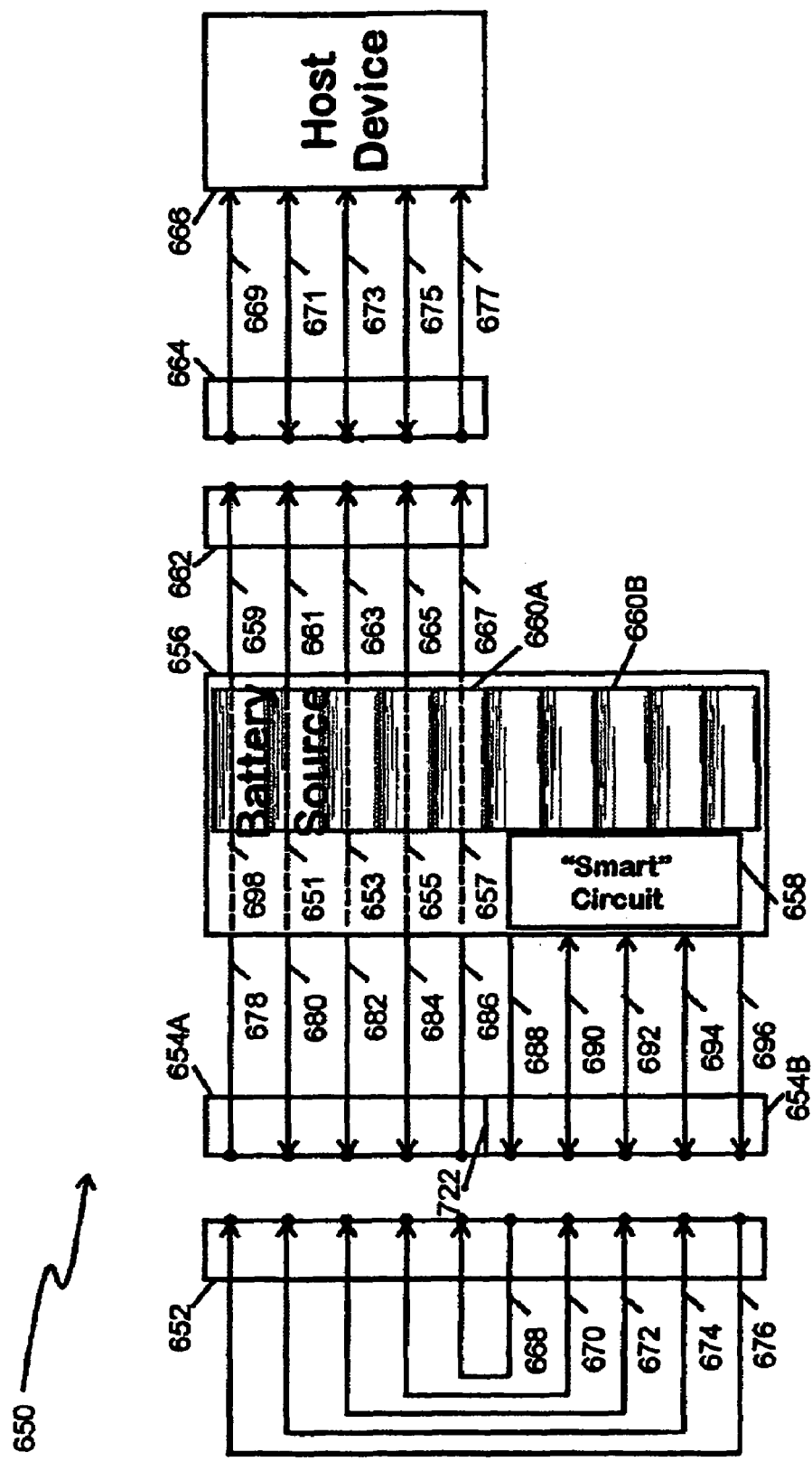
FIG. 16 illustrates a simple jumper connector, which reconnects a battery source to its associated host device.

FIG. 16 depicts a very elemental means of re-establishing connectivity between a battery 656 and its associated host device 666. A jumpered terminator block 652 is user-inserted into a mating connector assembly comprised of connector blocks 654A and 654B (reference connector blocks 199a and 119b in FIGS. 7A–D). Conductors 668, 670, 672, 674, and 676 within jumpered terminator 652 re-connect powerlines—and data lines, if present—so that various conductors from a battery 656 are rerouted along their original paths to a host 666.

To illustrate one of the jumpered paths, battery-power conductor 696 electrically connects to conductor 676 in jumpered terminator 652, then to conductor 678. Conductor 678 continues as conductor 698, which passes either through (reference FIGS. 7A–D), or externally around (reference FIGS. 6, and 8) the housing of battery 656. The electrical path then continues along conductor 659, to connector block 662 (representing the five contact connector normally recognized as an SMBus interface). Connector 662 mates electrically to connector block 664, allowing an electrical signal to flow along conductor 669 into host device 666. Connector 664 is normally located in the battery bay of a host device 666. The other four conductors follow similar and obvious paths in FIG. 16, and are not detailed individually here.

In FIG. 16, note that battery conductors 678, 680, 682, 684, 686, including further conductors 688, 690, 692, 694, 696, and the third group of conductors 659, 661, 663, 665, and 667 do not represent visible wires or cables in the actual battery device depicted here diagrammatically. Battery connectors 654A, 654B and 662 are affixed to the battery enclosure (housing), so that the referenced conductors are internal to the actual battery device. These conductors are depicted as they are here only to indicate inter-device connectivity. Note also that connector 664 is physically located in host 666's battery bay 649, and the drawing assumes that battery 656 is installed in the battery bay 649, having its connector's 654A and 654B accessible for connecting jumper connector block 652 (reference FIGS. 7A–D, for example).

Controllable Switching

Figure 17:
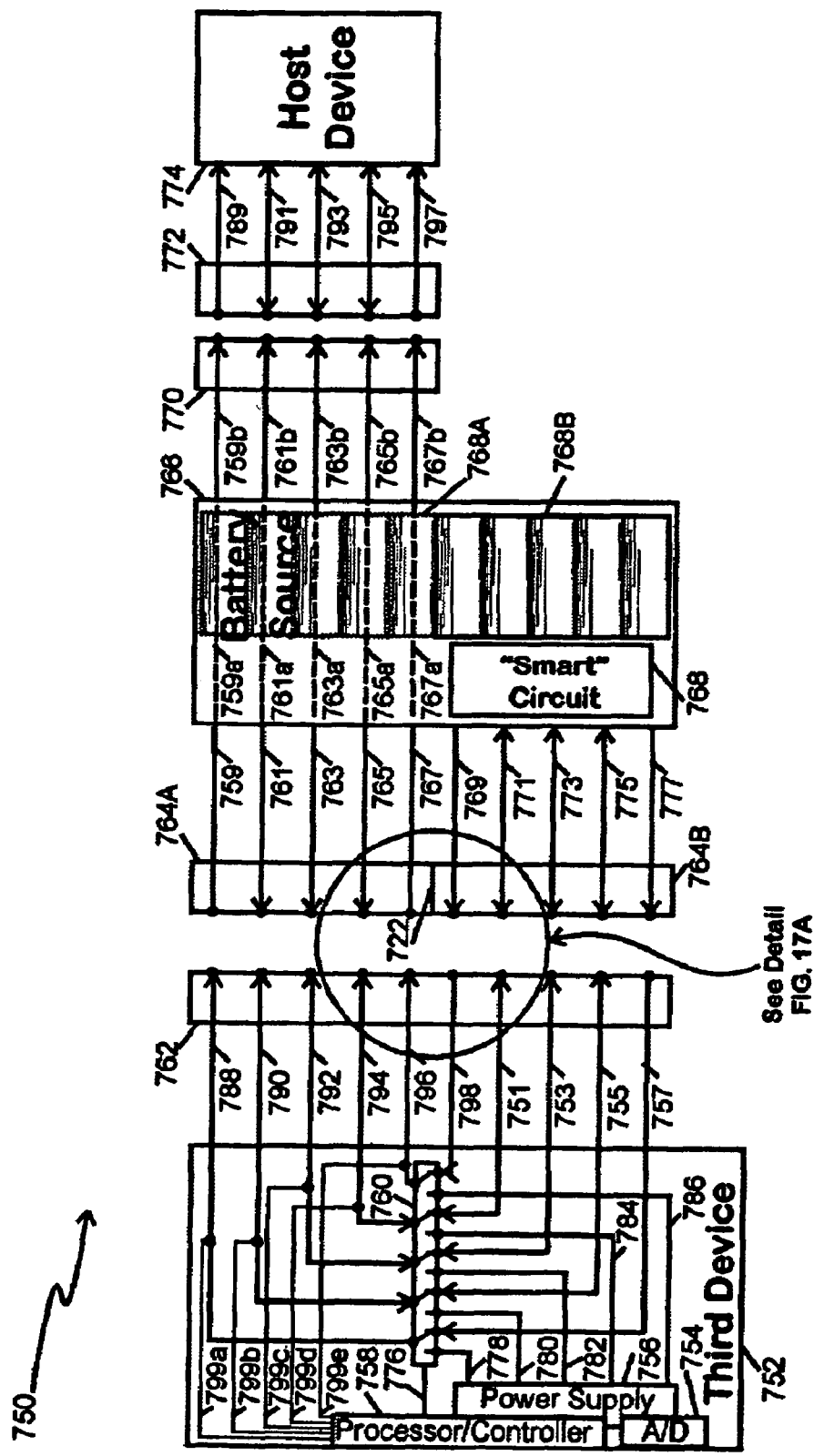
FIG. 17 illustrated an operational mode of a connector apparatus which employs a controllable switch to selectively transport power and data from battery and host devices.

For operations wherein it is appropriate to leave a third device connected in a circuit between a battery and its host device, a controllable switch provides a convenient way to avoid manually connecting and disconnecting an external device, such as a power supply 756 in FIG. 17. Connector apparatus 750 has a third device 752 as a power supply 756 for delivering power to a host device 774. Since a battery source 766 is available in the circuit, it would be convenient to have the system select either power supply 756, or battery 766 as the best of the two sources of power available to host 774. For example, operating host 774 from battery power until the level of battery 766 reaches a pre-determined low-voltage state, then having power supply 756 automatically take over power delivery to host 774.

In FIG. 17, third device 752 uses A/D converter 754 and processor/controller 758 to monitor powerline voltage in the circuit between battery 766 and host 774. The controller function activates controllable switch assembly 760, selecting an electrical path to host 774. Controller 758 functions to configure switch 760 to access power either from battery 766 (as shown in the configuration depicted in FIG. 17), or from power supply 756. Should battery voltage reach a near-exhaustion point, switch 760 changes from the configuration shown (wherein battery conductors 798, 751, 753, 755, and 757 are active), to a configuration in which power supply 756's conductors 778, 780, 782, 784, and 786 are active. The circuit to host 774 from switch 760 is comprised of conductor sets 788/759/759a/759b/789, 790/761/761a/761b/791, 792/763/763a/763b/793, 794/765/765a/765b/795, and 796/767/767a/767b/797.

In FIG. 17, note that battery conductors 759, 761, 763, 765, 767, including further conductors 769, 771, 773, 775, 777, and the third group of conductors 759b, 761b, 763b, 765b, and 767b do not represent visible wires or cables in the actual battery device depicted here diagrammatically. Battery connectors 764A, 764B, and 770 are affixed to the battery enclosure (housing), so that the referenced conductors are internal to the actual battery device. These conductors are depicted as they are here only to indicate inter-device connectivity. Note also that connector 772 is typically most often located physically in host 774's battery bay 703, and the drawing assumes that battery 766 is installed in the battery bay 703, having its connector's 764A and 764B accessible for attaching third device 752 (reference FIGS. 7A–D, for example).

Note that conductors 759a, 761a, 763a, 765a, and 767a pass either through the housing of battery 766, or around the outside of its housing (compare FIG. 6 to FIG. 7, for example).

Because battery 766 is a communications-enabled battery, "smart" battery circuit 768 can communicate with processor/controller 758 along branched conductors 799a–e in third device 752 when controllable switch 760 is configured to have battery 766 power host 774. Once battery 766 is nearly depleted and power supply 756 has taken over powering host 774, there is no need for third device 752 to further communicate with battery 766, until the battery is recharged. There is no information relevant to powering host 774 that a near-depleted battery 766 can contribute. A user of host 774 can be notified by battery 766, via processor 758 in third device 752, that it is nearing a depleted state, after which no further information from battery 766 to host 774 is required. In this example of multi-device connector apparatuses, recharging the battery would necessitate a user physically disconnecting third device 752 from the circuit, as there is no charger in third device 752.

Should both recharging a battery 766 and powering host 774 in FIG. 17 be desired, a dual-mode third device 552, as shown in FIG. 15 (or the apparatus in FIG. 19D) are combined with the switching circuitry principles of FIG. 17. Modifying the circuits to use a second switch 760 between battery 766 and existing switch 760 provides an electrical path between battery 766 and a charger within third device 752 (see FIG. 19D).

Self-Reconnecting Connector

FIG. 17A details an indicated area of FIG. 17 that represents a section of connector assembly 762 and its mating connector blocks 764A and B. Connector blocks 764A and B (in FIG. 17A interpreted as a female in connector apparatus 750) electrically self-reconnects its electrical paths when male connector 762 is retracted. Connector 762 is associated with a removable third device 752 in FIG. 17. The action of removing male connector 762 automatically causes previously-redirected conductive paths between a battery and its host device to be restored.

Note: Certain drawing part reference numbering is shared among FIGS. 17, 17A, B, and C to facilitate identifying elements in relationship to the total construct depicted in FIG. 17.

The section of a male connector 762 shown in FIG. 17A has blade-shaped contacts 714A, 716A, 718A, and 720A which are constructed as a laminate of a conductor and insulator. As an example, "blade" 714A has one electrically-conductive exposed flat surface 711 to which is laminated opposing insulator face 710. All other male blades are of the same laminate construction although, as will be seen, it is not essential to the proper operation of connector assembly 700 that each blade has an insulated surface. Actually, as long as at least one blade in a total connector assembly has a capability of acting as an insulator when inserted into a female connector assembly having at least one pair of spring clips, in order to disrupt an active electrical path upon insertion, the desired effect is achieved. This includes any male blade having insulators on both of its faces, as well as any one male blade being conductive along both of its faces.

A mating female connector assembly 714B (FIG. 17A) is comprised of two opposing spring-loaded conductive clips 732A and 732B. Female clip 732B is electrically conductive from a battery source 766 along conductor 771 (reference FIG. 17). When in electromechanical contact with opposing clip 732B, clip 732A transfers an electrical signal to cross conductor 730, that further transfers a battery signal to spring-loaded clip 732C which, when in electrical contact with its opposing clip 732D, allows a battery signal to continue along conductor 765 to other conductors 765a, 765b, and 795 to a host device 774 (reference FIG. 17). Thus, when male connector assembly 762 is retracted, an electrical signal from a battery 766 (FIG. 17) flows along this path to host 774, through the action of opposing spring-loaded clips re-closing.

When male connector 762 in FIG. 17A is inserted, an insulator face on a male blade electrically isolates one of a pair of opposing spring-loaded clips in mating female connector blocks 764A and B. Cross conductors, as exemplified by conductors 730 and 740 are thus electrically isolated while male connector 762 is inserted. With male connector 762 inserted, insulator 710 electrically isolates female clip 732A from its opposing clip 732B. This disables cross conductor 730, and any conductors electrically connected to it.

Further, conductive clips 732C and D are also not active electrically, because cross conductor 730 is electrically floating. If no male blade at all is inserted between female clips 732C and D, there is still no electrical flow from battery 766 to host 774, as the electrical path is disrupted at clip 732A by insulator 710. Thus, it is not strictly necessary that male blade 720A also have an insulated face 704. Even if both faces 705 and 704 of blade 720A were conductive, no signal from female clip 732C in female clip assembly 720B flows to clip 732B in female clip assembly 714B. The electrical path between clip 732A and 732B is an open path, the connection broken by male blade 714A's insulator face 710.

Breaking the connection between any one clip of a pair of clips will float the insulated clip's associated conductive line. Thus, only one male blade of each set (blades 714A and 720A are considered a set) need have an insulator face to achieve the desired electrical isolation effect. In other words, electrically isolating either clip 732A, or 732C, in FIG. 17A will result in electrically floating cross conductor 730, thus disrupting the circuit.

Alternative Connector Configurations

In detailed views of alternative iterations 700A (FIG. 17B), and 700B (FIG. 17C) of connector assembly 700 in FIG. 17A, each one of a pair of opposing female spring clips 732A or 732B are electrically routed to one of two third devices. Female clip 732B in female clip assembly 714C (FIG. 17B) forms a single contact in an electrical path along conductor 741 to a battery 776, while an opposing clip 732A creates an electrical path along conductor 739 to a host device 774. Depending on the implementation, at least one female clip assembly 714C is required in an electrical circuit that is intended to reconfigure itself automatically when a male connector assembly 762A is retracted.

In many applications, such as where total electrical isolation of one device (e.g., a battery) from another device (e.g., a host) is required, two spring-clip assemblies 714C are suggested. This simplifies electrically interposing a third device (e.g., a power supply, or battery charger) between the two devices. For an application where the feature of automatic reconfiguration of two conductors is required when a male connector 762B is retracted, only one of the conductive paths need have a connector assembly 700A (FIG. 17B), or 700B (FIG. 17C). The second conductor then uses a connector interface which passes an electrical signal through a typical single conductor-to-conductor interface without an opposing set of clips, and this second path is electrically open when a male connector 762A or 762B is retracted. Note that the wiring of a female clip assembly in FIGS. 17B and C is simplified, eliminating cross conductor 730, as shown in FIG. 17A.

A non-limiting example of such an application using such a single conductor-to-conductor interface might be with a connector assembly 700A (FIG. 17B) or B (FIG. 17C) used in a "T" or "Y" circuit configuration comprised of three devices, so that a third device to which a connector assembly 700A or B is electrically connected disrupts only one of the conductive paths when attached, but restores this electrical path upon removal of the third device. FIGS. 6, 8, and elsewhere, show non-limiting examples of such possible applications, where a shared conductive path needs to be restored, but a second line can be left floating when a third device is removed. Any number of conductors in a connector assembly is acceptable, depending on the application.

Figure 17B:
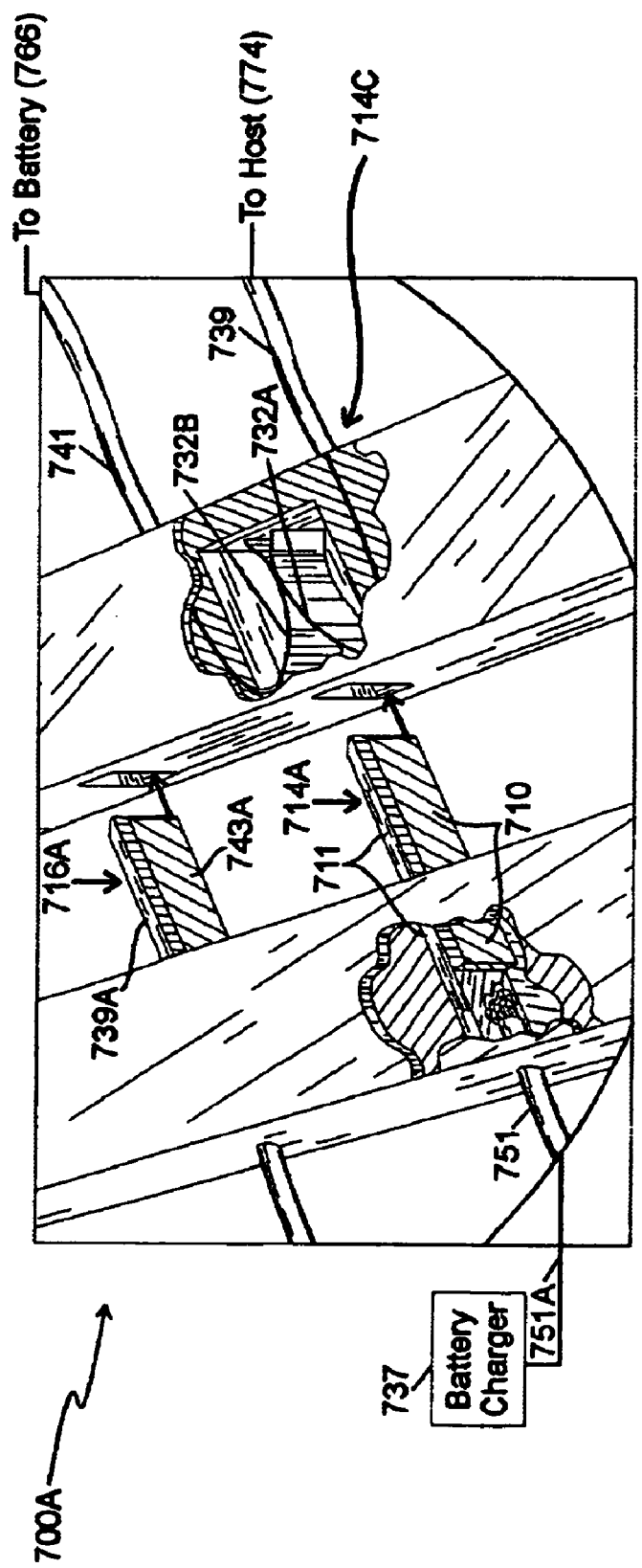
FIG. 17B further details a variant of the connector apparatus in FIG. 17A.
Figure 17C:
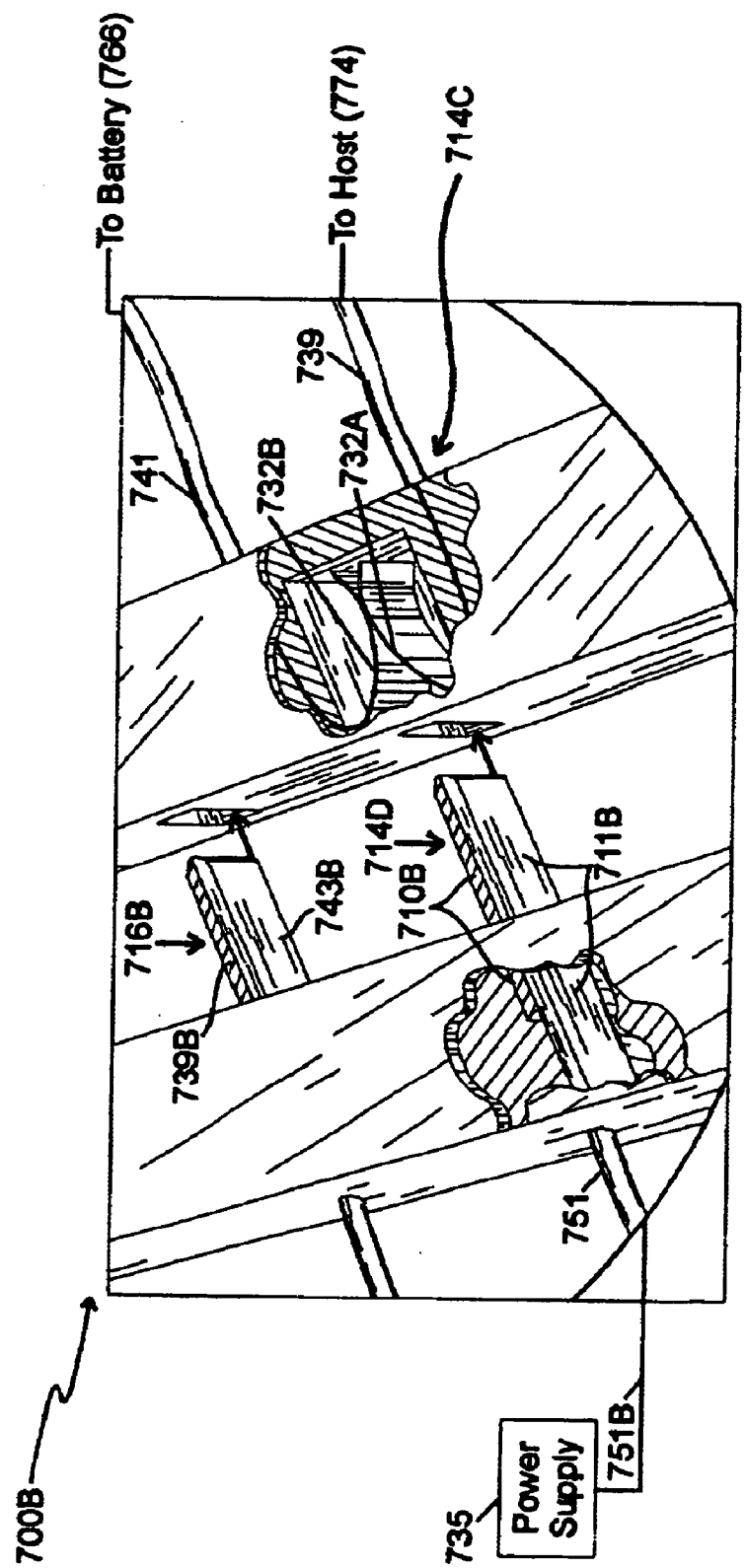
FIG. 17C further details a variant of the connector apparatus in FIGS. 17A and B.

Note in FIG. 17B that any male blade in a connector assembly that interposes between two spring-loaded female clips can have its conductive (711) and insulated (710) faces on opposite faces of a male blade assembly 714A. For example, male blade assembly 716B from FIG. 17C can replace male blade 716A in FIG. 17B. Mixing and matching the relative direction of conductive and insulator faces among a number of male blades in a connector assembly is acceptable. The design of a male connector 762A or 762B should allow for interchangeable blade assemblies at the time of manufacture, so that the faces of male blades can be mixed or matched as conductors or insulators, to lower the cost of building custom variants of these connectors.

Rotating A Connector

A male blade 714A in connector assembly 700A (FIG. 17B) directs an electrical signal to female spring clip 732B along its conductive surface 711 and, at the same time, electrically isolates opposing female spring clip 732A by its insulator surface 710. This modality creates an electrical path from an external battery charger 737—used in this example but not limited to a specific third device—to its associated battery 766. A conductor set 751A/751 from charger 737 is electrically attached to conductive face 711 of male blade 714A (only one conductor from charger 737 is shown here). When inserted, male 714A's conductive face 711 transfers an electrical charging signal to female spring clip 732B which, being electrically attached to conductor 741, delivers the battery charger signal to battery 766. Insulator 710 of male blade 714A prevents the battery charger signal from flowing to host 774 along its female clip 732A and conductor 739.

Compare the above-described electrical path to alternative modality of the invention 700B in FIG. 17C. Instead of a battery charger as in FIG. 17B, a power supply 735 serves as an attached third device. Since female connector assembly 714C, and its associated devices, remains as configured in FIG. 17B, to now redirect an electrical path for an external power supply 735 to access host 774 requires a reconfiguration of insulators and conductors at male blade 714D (FIG. 17C). What was a conductive surface 711 of male blade 714A (FIG. 17B) is now an insulator surface 7101B in FIG. 17C. Likewise, the insulator surface 710 in male blade 714A (FIG. 17B) is now a conductive surface 7111B of male blade 714D in FIG. 17C. Basically, the electrical relationships of male blades 714D and B in FIG. 17C have been rotated 180 degrees (flip-flopped) from those shown in FIG. 17B. Designers and manufacturers benefit from a male connector 762A (FIG. 17B) or 762B (FIG. 17C) that can simply be rotated axially along the reference line of its pins in order to achieve two separate functions by creating two distinct electrical paths. Except for proper keying to prevent two differently-wired male connectors from physically fitting a female in the same orientation, the same male and female connectors are useable with at least two distinctly different third devices, such as a power supply 735 (FIG. 17C), and a battery charger 737 (FIG. 17B).

Upon retracting male blade 714A, spring clip 732B returns to the position shown in FIG. 17B, making electrical contact with its mating clip 732A. Now, battery 766 generates a power (or data, if appropriate to the application) signal along conductor 741, which is electrically attached to clip 732B, where electromechanical spring operation transfers the power signal to clip 732A. Clip 732A is electrically attached to conductor 739, which carries the power signal originating at battery 766 to host 774.

The electrical path just described is bidirectional, so charging battery 766 (FIG. 17B) from host 774—which has its own internal battery charging circuit (not shown)—is along the same electrical path. In effect, a "Y"-connector is established, with the intersection of the three main electrical branches of conductors 741, 739, and 751 being a female spring-clip assembly 714C, and a male blade 714A directing (and even redirecting when rotated 180-degrees) which path along the two available spring clip branches is electrically active.

A rotatable male connector assembly 700 (or 700A, or 700B) is not mandatory for the proper operation of the connector assemblies in FIGS. 17A, B, and C. Nor does rotation necessarily mean that a single male connector (see 762A in FIG. 17B, and 762B in FIG. 17C), shared by two third devices, is physically rotated by a user in selecting a first or second of the third devices sharing a male connector. The rotation can occur at the time of third-device manufacture, whereby each of two (or more) separate and distinct third devices uses the same male connector configuration, but that one device mounts the connector in an orientation so that it is "upside-down" from the orientation that is used in mounting the same male connector on a second device. Again, keying the two male connectors to not be incorrectly insert-able is important.

Several third devices can share a common male connector configuration in situations where a particular orientation and wiring create a path to a device (such as a battery) that is applicable to more than one third device. An example is a battery charger and a battery monitor, where both access an identical electrical path that shares all of the same conductors to a battery.

Practical Implementation

A non-limiting example of an application for connector assembly 700 in FIG. 17A, which isolates the electrical path to a battery 766, while providing an active electrical path to a host 774, is to power a laptop computer when the situation does not allow for battery charging. The issue of passengers charging laptop batteries on commercial aircraft has raised concerns for safety (see article, on pilots union and others expressing concerns over in-flight recharging of laptop batteries, *The Wall Street Journal*, Oct. 5, 1998; safety concerns about laptop power ports prompt action by American and United airlines, *The Wall Street Journal*, Jun. 30, 2000; and Dell Computer Corp's. recall of laptop batteries, *San Jose Mercury News*, Oct. 13, 2000, p. B2,).

Connector assembly 700 in FIG. 17A resolves this safety issue by providing a convenient and easily-implemented means of electrically isolating a battery from its traditional electrical path, so that an external power supply aboard an aircraft can power a laptop, without charging the passenger laptop's battery. FIGS. 7A–D in particular illustrates a reasonable equivalent of the connectors in FIGS. 17A–C. In FIG. 7A, battery conductors 129*e* and 129*a* are roughly functional equivalents to conductors 765 and 771 in FIG. 17A. Conductor 129*e* is directed electrically to battery cells 215 in FIG. 7A, to equate with conductor 771 being also directed to a battery 766 in FIG. 17A. Conductor 129*a* in FIG. 7A is directed to host 280, which is equivalent to conductor 765 in FIG. 17A, which is directed to host 774. The comparison may not extend beyond that, as other conductors such as 135*e* and 135*a* in FIG. 7A are already inter-connected internal to the battery pack, and cannot be electrically isolated by a connector 700 in FIG. 17A to have separate electrical paths to a battery and a host, as can conductors 129*e* and 129*a*.

But, the point is made in viewing the two Figures, FIG. 7A and FIG. 17A, that a female connector assembly 764A from FIG. 17A replacing female connector assembly 199*a* in FIG. 7A, and replacing a female connector assembly 119*b* (FIG. 7A) with a female connector assembly 764B from FIG. 17A, provides a means of allowing a user to disconnect laptop battery charging.

Those skilled in the art can implement the changes in wiring and cross wiring that would render battery pack 115 in FIG. 7A operational using the insulators and spring clips described in FIGS. 17A, B, and C.

Note that, since the use of spring-loaded clips in FIGS. 17B and C account for two conductors for each female assembly 714C, that only one of female connector blocks 199*a* or 119*b* (FIG. 7A) is required to perform both battery charging and delivering power to a battery's associated host device. Instead of two tandem female connector blocks 199*a* and 119*b* (FIG. 7A), two discrete male connector blocks are used. One male connector (762A in FIG. 17B) attached to a battery charger is used for battery charging, while a second connector block (762B in FIG. 17C with male blade's insulator and conductor faces oppositely configured) is attached to a power supply.

The major value-add for implementing a spring-clip design into a female battery connector is to eliminate the need for a user to manually insert a separate jumpered connector block (see connector 209 in FIG. 7D, and equivalent 652 in FIG. 16). Such jumpered connector blocks are prone to getting lost, and require a female connector to be recessed, as in FIG. 7A, in order to not create a protrusion when the jumpered connector block is in place.

Manual Switching

Figure 18A:
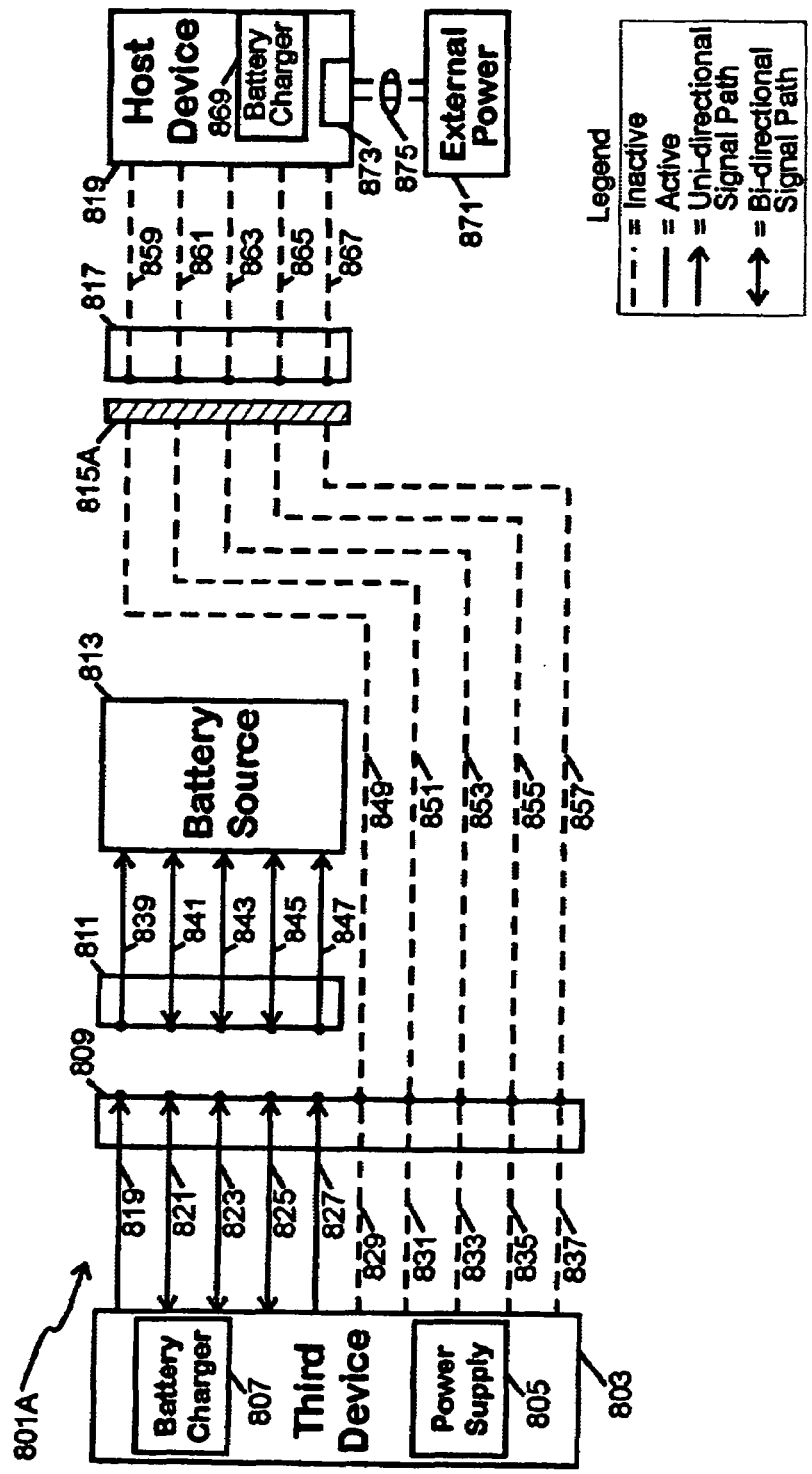
FIG. 18A is a diagram of an operational mode of a connector apparatus which, by removing a part of the connector assembly, selectively configures data or power paths for operations among multiple devices.

FIGS. 18A and B represent another non-limiting example of an apparatus for enabling multiple modes of operation among a number of inter-connected devices, which can be reconfigured manually to perform different functions. Third device 803 is comprised of both a battery charger 807, and a power supply 805. One of the non-limiting operational functions third device 803 is capable of performing is charging battery source 813. Charger 807, as shown here, also bidirectionally communicates with "smart" battery 813. Another function is that power supply 805 simultaneously delivers power to host device 877, while bidirectionally communicating with host 877.

For this non-limiting example, both charger 807 and power supply 805 in FIGS. 18A and B are electrically pre-matched to their respective target devices (battery 813 and host 819), so that no reconfiguring of the charger's or power supply's outputs are required.

To illustrate the operational use of insulators 815A and B (FIGS. 18A and B), it is assumed only for purposes of discussion that third device 803 allows power and data to flow from battery 813, through third device 803, and then to host 877. Conversely, any power or data signals from host 877 can travel to battery 813 by passing through third device 813. In reality, the power supply side of third device 805 is electrically isolated from its battery charger side, so the situations portrayed that allow the two sub-systems to be put into an electrical contention are purely hypothetical, to illustrate the operation of manual insulators 815A (FIG. 18A) and B (FIG. 18B).

Selection of which operational mode is active—charging battery 813 in FIG. 18A, and/or powering host 877 in FIGS. 18B—is achieved by manually removing or re-attaching a movable insulator 815A, or 8115B. These removable insulators are referenced in FIGS. 8A and B and the related text, and are diagrammatically represented in FIGS. 18A and B.

Figures 8A, 8B:
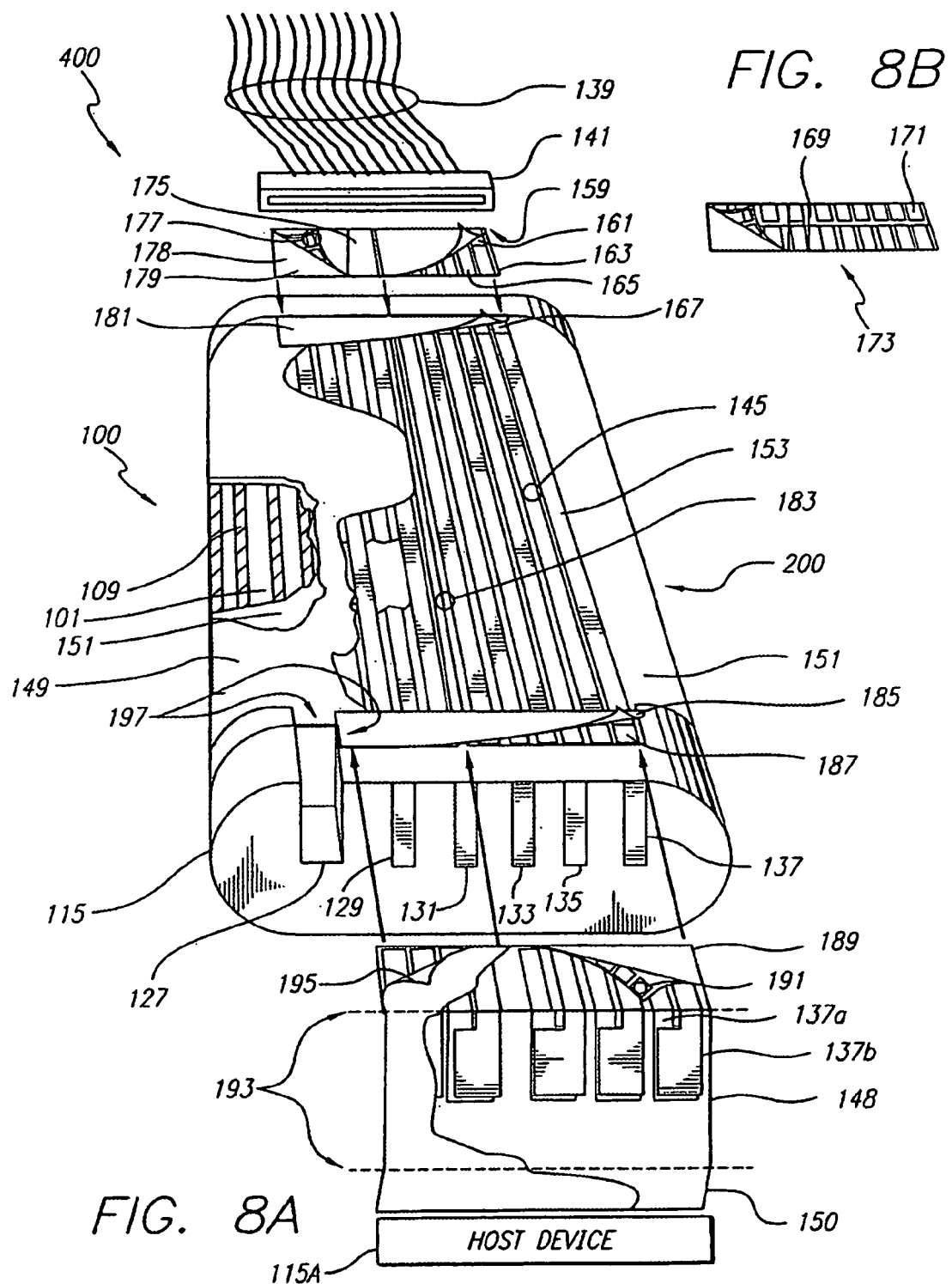
FIG. 8 shows the same elements of the temperature-monitoring apparatus depicted in FIG. 6, attached externally to a "smart" battery pack, with replaceable data and power conductor extensions at both end of the battery housing.

By manually manipulating the movable/replaceable insulator layers 179, 175, and 181 on tab 159 in FIG. 8A, selective electrical paths for attaching a third device are activated or de-activated. The same holds true for selectively removing or inserting insulator layers 189 and/or 195 in FIG. 8A, which electrically addresses battery 200's contacts 129, 131, 133, 135, and 137, or host device 115, respectively. For example, inserting insulator 815A in FIG. 18A between power supply 805 and its associated host device 819 ensures that no power can be delivered to host 877. This corresponds to leaving insulator layer 195 (FIG. 8A) in place. An example of an operational mode wherein electrically isolating a power supply from its host occurs when a user is powering host 877 from an external power source 871 (e.g., an AC/DC wall adapter, or "brick") in FIG. 18A.

If insulator element 815A (FIG. 18A) is not present in the circuit between power supply 805 and host 877, power from supply 805 to host 877 is delivered through the power connector interface 817. This connector is physically located in a host device's battery bay 881. A user may connect external power source 871 at host's primary external power input jack 873. Connecting both power sources 805 and 871 to host 877 at the same time may not be advisable. Use of an external power source 871 could, in certain situations, turn on host 877's internal battery charger 869. Should this occur while power supply 805 is delivering power to host 877 at its battery power connector 817, an electrical contention may be created. Note that battery charger 869 in host 877 must be turned on to create such contention. If charger 869 is inactive, the internal circuitry in most any battery powered host device 877 that controls charging will simply de-activate power access to power interface 817 while being powered from an external source 871.

Methods of controlling such potential contention are to design power supply 805 in FIGS. 18A and B so that a power supply shut down occurs if an input voltage from host's charger 869 is detected at third device 803. An A/D converter 879 and processor/controller 881 allow third device 803 to detect power along its conductors 829 and 837, so that controller 881 can shut down power supply 805. It may be advisable to also diode-protect (not shown) power supply 805 from power conductor sets 859/849/829, and 867/857/837, so that a power signal originating from external power source 871 cannot damage power supply 805.

In the alternative, since power supply 805 in FIG. 18B is in communication with host 877 along data conductor sets 831/851/861, 833/853/863, and 835/855/865, supply 805 can send information to host 877 which triggers internal alerts or alarms. Alert or alarm states, such as excessive battery temperature, battery in an already overcharged state, etc., will put host 877's smart charger 869 on alert that no charging activity is to be initiated. Such methods are only necessary when connector-interface apparatus 801A in FIG. 18A is retrofitted to an existing battery and host. See discussion in sections "Dual-Mode System Operations" and "Universal Operations" of a third device "mimicking" a battery.

Note that conductors 849, 851, 853, 855, and 857 in FIGS. 18A and B do not represent actual wires in the circuits depicted, but rather only serve to indicate inter-device connectivity. In reality, the lower section of connector block 809 mates directly to connector block 817 (reference connectors 199a and 119b in FIGS. 8A and B, for example). Note also that connector 817 is physically located in host 877's battery bay 881, and mates with battery connector 811 when a third device 803 is not present.

As manufacturer's integrate a connector apparatus 400 (FIGS. 8A and B)—or equivalents—at the time of manufacture, the need for a power jack 873 and an external power source 871 in FIGS. 18A and B will disappear, because power supply 805 entirely eliminates the need for an external power source 871.

Until such integrated connector apparatuses appear in battery and host devices, a simpler and more positive means of preventing power supply/charger contention is to leave removable insulator 815A in FIG. 18A in place, removing it only when power supply 805 is used. Fortunately, the user-installable connector assembly in FIGS. 8A and B (reference also FIG. 6) allows any existing battery-powered source device to be upgraded for attaching any third devices.

No Battery Charging

Electrical isolation of a battery 813 source from its charger 807 in FIG. 18B is achieved by a manually-manipulated intervening insulator 815B (reference the removable tabs indicated above in FIGS. 8A and B). Selective control of battery charging functions has been discussed in the section "Temperature-Sensing Devices," especially referencing risks associated with charging Lithium-Ion batteries in environments such as passenger-carrying aircraft.

For host devices that support an external power source 871 at a dedicated power port 873, without insulator 815B in place as in FIG. 18B, battery 813 could be in a potentially contentious situation wherein internal charger 869 at host 877 is actively charging battery 813, because external power source 871 might be connected and active (it is shown inactive in FIG. 18B). Since charger 807 in third device 803 is data-enabled and communicates with "smart" battery 813 along data conductor sets 821/841, 823/843, and 825/845, charger 807 simply queries battery 813 prior to commencing a charging function. Manual manipulation of insulator 815B provides a simple, and safe means of electrically engaging or disengaging charger 807.

Two Steps: A Multi-Device Operational Example

The operational capabilities of a third device extends the functionality of a battery and its host when the third device is inter-connected to both, by utilizing information provided by the battery, and its host. The following non-limiting example illustrates how an external power supply connected to a battery and host recognizes the states of the inter-connected devices in a sequence of two steps, resulting in a power supply delivering power to a host device.

Connector apparatus 901A in FIG. 19A is used in a first step by having a third device 903 determine the operational mode of a battery source 947, and its associated, host device 951, so that power supply 911 can deliver a correct voltage to host 951. As shown, battery 947 in FIG. 19A is a data-enabled battery, and is connected to third device 903 by a set of five conductors. Conductor sets 983/963/929, and 991/971/937 are for power. These power conductors from battery 947 also branch to a regulator 928, where battery voltage can be adjusted to power third device 903's "smart" circuitry, primarily a processor/controller 907, memory 905, and an A/D converter 918. Power conductors sets 983/963/929, and 991/971/937 extend both to a controllable switch 913, where power signals can be directed to a set of conductors 9731993/904, and 981/902/912, which connect to host 951. Conductor sets 985/965/931, 987/967/933, and 989/969/935 are data lines.

Note that conductors 993, 995, 997, 999, and 902 in FIGS. 19A, B and C do not represent actual wires in the circuits depicted, but rather only serve to indicate inter-device connectivity. In reality, the lower section of connector block 943 mates directly to connector block 949 (reference connectors 199a and 119b in FIGS. 8A and B, for example). Note also that connector 949 is physically located in host 951's battery bay 998 and mates with battery connector 945 when a third device 903 is not present.

A branch of power conductors 929 and 937 in FIG. 19A, as conductors 920 and 922, leads to A/D converter 918, from which processor 907 acquires battery 947's voltage. Being a "smart" battery 947, data on battery voltage, charge state and other conditions of the battery are available digitally along data conductors sets 985/965/931, 987/967/933, and 989/969/935. Therefore, it may seem redundant to pass battery 947's power conductors through an A/D converter. Admittedly, this A/D converter element can be eliminated, but the A/D conversion may prove beneficial with batteries that are almost depleted, or that may be out of calibration.

Certain "smart" battery communications may require that one or both powerlines be present. Some implementations of SMBus are sensitive to line voltages, so that the layout shown for powerlines 929 and 937 in FIGS. 19A, B, C, and D would be inappropriate. The issue is resolved simply by redirecting power conductors 929 and 937 to first data port 930 in all of the figures indicated. Even in these situations, it is practical to leave power conductors 929 and 937 as they are, and tap off these two lines with branched conductors (not shown) directed to first data port 930. Note that controllable single-pole switch 940 can be employed to disengage power along lines 929 and 937 from both regulator 928 and A/D converter 918. When switch 940 is open, or in cases where powerlines 929 and 937 cannot be used to power processor/controller circuit 907 through regulator 928, instead a second output 936 of power supply 911 directs power along conductors 924 and 926 to regulator 928, then along power conductors 915 and 917 to processor/controller circuit 907.

Figure 19B:
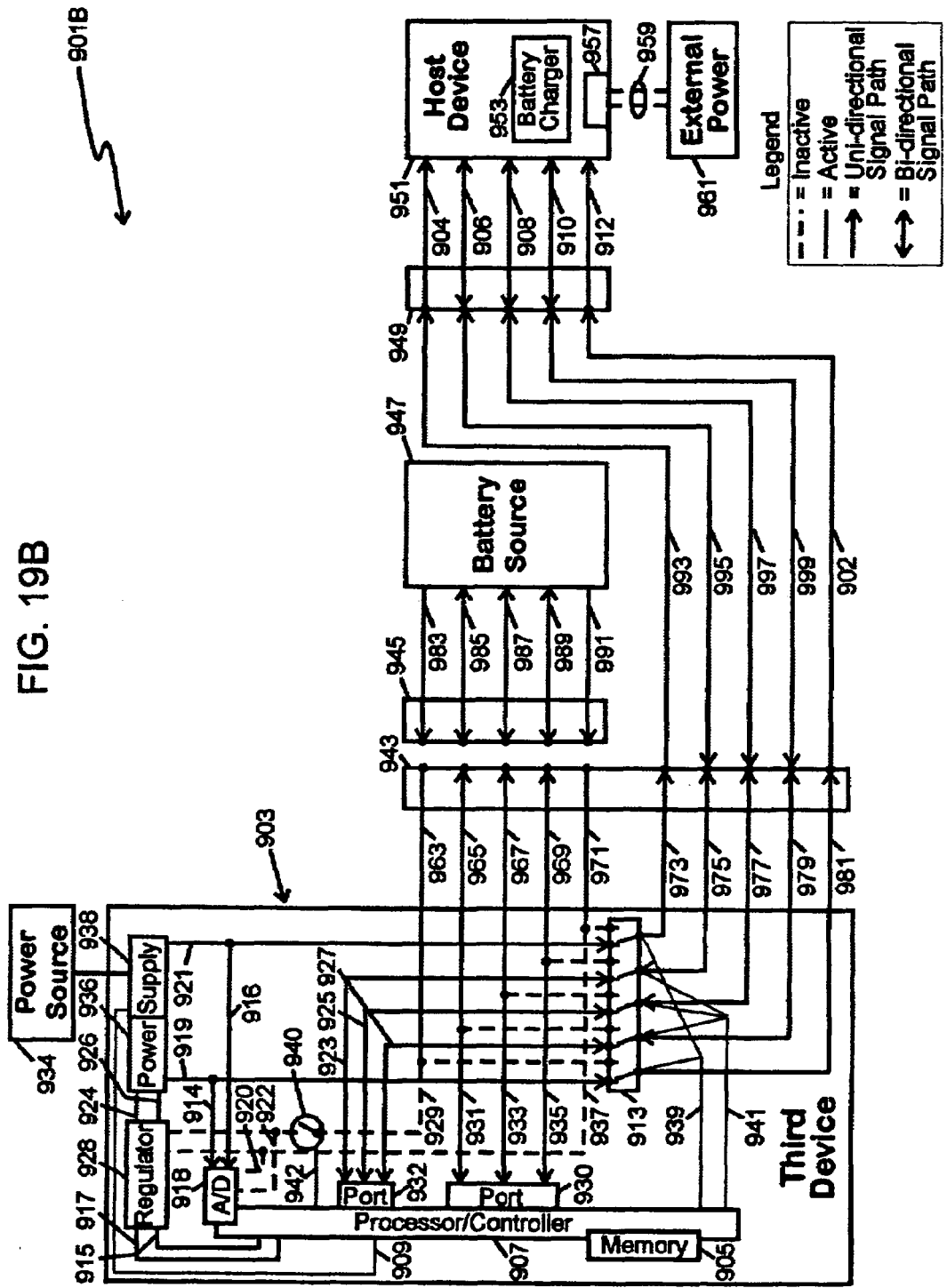
FIG. 19B shows a variant of the connector apparatus in FIG. 19A, wherein a switch is configured to power a hoist device.

Should such modifications to powerlines 929 and 937 in FIGS. 19A, B, C, and D be necessary, the same approach is applied to second data port 932. As seen in FIG. 19B, second data port 932 addresses conductors directed to host device 951. Powerlines 914 and 916 are either redirected to second data port 932, or two new conductors (not shown) branched from primary power leads 919 and 921 are directed to second data port 932.

As the active circuits (solid lines) indicate in FIG. 19A, third device 903 is wired into battery-to-host circuits in a "T" fashion, with data conductor branches 931, 933 and 935 directed to data at first data port 930, so that data is being transferred bi-directionally between battery 947 and its host 951 is also available to processor 907. This "monitoring" connection configuration allows processor 907 to capture information about battery 947 at first data port 930, as well as capture data about host 951 at second data port 932, and to store such information in memory 905. Processor 907 continues to collect information about battery 947, querying the battery (or host if necessary), so that third device 903 can "emulate" either a battery 947, or a host 951 (see discussion of "mimicking" a battery in the "Dual-Mode System Operations," and "Universal Operations" sections).

Two data I/O ports are available to processor 907 in FIG. 19A. First data port 930, as discussed, monitors communications between battery 947 and host 951. Switch 913 isolates battery 947 from its associated host 951. Controller function of processor 907 uses control lines 939 and 941 to manipulate controllable switch 913. By directing the contacts in switch 913 as indicated in FIG. 19B, so that the active circuits address conductors 919, 923, 925, 927 and 921, the available paths from host 951 to battery 947 shown in the switch configuration 913 (see FIG. 19A) are disrupted.

Active circuits shown in FIG. 19A between battery 947 and third device 903, allow processor 907 to communicate (via first data port 930) with battery 947, without having host 951 in the communications loop. Thus, for example, data flows along conductor 985 at battery 947, to electrically connected conductor 965 in third device 903, then continues along conductor branch 931 to first data port 930, being accessible to processor 907. However, because controllable switch 913 is in the position shown in FIG. 19B, the data conductor (dashed lines indicate inactive signal paths) which is electrically connected between data conductor 965/931 and the fourth contact from the left at switch 913 is isolated by the switch arm set in the position indicated in FIG. 19B, instead of as depicted in FIG. 19A. Processor 907 thus has the ability, by controlling the positions of switch 913, to communicate only with battery 947, or with both battery 947 (at first data port 930) and host 951 (at second data port 932).

Figure 19C:
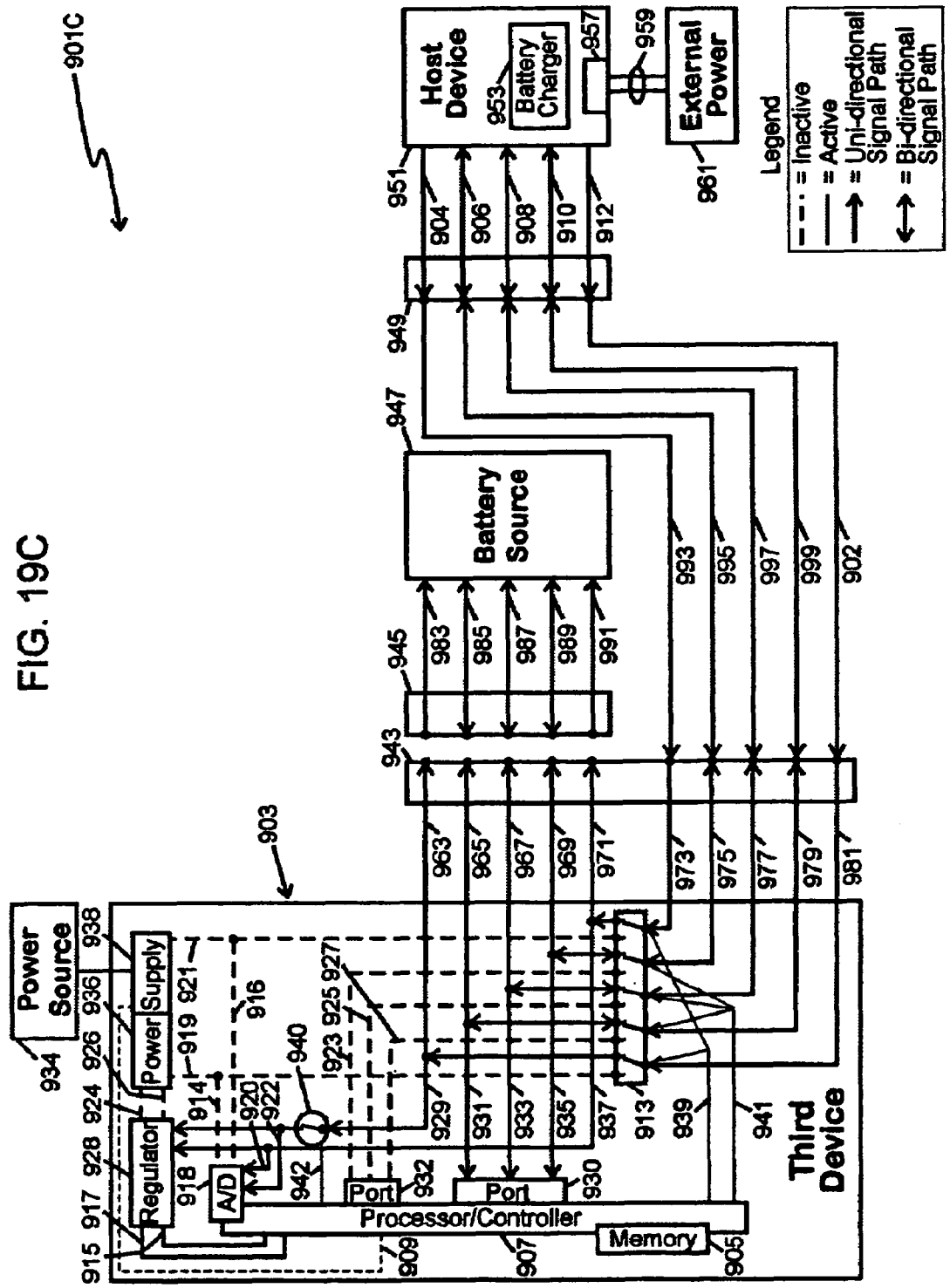
FIG. 19C illustrates diagrammatically a variant of the inter-device connectivity shown in FIGS. 19A and B.
Figure 19D:
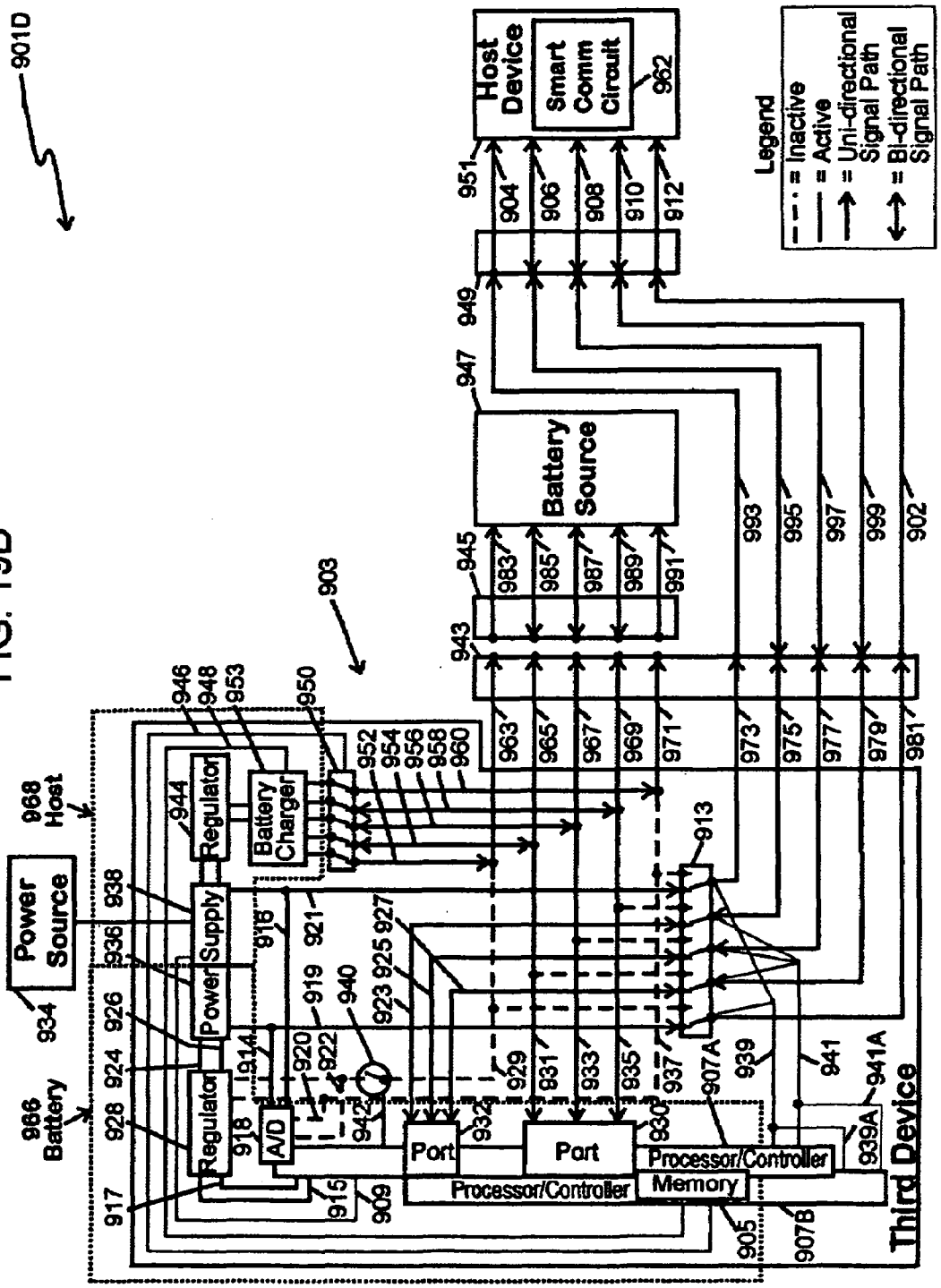
FIG. 19D diagrammatically depicts a combined battery charger and power supply which uses switch-configurable circuits to interact with multiple devices.

Second data port 932 in third device 903 of FIGS. 19A, B, and C (903A in FIG. 19D) is a data I/O directed between processor/controller 907 and host device 951. The advantage of separate data ports 930 and 932—each dedicated to a battery and a host device respectively, combined with a controllable switch for routing both power and data—is that third device 903 selectively communicates with either attached device. Since the function of third device 903 in FIGS. 19A–C is specifically to power a host device, and not to charge a battery, power delivery is directed only to the host device. In an alternative modality FIG. 19D depicts an operational model of a connector apparatus 901D and a multi-functional third device 903A which can both power a host device 951, and also independently charge a battery 947. A comparable device 903A which only charges a battery, uses the elements of the charging circuit discussed later in reference to FIG. 19D.

Step 1 State

A primary reason that third device 903 in FIG. 19A is in a monitoring mode is to determine whether host 951 is presently operating under power from another external power source 961. Power source 961 is usually an AC/DC adapter (a laptop "brick," for example) or a comparable device which, if present, makes it possible for host 951 to activate its internal battery charger 953. Since the purpose of third device 903 is to power host 951, the presence of active external power source 961 precludes any power delivery from third device 903, because an active charger 953 is electrically connected by the same conductive paths (conductor sets 973/993/904, 975/995/906, 977/997/908, 979/999/910, and 981/902/912) as are used by power supply 911 to deliver power to host 951.

If A/D 918's output readings in FIG. 19A are abnormal, as would be the case if power is flowing from host's battery charger 953 into battery 947, or if processor 907 detects data at first port 930 which indicates that battery 947 is being charged, either of these states (among others) would clearly indicate that external power source 961 is connected to host 951 at host's power port (jack) 957 (see FIG. 19C). The appropriate response and action from third device 903 is to not attempt to power device 951 but, instead, to remain in the Step 1 state shown in FIGS. 19A, and 19C with all power and data conductors between battery 947 and its host 951 properly configured—essentially, except for its monitoring function, third device 903 is electrically "transparent" to battery 947 and host 951 in this state. The configuration shown in FIG. 19C provides battery charging via host's charger 953, using an external power source 961.

Confirmed: No External Power

Once the operations described in Step 1 (above) confirm that an external power source 961 is not actively connected to a host device 951, it is safe for power supply 911 to delivery power to host 951. As previously described, processor 907 has monitored battery 947 to establish a proper output voltage for power supply 911. Controllable switch 913 in FIG. 19B is now configured by processor/controller 907. Two control lines, 939 and 941, are used for manipulating switch 913, although a single control for switch 913 can be employed. Control line 939 allows only the outer power contacts of switch 913 to be operated. Control line 941 switches the three center data lines in switch 913, independently of the power contact.

Using two independent controls for actuating switch 913 in FIGS. 19A, B, and C allows power from battery 947 to flow to host 951—while data can be transferred to host 951 from processor 907—at second data port 932 instead of allowing data to come from battery 947. In this operational mode (referencing FIG. 19A), a power signal from battery 947 flows along a first conductor 983, then to conductor 963 in third device 903, then continues to switch 913, which transfers the power signal to conductor 981, then along electrical path 902 to host interface connector 949, where it transfers to conductor 912 into host 951. A second power signal at battery 947 flows along conductor 991, then transitions to third device 903 along conductor 971 to switch 913, which transfers the power signal to conductor 973, then along electrical path 993 to conductor 904 into host 951.

When processor 907 is not communicating with host 951 via second data port 932, battery 947's data signals flow along a representational path as follows: a battery data signal (here representing "Temperature") starts along conductor 985 (FIG. 19A), then transitions into device 903 along conductor 965, continuing to switch 913, which transfers the data signal to conductor 979, further traveling along electrical path 999 to finally flow along conductor 910 into host 951. A second data signal (usually designated "Data") flows along the following conductors: 987 to 967, then to switch 913, and along to 977, then further along 997 and 908. A third data signal (typically "Clock") flows along the following shorthand version of its route: conductor 989 to 969, to switch 913, then along 975 and 995, to 906 then into host 951.

In the operational model just described, should power supply 911 not function properly (perhaps a user inadvertently disconnects third device's power source 934, the Uninterrupted Power Supply (UPS) feature of battery 947 as power backup can be accessed by a separate group of independently-controllable power contacts in switch 913. By controlling switch 913 so that its outer power contacts can be actuated separately from its three central data contacts, power delivery to host 951 is more reliable, with battery backup redundancy available.

Dual Data Communications Ports

Configured as in FIG. 19B, processor 907 in third device 903 has two active data ports: first data port 930 is directed to battery 947, while second data port 932 is directed to host 951. Processor 907 accesses first data port 930 to monitor activities of battery 947. Processor 907 also pro-actively transfers data to a battery 947, for example, to change information in a battery's data registers. (e.g., update a "CHARGE/DISCHARGE" cycle counter in battery memory). Port 930 uses data conductor sets 931/965/985, 933/967/987, and 935/969/989 to access battery 947's data.

Second data port 932 accesses host device 951 in FIG. 19B along data conductor sets 923/975/995/906, 925/977/997/908, and 927/979/999/910. Processor 907 communicates with host 951 via second data port 932, independent of its communications with battery 947 at first data port 930. In this configuration (FIG. 19B), third device 903's processor is "mimicking" battery 947 when it communicates with host 951. From the monitoring activities of Step 1 (FIG. 19A), processor 907 has captured battery data at first data port 930. Further, memory 905 has stored sufficient data to now have a battery profile and information from battery 947's registers, so that device 903 is able to operate as a "surrogate" battery.

Note that conductors 993, 995, 997, 999, and 902 in FIGS. 19A, B and C do not represent actual wires in the circuits depicted, but rather only serve to indicate inter-device connectivity. In reality, the lower section of connector block 943 mates directly to connector block 949 (reference connectors 199a and 119b in FIGS. 8A and B, for example). Note also that connector 949 is physically located in host 951's battery bay 998 and mates with battery connector 945 when a third device 903 is not present.

Sophisticated "smart" power systems typically require a well defined handshake between a smart battery and its host device, so such a mimicking strategy is not unrealistic in order to have a host 951 accept a third device 903 and to communicate with it. The apparatus depicted in FIG. 19B, with its two active data I/O ports 930 and 932, allows simultaneous communications with both a battery (at first data port 930) and a host (at second data port 932). Thus, processor 907 uses device 903's dual data ports to enhance system operations, for example, by immediately querying battery 947 for information that host 951 needs in order to continue a power-delivery session.

Design Approaches

Designers and implementers of a third device 903 in FIGS. 19A, B, and C (and 903A in FIG. 19D) should study the "smart" circuits of the particular battery and host device for which a finished device 903 is intended. Since second data port 932 is used for emulating a smart battery to its associated host device, integrating some or all of the actual circuits from the smart battery to be emulated into a third device 903 will simplify the design process by reassuring a good baseline of intra-device compatibility. The same holds true for components relating to first data port 930, which mimics a host device 951. Using the circuits, components and related software from the actual host device will prove invaluable.

Information on SMBus-compliant "smart" device communications is readily available at the SMBus specification web site (www.SMBus.org). A number of vendors, such as USAR (New York, N.Y.), and Benchmarq (Dallas, Tex.) provide SMBus-compliant components, finished boards, and developers tools. Mitsubishi Electronics America (Sunnyvale, Calif.) has an SMBus reference design board available to qualified developers. Micro Computer Control (Hopewell, N.J.) provides good diagnostics and troubleshooting tools, as does Intel (Santa Clara, Calif.).

There are third-device approaches within the SMBus specifications which a designer or engineer may want to consider. SMBus "extensions" allow for external devices to use and share the smart battery bus. Registering "slave" devices enables peripheral-product developers to obtain an assigned and published slave-device address for a third device 903 that assures compliance with the SMBus specifications.

While SMBus has been incorporated for a number of years in many laptops and other electronics products, one cannot always assume that a particular manufacturer's product adheres to the SMBus specifications 100%. If working with existing host or battery products, it would be prudent to solicit specific information from the equipment manufacturer as to that vendor's exact implementation. Again, integrating a product's existing circuit boards, and using an OEM's software, are viable first steps.

Dallas 1-Wire, by Dallas Semiconductor (Dallas, Tex.) is a competitive smart-technology solution to the SMBus specification, which is supported by Benchmarq and others.

Step 2: Configuring Power Output

Having verified, in Step 1 (FIG. 19A), that host device 951 is not currently being powered by an external power source 961, third device 903 in FIG. 19B reconfigures switch 913 to establish a multi-conductor power and data path between power supply 911 and host 951. Power supply 911 in FIG. 19B is capable of having its power output configured by processor/controller 907, along control line 909 (shown here as active). This ability to modify power output gives third device 903 flexible operation, by delivering an output voltage that matches a specific battery, from among a number of possible battery voltage ranges. Third device 903 thus has a power supply output configuration capability which, combined with the device's ability shown above to know what battery voltage is acceptable to any host device, provides a "universal" power source for a wide variety of battery-powered host devices. See "Universal Power Supply," U.S. patent application Ser. No. 09/193,790, filing date Nov. 17, 1998, based on U.S. Provisional Application No. 60/065,773, Nov. 17, 1997.

The power-delivery operation illustrated in FIG. 19B transfers power from configurable supply 911 (segmented power module elements 936 and 938 are ignored here, for clarity) along a first power conductor 919 which, at switch 913, is directed to conductor 981, then along electrical path 902 to host's connector 949, and finally along conductor 912 into host 951. The second power path from supply 911 is along conductor 921, then switch 913 transfers a power signal to conductor 973, then the signal further travels along electrical path 993, and after being carried along final conductor 904, is available to host 951.

Note that, in FIG. 19B, power supply 911 has two modular elements. Power module 936 and 938 represent two discrete power outputs, so that while module 938 is delivering power to a host device at conductors 919 and 921, module 936 is powering third device 903's internal electronics at conductors 924 and 926, via voltage regulator 928 and its conductors 915 and 917. Note that battery 947 is also available to power third device 903's electronics, as a redundant (backup) power source. By activating controllable single-pole switch 940 to a closed position (see FIGS. 19A and C), which controller 907 performs via control line 942, power from battery 947 flows along conductors 983, 963, 929, through switch 940, then further along the continuation of conductor 929 to regulator 928. The second power path from battery 947 is along conductors 991, 971, then 937 to regulator 928. Obviously, before engaging battery power, controller 907 uses control line 909 to shut down the output of power supply 936 in 911 along conductors 924 and 926.

Single-pole switch 940 in FIG. 19B is configured so that it is normally-closed as the default. It must be held in an open state by controller 907 during operation. Any loss of power from power supply 936—which would result in all electronics in third device 903 shutting down—are then avoided, as switch 940 returns to this normally-closed default mode, automatically allowing power from battery 947 to restore power to third device 903's circuits.

The main power delivery path of configurable power supply 911's conductors 919 and 921 in FIG. 19B has two branching conductors 914 and 916, which lead to an A/D converter 918. This sub-system provides processor/controller 907 with either a Vout or current reading from power supply 911. If the controller element 907 has not properly configured the variable output voltage of power supply 911, line-voltage information from A/D 918 indicates the error, and controller 907 corrects this with a control signal to power supply 911, along control line 909. Monitoring A/D 918's readings of voltage sags along conductors 914 and 916 during power-delivery operations also allows controller 907 to readjust power output to meet host device 951's load demands. While there are other benefits to using an A/D converter as a power-monitoring tool, another obvious one is to indicate if a user has turned OFF host 951, or disconnected it from third device 903 (at mating connectors 943 and 949). For purposes of this example, A/D converter 918 is assumed to include a separate I/O for this second input, as is often available on micro-controllers from Mitsubishi (Sunnyvale, Calif.), and other component supplier's.

Data signals from third device 903 to host device 951 in FIG. 19B originate at processor/controller 907's second data port 932. The three data signals (traditionally Temperature, Data, and Clock) each follow a defined path. The first path originates along conductor 923, which leads to controllable switch 913, then transferring along conductor 975, further along electrical path 995, then to device 951 along its conductor 906. The second path is comprised of conductor 925, transitioning at switch 913 to 977, then along 997 to last connected conductor 908 and into host 951. The third data path from second data port 932 is along conductor 927, through switch 913, then along conductor 979, continuing along electrical path 999 and then, at conductor 910, entering host 951. All data paths are bidirectional.

Note that conductors 993, 995, 997, 999, and 902 in FIGS. 19A, B and C do not represent actual wires in the circuits depicted, but rather only serve to indicate inter device connectivity. In reality, the lower section of connector block 943 mates directly to connector block 949 (reference connectors 199a and 119b in FIGS. 8A and B, for example). Note also that connector 949 is physically located in host 951's battery bay 998 and mates with battery connector 945 when a third device 903 is not present.

While not shown here, if particular smart battery protocols require second data port 932 (FIG. 19B) to have power in order to send or receive data, battery power conductors 929 and 937 can be conveniently tapped to have all five conductors active at second data port 932 (the same would then also apply to first data port 930). Note that power conductors 929 and 937 from battery 947 are shown by dashed lines to be inactive here in order to depict the result of single-pole switch 940 being open but, in reality, they are floating and do have power available.

A Battery-Charging State

The known State 1 of the multi-device connector apparatuses of FIGS. 19A and B is that no external power device 961 is active (conductor set 959 is shown as inactive) and, therefore, a host device 951 is not charging its battery 947. FIG. 19C represents a configuration of power and data interfaces for a battery charging state. Power from external device 961 is delivered to host 951, along conductor set 959 to host's power port 957. Battery charging circuit 953 (internal to host 951) is active, and power and data are flowing from host 951 to charging battery 947.

In this state, the operational modes of a third device 903 are somewhat limited to monitoring charging activities, with some ability to disrupt or stop the battery charging process. For example, by processor/controller 907 in FIG. 19C manipulating controllable switch 913, the power and data conductors between battery 947 and host 951's charger 953 can be disrupted. Further, since first data port 930 is active, device 903 can not only monitor, but introduce data onto data line sets 931/965/985, 933/967/987, and 935/969/989 shared by both host and battery. Switch 913 is configurable so that the three data conductors 975, 977, and 979 can be disrupted. The switch positions in FIG. 19B isolate the charger circuit, allowing only device 903 and battery 947 to communicate at first data port 930. Should device 903 detect something abnormal in the battery charging process, it can interject a STOP CHARGE command. To achieve this function, second data port 932 directs the data signal to battery charger 953 along conductors 923, 925, and 927, via switch 913, as configured in FIG. 19B. The SMBus specification defines a number of alerts and alarms which are recognized by most spec-compliant battery (and charger) devices. This ability to be pro-active in multi-device operational modes such as battery charging is an advantage, since a third "smart" device enhances the reliability and functionality of the entire system by adding extra watchdog and intervention capabilities.

One possible caveat in this battery-charging state depicted in FIG. 19C is that battery charging (input) voltages are different than the output voltages of a battery pack. In particular, the input voltages coming from a host device 951's charger 953 to battery 947 can be substantially high. Charger outputs of 19-Volts to a 12-Volt battery pack are not uncommon, for example. Further, depending on the battery chemistry and internal charging sub-system, one might encounter a "pulse charger," which operates by rapidly oscillating between positive and negative pulses. Also, charging voltages can drop to a trickle charge without notice or, at a minimum, gradually taper downward during the charging process.

Thus, while power to regulator 928 is shown at conductors 929 and 937 through closed switch 940, relying on power from a charger 953 in host device 951 to drive regulator 928 in third device 903 is not always prudent. The apparatus 901C in FIG. 19C allows for this eventuality, by providing a second output 936 for power supply 911, specifically directed to regulator 928 for adjusting the power to third device 903's internal electronics (shown inactive here at conductors 924 and 926).

Power source 934 in FIGS. 19A–C is not specific as to its characteristics. Based on the intended application, and other factors, power to device 903 can be 110 VAC/60 Hz, 110 VAC/400 Hz (used in aircraft), 28 VDC (aircraft), 12 or 42 VDC (automotive), or any other source of continuous electrical power.

Universal Replacement for External Power Adapters

Since third device 903 in FIGS. 19A–C, and related connectivity apparatuses, perform all of the power delivery functions normally associated with an external power source 961, enhanced by advantages such as being able to detect and configure correct output voltages for most any battery-powered device, as well as to monitor a battery during critical charging activities, and even to communicate with both a battery and a host device, it is logical that the use of a third device 903 would replace the need for a traditional "dumb," single-function external power source 961.

FIG. 19D represents a multi-function, multi-modal external third device 903A based on the circuitries discussed in FIGS. 19A–C. Additional elements are employed to provide battery charging capabilities, primarily an additional voltage regulator 944, a "smart" battery charger 953, and a controllable multi-pole, single-throw switch 950. The charging circuitry is designated by dashed lines as sub-assembly 966.

To support the charging function, a second processor/controller 907B, and control lines 946 and 948 are indicated, but the use of a single processor/controller 907 to handle both power delivery and charging tasks in a third device 903A is acceptable. Since first data port 930 is connected to all charging circuit data and power conductors in a "T"-connector fashion, charging data is transferred along data port conductors 931, 933, and 935. As previously referenced, some data-enabled batteries require a data port to be powered, which is achieved by tapping into power conductors 937 and 929, directing these two branched power conductors to first data port 930 (not shown). If, for reasons discussed above in the section "A Battery-Charging State," it is not prudent to use power from a charger to drive voltage regulator 928, then third device 903A's internal electronics should use power from a second output 938 of power supply 911. This same power supply output is also used for powering host device 951, as previously discussed in FIG. 19B.

Multi-pole switch 950 in FIG. 19D is controlled by processor/controller 907B, along control line 946. Unlike switch 913, switch 950 simply brings charger 953 on or off line, as needed. Smart battery charger 953 communicates with its smart battery source 947 using data conductor sets 954/965/985, 956/967/987, and 958/969/989. Power is available at conductor sets 952/963/983, and 960/971/991.

Note that single-pole switch 940 is shown here in an open position, which prevents power from charger 953 from flowing into A/D converter 918 and regulator 928. Further, controllable switch 913 is configured so that a power signal from charger 950 along conductor sets 952/929 and 960/937 does not flow to host device 951, even though conductors 929 and 937 also feed into smart battery 947 as conductor sets 963/983 and 971/991, respectively.

Note also that conductors 993, 995, 997, 999, and 902 in FIG. 19D do not represent actual wires in the circuits depicted, but rather only serve to indicate inter-device connectivity. In reality, the lower section of connector block 943 mates directly to connector block 949 (reference connectors 199a and 119b in FIGS. 8A and B, for example). Note also that connector 949 is physically located in host 951's battery bay 998 and mates with battery connector 945 when a third device 903A is not present.

Data lines 954, 956, and 958 from smart charger 953 are available to third device 903A's processors 907A and B along active conductors 931, 933, and 935 to first data port 930. These three conductors also transfer data at battery 947 as conductor sets 965/985, 967/987, and 969/989. Host device 951 has access to data originating from either smart charger 953 or smart battery 947 via third device 903A's second data port 932. For example, a representative data path from smart charger 953 to host 951 starts at conductor 954 and continues along conductor 931 to first data port 930. Processor 907A (or 907B, depending on the actual configuration) receives the data signal from charger 953, then transfers it to second, data port 932. At second port 932, the data signal is output along conductor set 923/975/995/906 to a smart communications circuit 962 at host device 951. The other two data paths follow parallel paths in FIG. 19D and are, therefore, not fully detailed here.

Thus, a third device 903A in FIG. 19D has complete power and data connectivity between all of its internal elements (e.g., two processor-configurable power supplies 936 and 938, as well as smart battery charger 953) and a smart battery 947. This total connectivity is also either independently (or simultaneously) available to a smart host device 951.

Such comprehensive connectivity simplifies a user experience, because all of the required functions of a third device to service both a battery and a host device are integrated into a single third-device module 903A, which performs all operations automatically, without any user intervention or pre-configuration. Further, battery-powered host device designers and manufacturers benefit by elimination of the space and weight of an internal battery charging sub-system, as well as the need for a dedicated external power adapter (including a power port (jack) and related wiring/circuits). Battery vendors gain a new dimension in enhanced battery capabilities, as well.

Because charger 953 is fully controlled and configured by processor/controller 907B, it operates as a universal charger, suitable for charging a wide variety of battery chemistries and configurations. Charging algorithms and look-up tables compiled from battery manufacturers and other sources give charger 953 a universal capability. Such software is not detailed here, being beyond the scope of this document. But, the circuitry in FIG. 19D does provide the necessary connector interfaces and configurable circuitry to achieve such universal functionality.

While the present invention has been described in detail with regards to the preferred embodiments, it is appreciated that other variations of the present invention maybe devised which do not depart from the inventive concept of the present invention. Thus, the scope of the invention should be determined by the appended claims and their legal equivalents, rather than by the examples given.

What is claimed is:

1. An apparatus for providing temperature sensing information comprising a resistive element accessible to a DC power source, a DC powered device, a DC power module, and an external monitoring device, wherein said DC power source is normally coupled to, and delivers DC power source temperature sensing information to said DC powered device, said apparatus further comprising:
    a multi-conductor interface member electrically isolating said DC power source from said DC powered device, said multi-conductor interface member including a first plurality of conductors electrically connected with said DC power source, and a second plurality of conductors electrically connected with said DC powered device; and
    a connection interface electrically coupled to said multi-conductor interface member and providing electrical contacts accessible to said resistive element, enabling selective interconnection among said DC power source, said DC powered device, said DC power module, and said external monitoring device, to effect said selective access to said resistive element's temperature sensing information.

2. The apparatus as claimed in claim 1, wherein:
    said DC power source is a battery;
    said resistive element is in thermal contact with said battery; and
    said resistive element is accessible by said multi-conductor interface member first plurality of conductors, via said connection interface, to said DC power module for the purpose of monitoring said battery's temperature.

3. The apparatus as claimed in claim 1, wherein:
    said DC power source is a battery;
    said DC power module is a battery charger;
    said resistive element is in thermal contact with said battery; and
    said resistive element is accessible by said multi-conductor interface member first plurality of conductors, via said connection interface, to said battery charger for monitoring said battery's temperature.

4. The apparatus as claimed in claim 1, wherein:
    said DC power source is a battery;
    said DC power module is a DC power supply;
    said resistive element is in thermal contact with said battery; and
    said resistive element is accessible by said multi-conductor interface member first plurality of conductors, via said connection interface, to said DC power supply for the purpose of monitoring said battery's temperature.

5. The apparatus as claimed in claim 1, wherein:
    said DC power module is a battery charger;
    said resistive element is in thermal contact with said battery charger; and
    said resistive element is accessible by said multi-conductor interface member first plurality of conductors, via said connection interface, to said DC powered device for the purpose of monitoring said battery charger's temperature.

6. The apparatus as claimed in claim 1, wherein:
    said DC power source is a battery;
    said resistive element is in thermal contact with said battery; and
    said resistive element is accessible, via a jumpered connector electrically coupled to said connection interface, to said DC powered device for enabling monitoring said battery's temperature.

7. The apparatus as claimed in claim 1, wherein:
    said DC power source is a "smart" battery;
    said DC power module is a battery charger capable of transferring data;
    said DC powered device includes a processor, normally coupled to said battery, decoupled from said battery by said multi-conductor interface member;
    said resistive element is in thermal contact with said battery;
    said resistive element is accessible to said battery charger by said multi-conductor interface member first plurality of conductors, for monitoring said battery temperature;
    said DC powered device is accessible to said battery charger by said multi-conductor interface member second plurality of conductors, for communicating said temperature-sensing information to said DC powered device; and
    said battery charger monitors said battery temperature and delivers information about said monitored battery temperature to said DC powered device, via said connector interface, for enabling both said DC powered device and said battery charger to monitor said battery's temperature.

8. The apparatus as claimed in claim 1, wherein:
    said DC power source is a battery;
    said DC power module is a battery charger capable of transferring data;
    said resistive element is in thermal contact with said battery;
    said resistive element is accessible to said battery charger by a first set of conductors of said multi-conductor interface member first plurality of conductors, for monitoring said battery temperature;
    said battery is accessible to said battery charger by a second set of conductors of said multi-conductor interface member first plurality of conductors, for charging said battery; and
    said battery charger, via said connector interface, permitting monitoring of said battery temperature while charging said battery.

9. The apparatus as claimed in claim 1, wherein:
said DC power module is a DC power supply capable of transferring data;
said DC powered device includes a processor, normally coupled to said battery, decoupled from said battery by said multi-conductor interface member;
said resistive element is in thermal contact with said DC power supply;
said resistive element is accessible to said DC powered device by a first set of conductors of said multi-conductor interface member second plurality of conductors, for monitoring said DC power supply temperature;
said DC power supply is accessible to said DC powered device by a second set of conductors of said multi-conductor interface member second plurality of conductors, for receiving power from said DC power supply; and
said DC powered device, via said connector interface, enabling monitoring said DC power supply temperature while receiving power from said DC power supply.

10. The apparatus as claimed in claim 1, wherein:
said DC power source is a battery;
said DC power module is a data-enabled battery charger capable of transferring data; further
said DC power module includes a DC power supply capable of transferring data;
said DC powered device includes a processor, normally coupled to said battery, decoupled from said battery by said multi-conductor interface member;
said resistive element is in thermal contact with said battery;
said resistive element is accessible to said battery charger by a first set of conductors of said multi-conductor interface member first plurality of conductors, for monitoring said battery temperature;
said battery is accessible to said battery charger by a second set of conductors of said multi-conductor interface member first plurality of conductors, for charging said battery;
said DC power supply is accessible to said DC powered device by said multi-conductor interface member second plurality of conductors, for powering said DC powered device; and
said battery charger, via said connector interface, monitors said battery temperature while charging said battery; and further
said DC power supply enabling power delivery simultaneously to said DC powered device.

11. The apparatus as claimed in claim 1, wherein:
said resistive element is a flexible resistive ink applied to an insulator medium in a thin continuous layer covering and entire area between two conductors, said resistive ink electrically in contact with an equal portion of each conductor;
said insulator medium electrically isolates said conductors in said multi-conductor interface member from said resistive element.

12. The apparatus as claimed in claim 1, wherein a flexible apparatus for attaching to surfaces of a multiplicity of DC power sources and DC power modules is comprised of:
a flexible multi-conductor member including a first plurality of power and data conductors for providing access to a "smart" battery pack's power and data contacts; and further including
a second plurality of flexible power and data conductors for providing access to a "smart" DC powered device's power and data contacts, said DC powered device's power and data contacts normally coupled to mating contacts of said "smart" battery for delivering power to said DC powered device, and for transferring data between said "smart" battery and said DC powered device;
said multi-conductor member further including a flexible central insulating medium, upon opposing faces of which are positioned electrically-conductive contacts of said first and second plurality of conductors,
a connection interface for electrically coupling an external DC power module to said multi-conductor member, providing said external DC power module access to said first and second plurality of conductors,
a user interposing said flexible multi-conductor member between said removable "smart" battery pack's contacts and said DC powered device's normally mating contacts, thereby electrically isolating said DC power source's contacts from said DC powered device's contacts, and further
said electrically-conductive contact ends of said first plurality of conductors are electrically coupled to said battery's power and data contacts, and further
said electrically-conductive contact ends of said second plurality of conductors are electrically coupled to said DC powered device's power and data contacts, and further
said connection interface is accessible to an external DC power module for accessing power and data along said first plurality of conductors to said "smart" battery, and along said second plurality of conductors to said DC powered device.

13. The apparatus in claim 12, wherein a flexible apparatus is a label device for being applied by a user to a pre-manufactured removable battery pack, said label printed with an indicia.

14. The apparatus as claimed in claim 1, comprising:
a first non-conductive medium in contact with said resistive element;
said connection interface comprising a plurality of electro-conductive elements electrically coupled to said resistive element; and
means for attaching said non-conductive medium to at least one of said DC power source and said DC power module.

15. The apparatus as claimed in claim 1, wherein said attaching means is a low tack adhesive.

16. The apparatus as claimed in claim 1, further comprising replaceable portions that can be replaced where worn or damaged.

17. The apparatus as claimed in claim 1, further comprising a printable exterior surface for displaying indicia.

18. The apparatus as claimed in claim 11, wherein said insulator medium and said resistive element define a single flexible layer, whereby said apparatus is capable of conforming to one or more surfaces of one of said DC power source and said DC power module.

19. The apparatus as claimed in claim 1, wherein said apparatus is configured to be a product label, applied to the exterior of one of said DC power source and said DC power module for monitoring the temperature of the device to which it is applied.

20. The apparatus as claimed in claim 15, comprising an interface to a data-enabled DC power source.

21. The apparatus as claimed in claim 15, wherein:
said apparatus has a reconfigurable geometry, adapted to conform to diverse locations on the device to which it is applied; and
such a geometry includes conforming to the device to which it is applied.

22. The apparatus as claimed in claim 15, further comprising replaceable portions that can be replaced where worn or damaged.

23. The apparatus as claimed in claim 15, further comprising a printable exterior surface for displaying indicia.

24. The apparatus as claimed in claim 15, wherein at least one of said electro-conductive elements is capable of conducting a data signal.

25. The apparatus as claimed in claim 1, wherein said resistive element is integral to said multi-conductor interface member.

26. An apparatus for monitoring temperature changes of a power source, said apparatus comprising:
a flexible insulator layer, upon one major surface area of which is deposited by a printing process a continuous thin film of flexible thermally-resistive ink;
a means for attaching an other non-deposited surface of said insulator layer to the power source, so that said flexible layer conforms to any contoured surface of the power source, resulting in enhanced temperature sensitivity of said thermally-resistive ink;
a plurality of conductors, a first one of which is electrically coupled along a part of its length to an accessible edge of said ink film area, and a second one of which is electrically coupled along part of its length to an opposing edge of said ink film area, said conductors being so positioned in parallel to each other as to geometrically proscribe two opposite edges of a parallelogram, said ink film area therein of dimensions resulting in a specific resistive value;
the first and second conductors being electrically attached at their uncoupled terminuses to a monitoring device for acquiring power signals;
a predetermined power signal flowing from said power source through said first conductor, then across said ink film to the second conductor, alters the resistive value of said ink as it thermally reacts to changes in temperature at said power source, and
said altered resistive value resulting in an anticipated change in the power signal acquired at the monitoring device, a degree of change to the signal determining temperature based on the resistive value;
whereby said apparatus monitors temperature changes of said power source.

27. The apparatus of claim 26, further comprising a multi-conductor connector for accessing data at said power source.

28. The apparatus of claim 27, further comprising user-replaceable portions for redirecting temperature data and/or power signals.

29. The apparatus of claim 26, wherein said apparatus transfers temperature-related data signals.

30. The apparatus of claim 27, wherein the multi-conductor connector further including a means of nterconnecting a power source and a host device so as to simultaneously and concurrently be independently powered from one or more external peripherals.

31. The apparatus of claim 30, wherein said interconnecting means functions as an interface for connecting at least two devices, sources, and peripherals.

32. The apparatus of claim 30, further comprising a jumpered terminal connector for reconnecting power and/or data conductors upon disconnecting an attached peripheral.

33. An apparatus for monitoring temperature functions of a power source, said apparatus comprising single non-conductive layer upon which is applied a substantial area of thermally-resistive ink as a continuous film, said area of ink being partitioned into segments by the application of a plurality of conductors, each electrically attached along part of its length to said ink area so as to be parallel to an adjacent conductor, so as to parse out geometric segments of said ink area as independent positive temperature coefficient thermistors;
wherein, upon being attached to a power source, each segment separately monitors the specific surface area of said power source to which it is in contact.

34. The apparatus of claim 26, wherein said apparatus is configured to be a product label applied to an exterior surface of said power source.

* * * * *